United States Patent [19]
Takasu et al.

[11] Patent Number: 5,637,187
[45] Date of Patent: Jun. 10, 1997

[54] LIGHT VALVE DEVICE MAKING

[75] Inventors: Hiroaki Takasu; Yoshikazu Kojima; Masaaki Kamiya; Tsuneo Yamazaki; Hiroshi Suzuki; Masaaki Taguchi; Ryuichi Takano; Satoru Yabe, all of Tokyo, Japan

[73] Assignee: Seiko Instruments Inc., Japan

[21] Appl. No.: 464,075

[22] Filed: Jun. 5, 1995

Related U.S. Application Data

[62] Division of Ser. No. 749,292, Aug. 23, 1991.

[30] Foreign Application Priority Data

| Sep. 5, 1990 | [JP] | Japan | 2-236213 |
| Sep. 5, 1990 | [JP] | Japan | 2-236214 |
| Sep. 5, 1990 | [JP] | Japan | 2-236217 |
| Sep. 5, 1990 | [JP] | Japan | 2-236219 |
| Sep. 7, 1990 | [JP] | Japan | 2-238672 |
| Sep. 19, 1990 | [JP] | Japan | 2-249208 |
| Sep. 25, 1990 | [JP] | Japan | 2-254919 |
| Sep. 25, 1990 | [JP] | Japan | 2-254920 |
| Sep. 25, 1990 | [JP] | Japan | 2-254921 |
| Nov. 19, 1990 | [JP] | Japan | 2-313390 |

[51] Int. Cl.$^6$ .............................................. H01L 21/00
[52] U.S. Cl. ................ 438/30; 216/23; 216/33; 438/128; 438/149; 438/164
[58] Field of Search ................... 216/2, 23, 33, 216/88; 156/633.1, 636.1, 657.1, 662.1; 437/29, 40, 56, 181

[56] References Cited

U.S. PATENT DOCUMENTS

| 4,345,248 | 8/1982 | Togashi et al. | 340/784 |
| 4,778,560 | 10/1988 | Takeda et al. | 437/181 X |
| 4,810,059 | 3/1989 | Kujik | 340/784 |
| 5,032,531 | 7/1991 | Tsutsui et al. | 437/181 X |
| 5,206,749 | 4/1993 | Zavracky et al. | 345/88 |

FOREIGN PATENT DOCUMENTS

| 0268380 | 5/1988 | European Pat. Off. . |
| 0342925 | 11/1989 | European Pat. Off. . |
| 57-167655 | 10/1982 | Japan . |
| 59-126639 | 7/1984 | Japan . |
| 60-143666 | 7/1985 | Japan . |
| 646927 | 1/1989 | Japan . |

OTHER PUBLICATIONS

Patent Abstracts of Japan, vol. 13, No. 228 (P–877) 26 May 1989 JP-A-1 038 727 (NEC) 9 Feb. 1989.
Patent Abstracts of Japan, vol. 13, No. 578 (E–864) 20 Dec. 1989 JP-A-1 241 862 (Sony) 26 Dec. 1989.
Patent Abstracts of Japan, vol. 10, No. 298 (P–505) 9 Oct. 1986 JP-A-61 114 225 (Matsushita) 31 May 1986.
Patent Abstracts of Japan, vol. 10, No. 1, (E–371) 7 Feb. 1986 JP-A-60 167 364 (Matsushita) 30 Aug. 1985.
Patent Abstracts of Japan, vol. 13 No. 572, (P–978) 18 Dec. 1989 JP-A-1 239 530 (Seiko Epson) 25 Sep. 1989.
Patent Abstracts of Japan, vol. 15, No. 287, (P–1229) 22 Jul. 1991 JP-A-3 100 516 (Sharp) 25 Apr. 1991.

*Primary Examiner*—William Powell
*Attorney, Agent, or Firm*—Adams & Wilks

[57] ABSTRACT

A process for forming a light valve device comprises forming a semiconductor single crystal film to form a composite substrate by polishing a semiconductor single crystal substrate after an electric insulating substrate has been bonded thereto; forming a group of pixel electrodes for defining a pixel region and a group of switch elements for selectively energizing the pixel electrodes by integrating a pixel array portion over the composite substrate; forming a liquid crystal aligning means for the pixel region; superposing an opposed substrate over the composite substrate with a gap therebetween; and filling the gap with liquid crystal material.

16 Claims, 50 Drawing Sheets

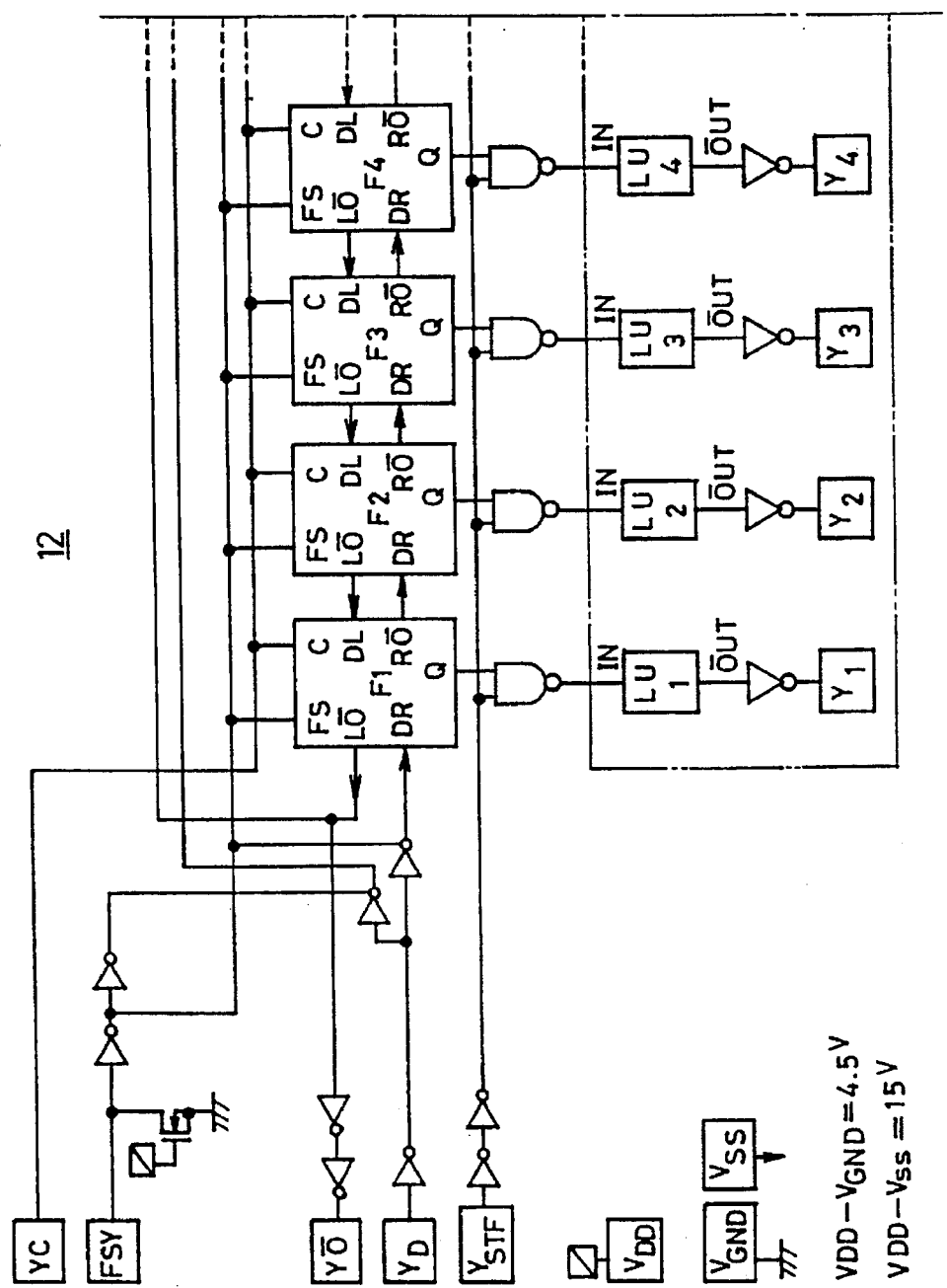

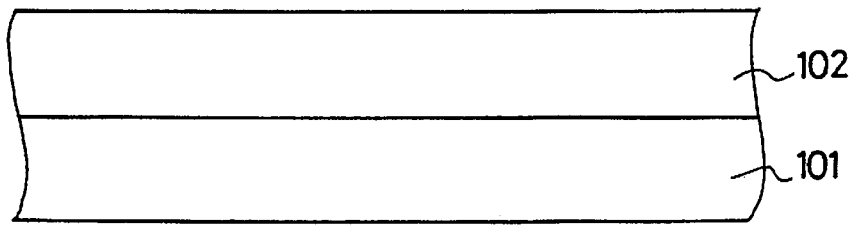
FIG. 12
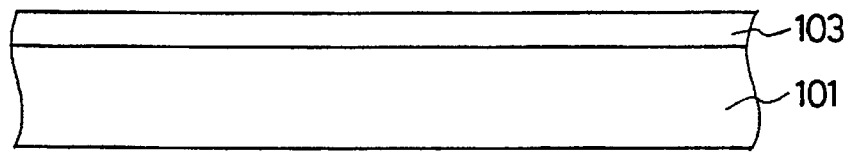
FIG. 13
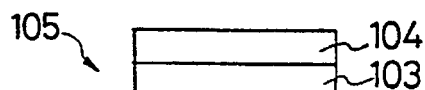
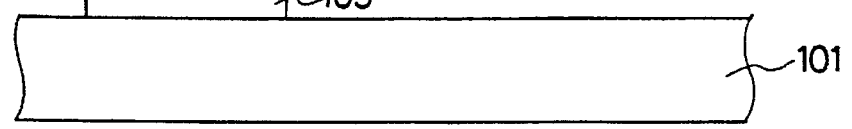
FIG. 14
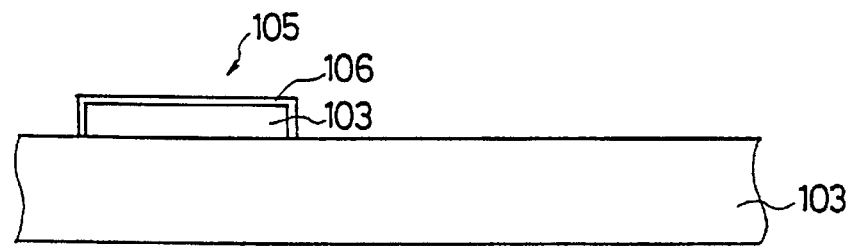
FIG. 15
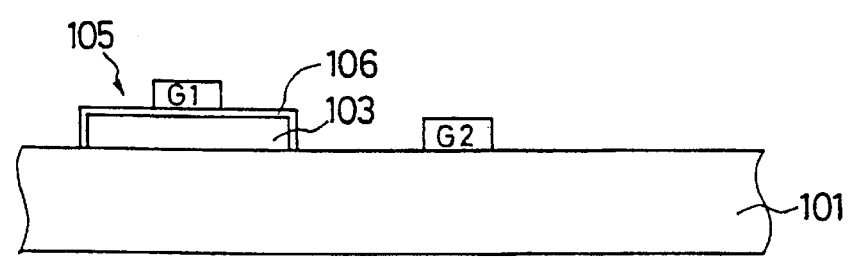
FIG. 16

FIG. 25
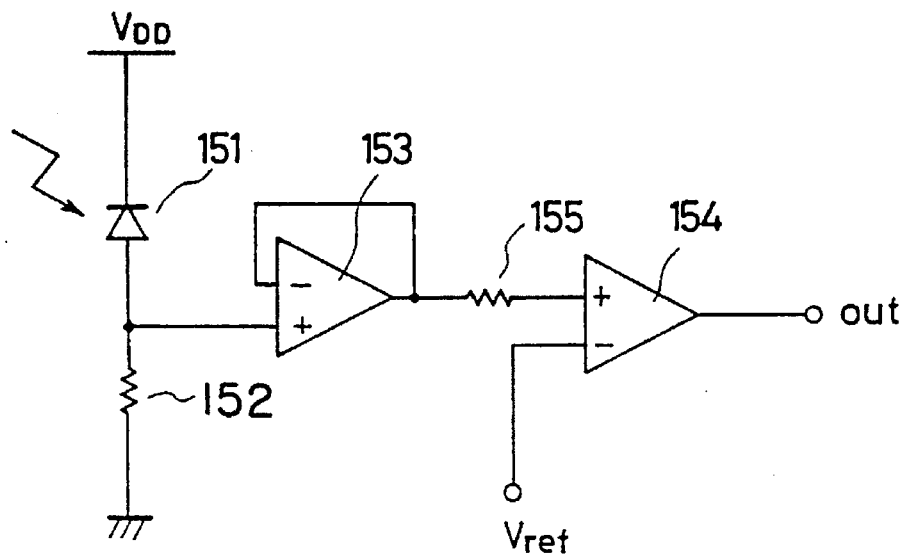
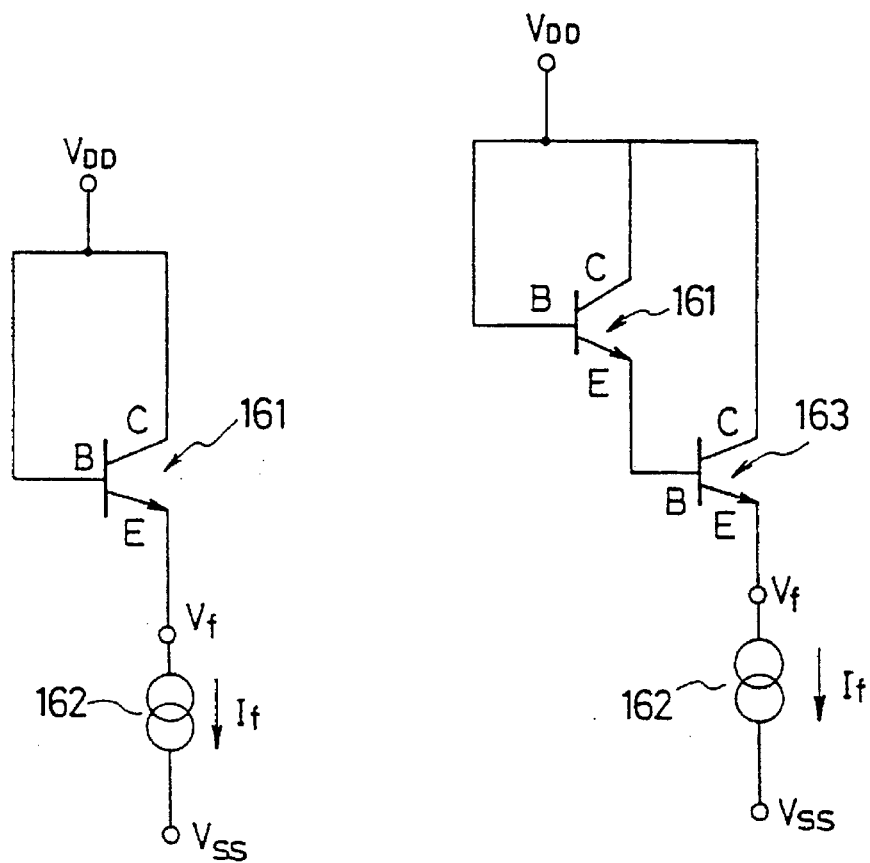
FIG. 26  FIG. 27

FIG. 28
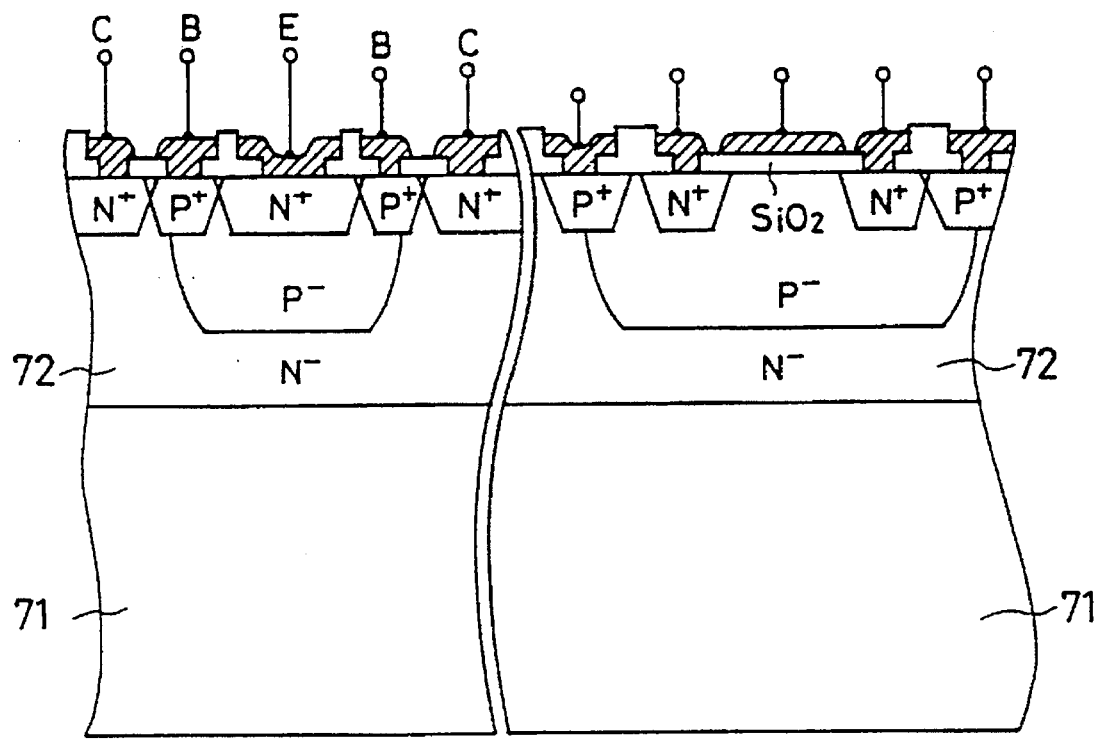
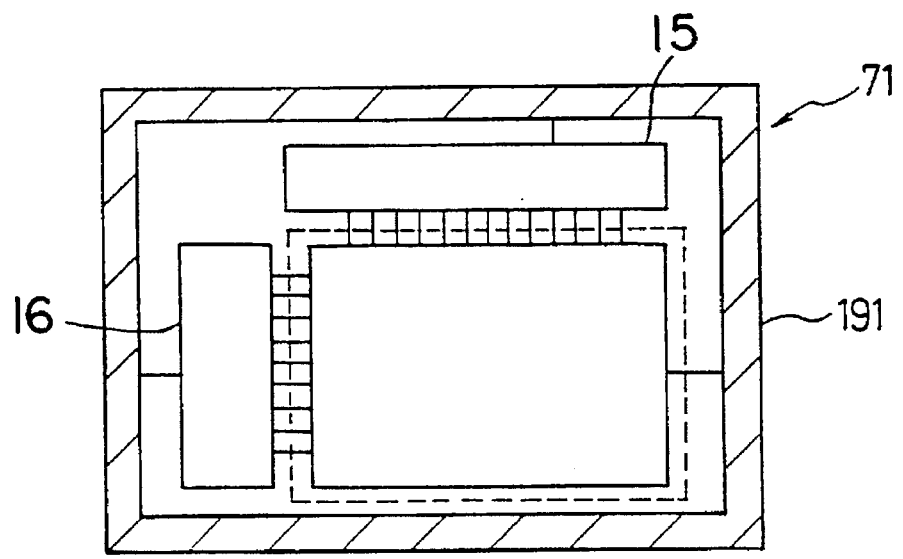
FIG. 29

FIG. 30
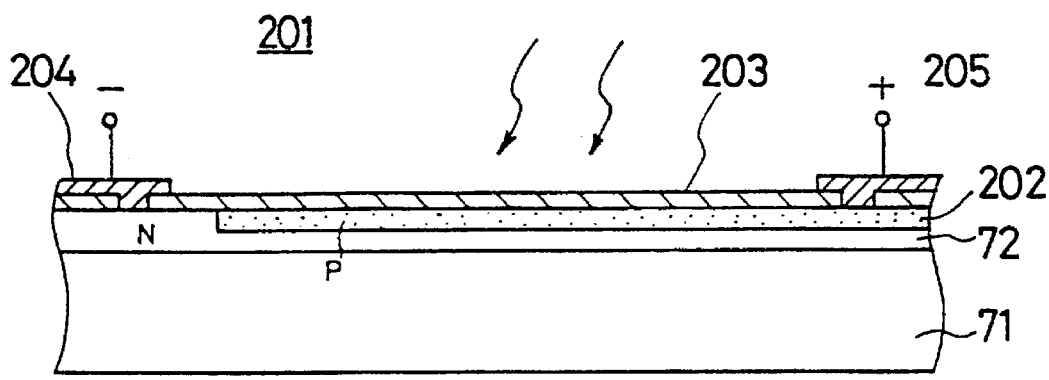
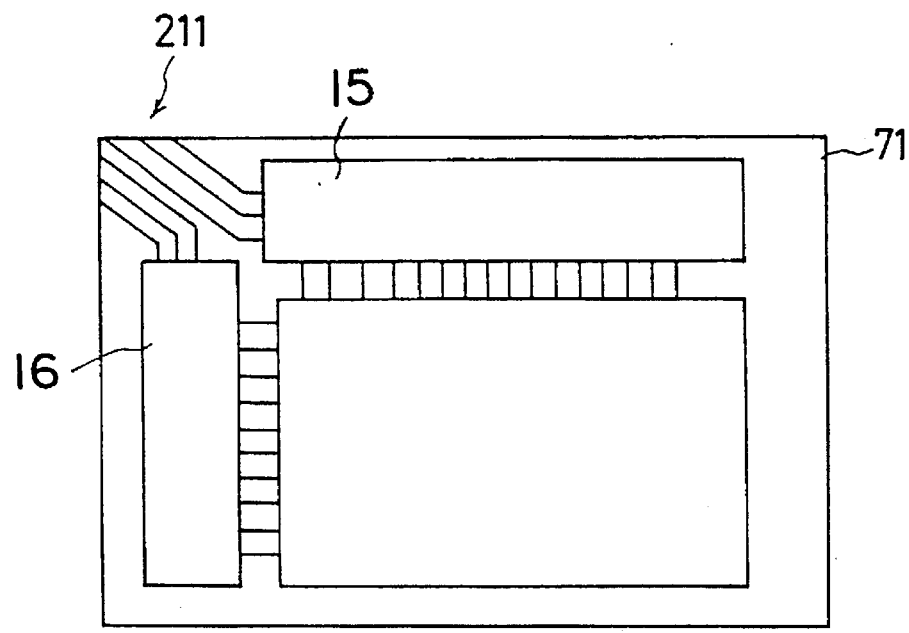
FIG. 31

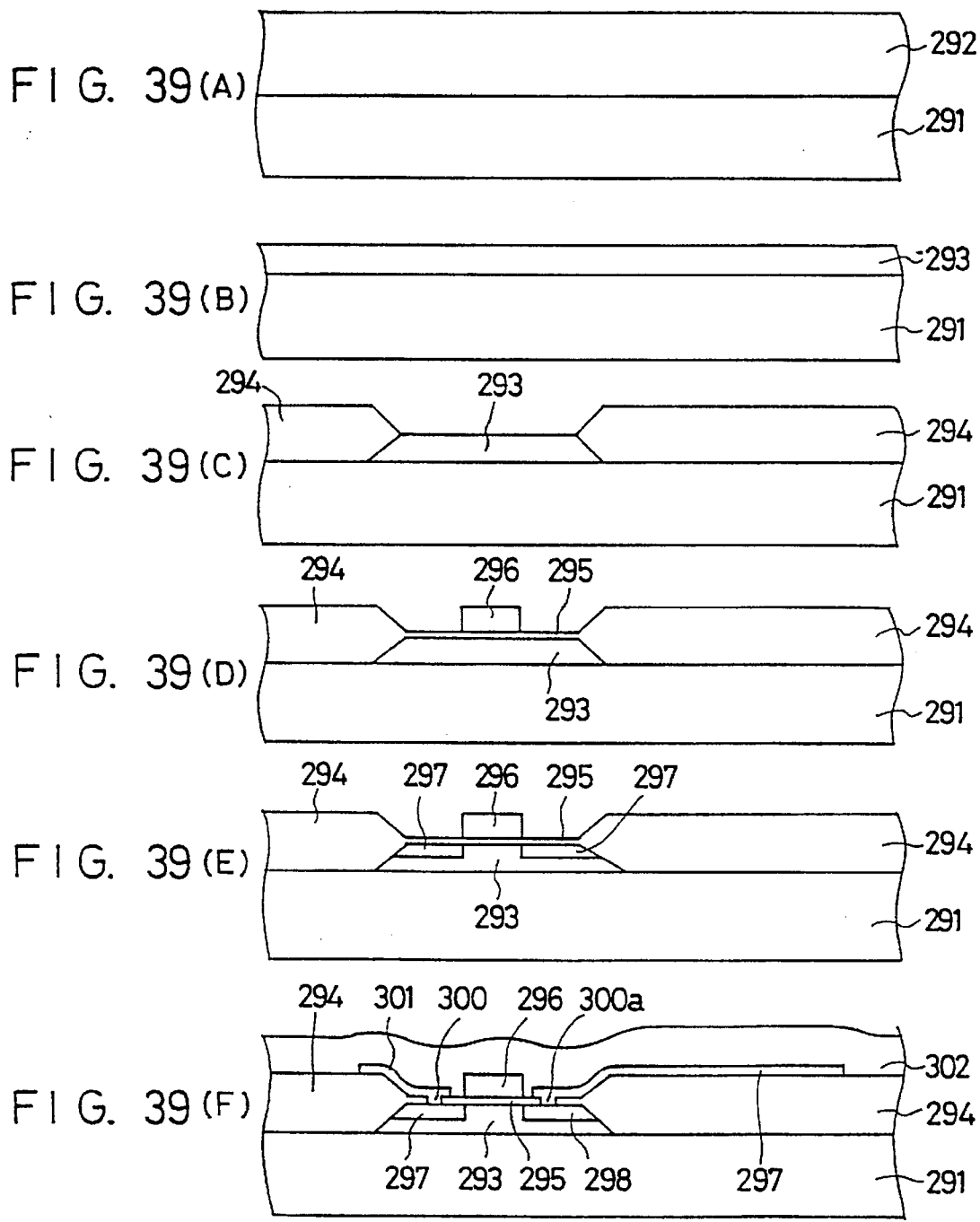

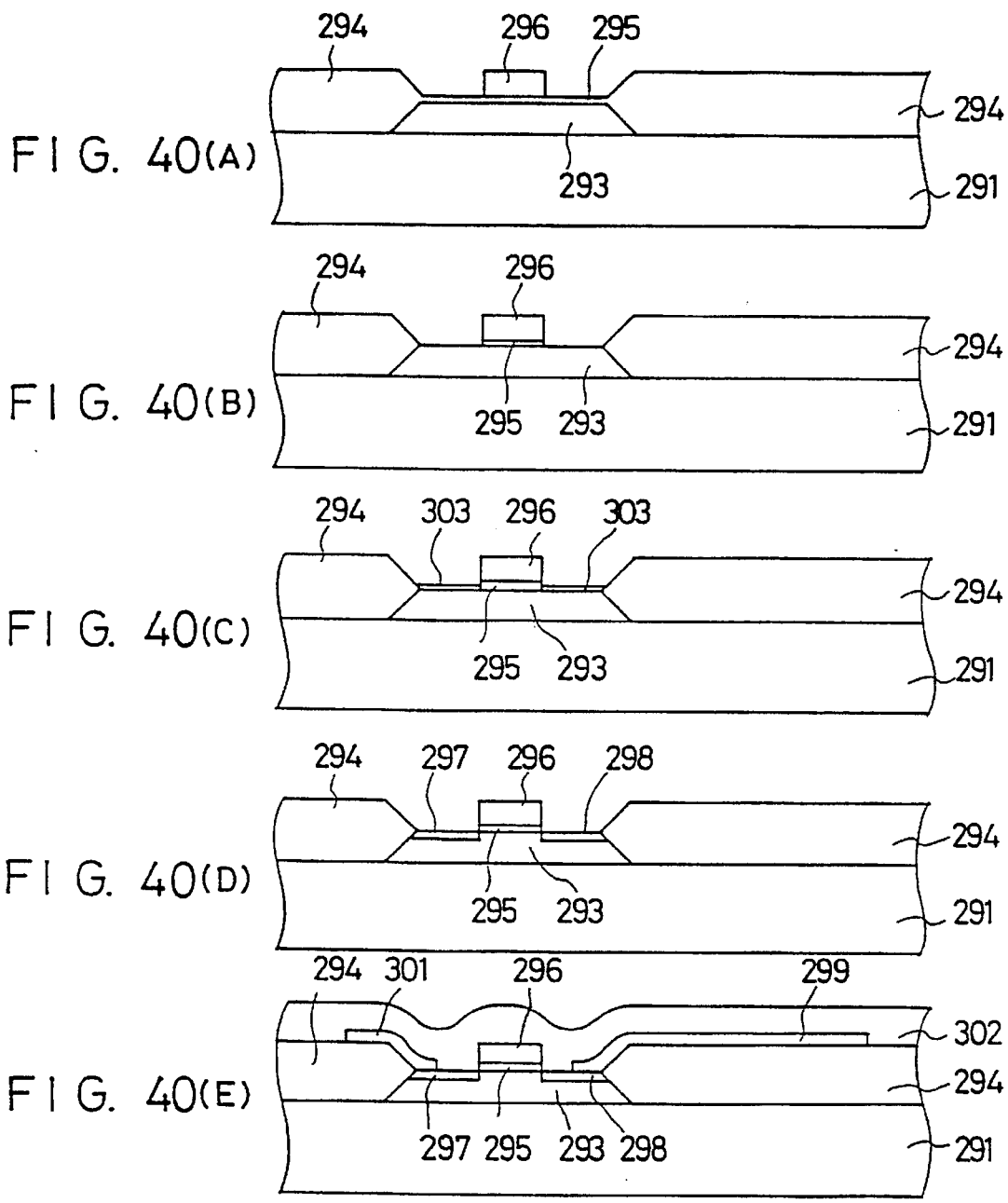

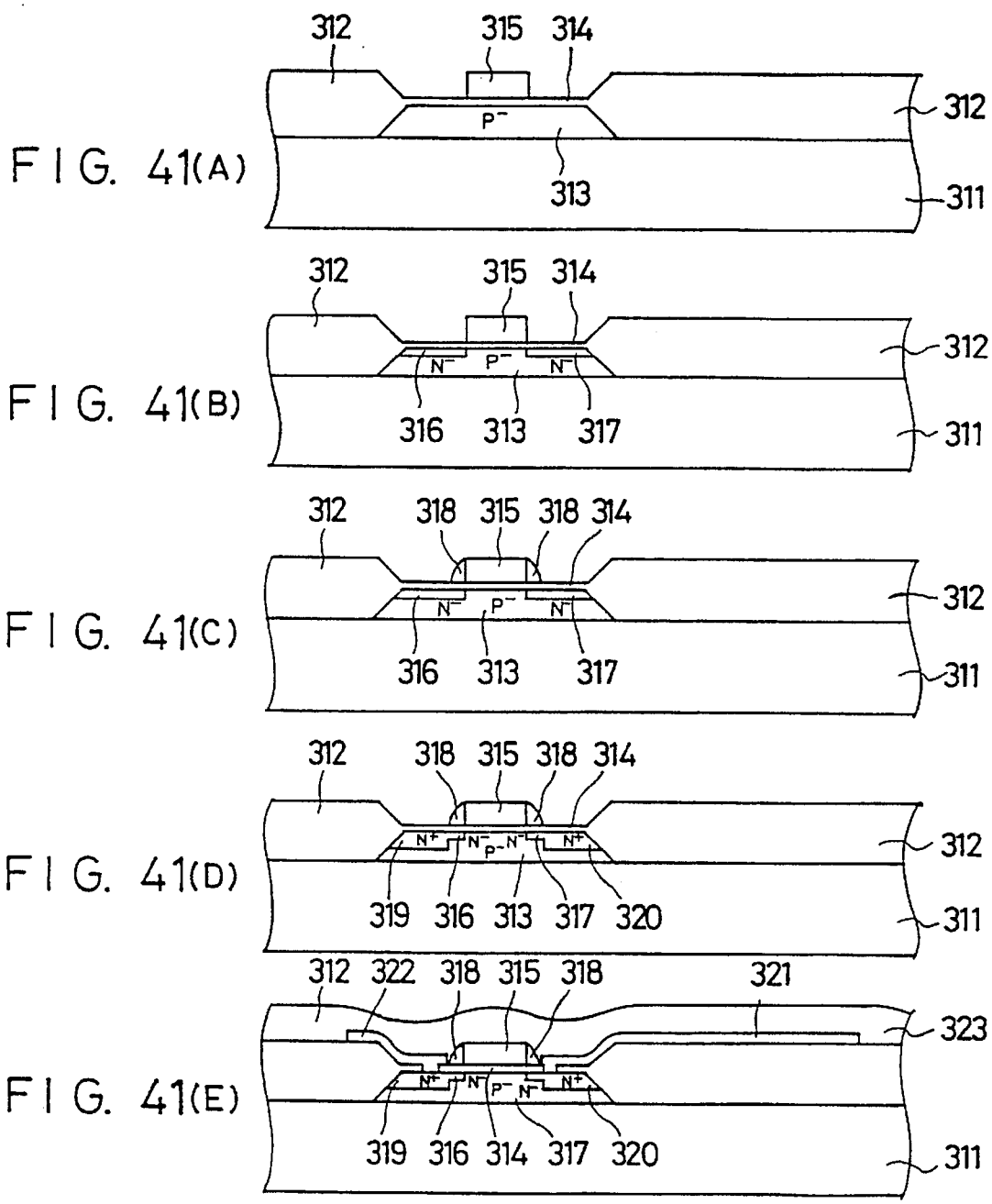

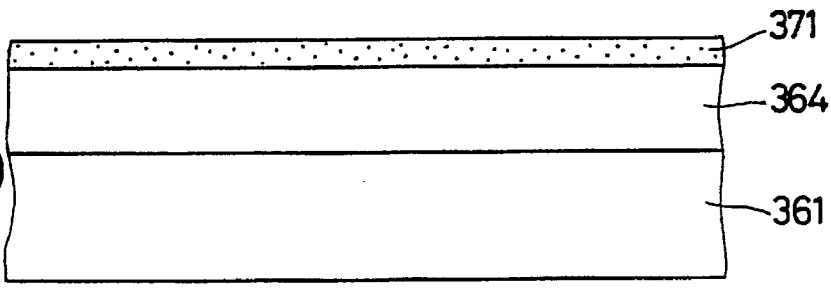
F I G. 50(A)
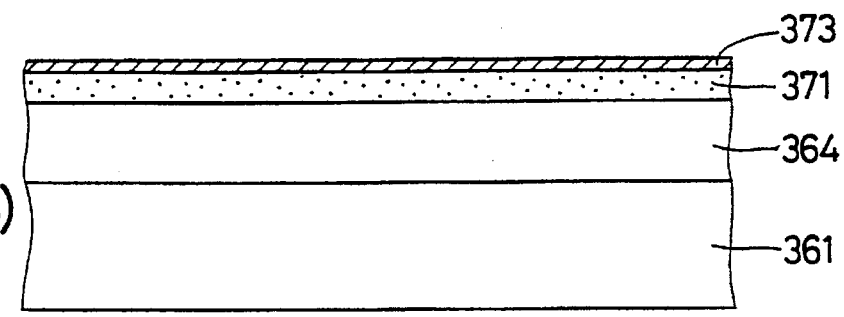
F I G. 50(B)
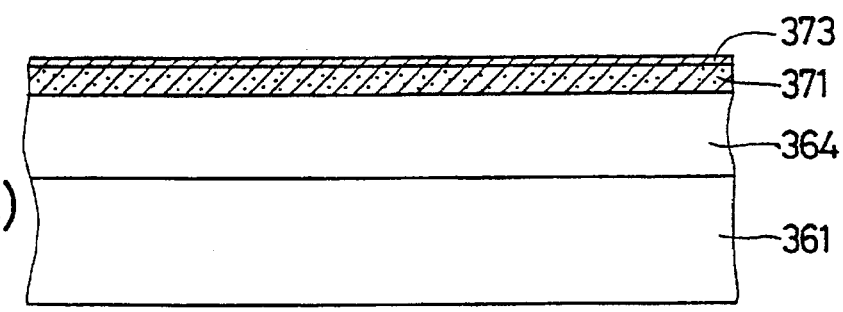
F I G. 50(C)
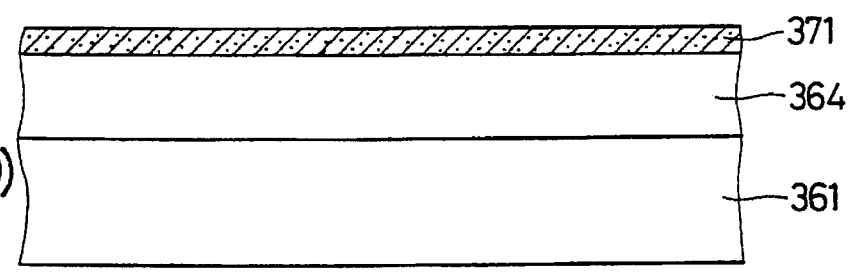
F I G. 50(D)

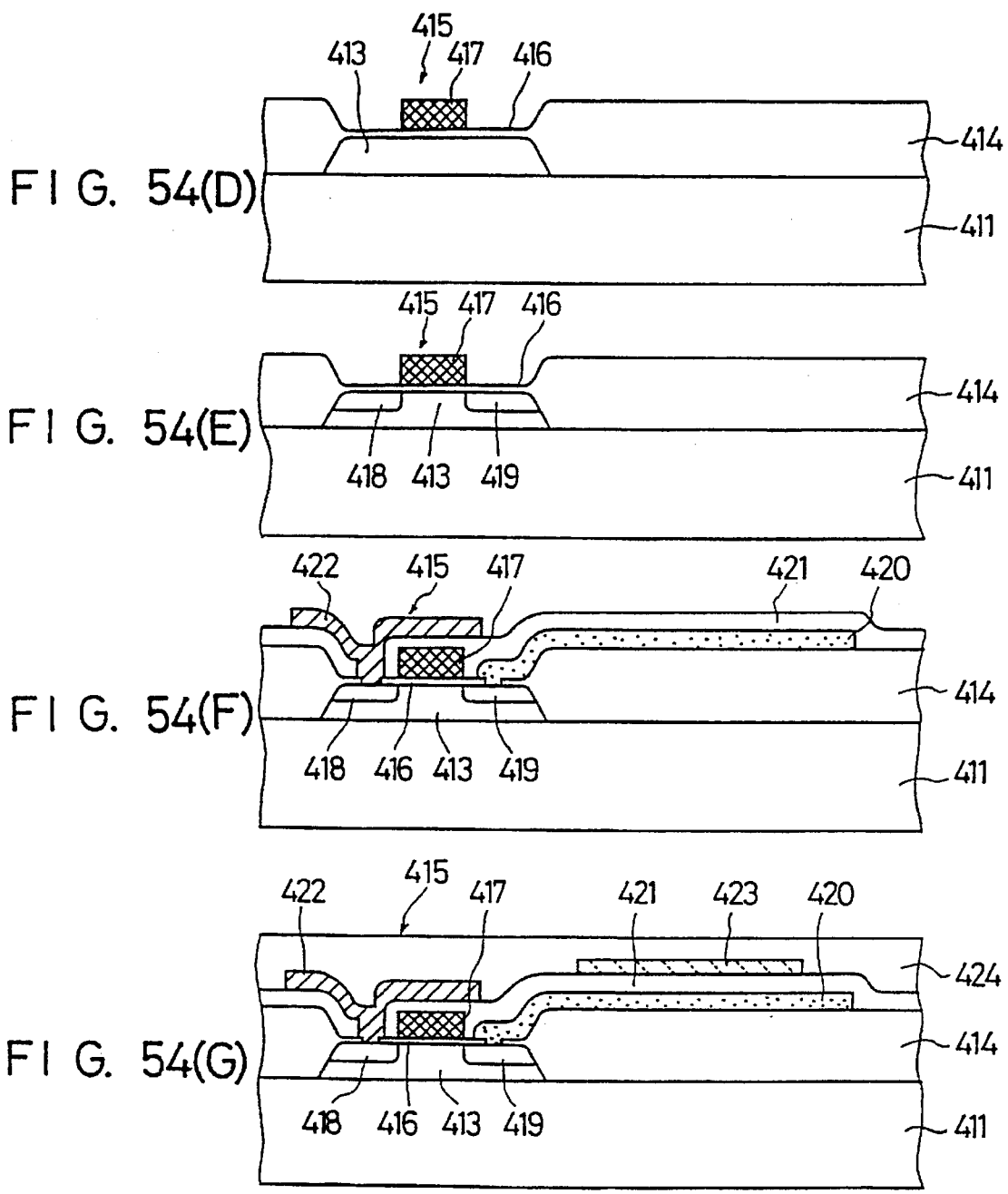

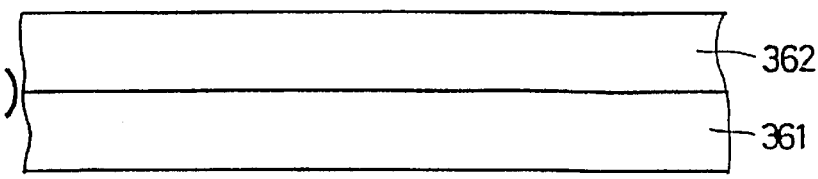
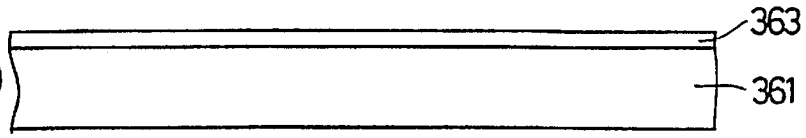
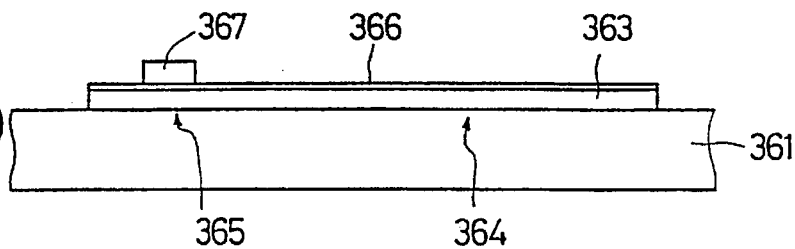
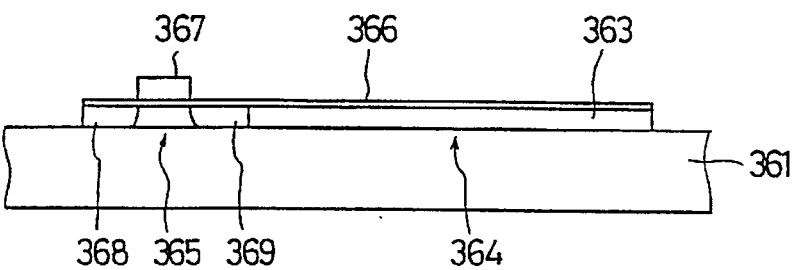
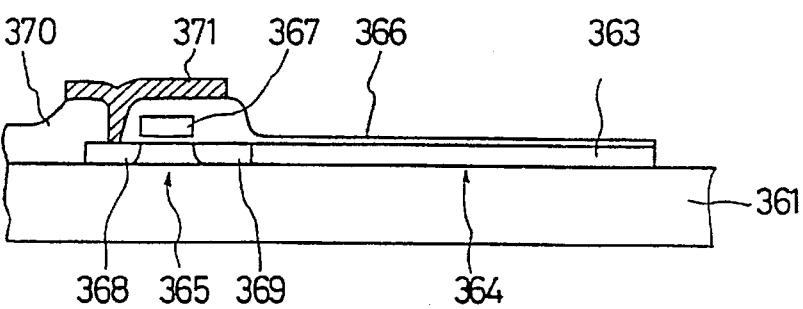
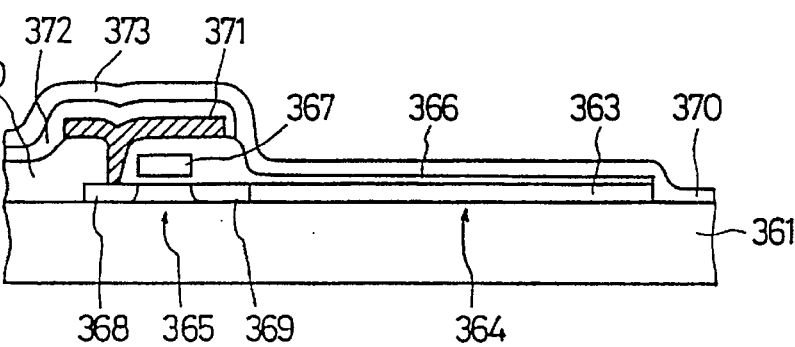

PERIPHERAL CIRCUIT REGION    PIXEL ARRAY REGION
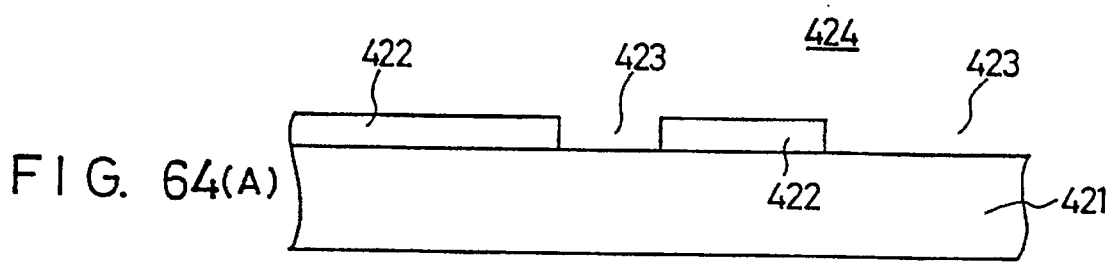
FIG. 64(A)
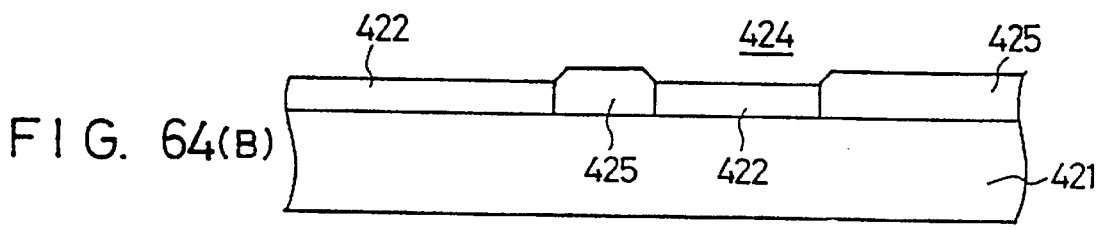
FIG. 64(B)
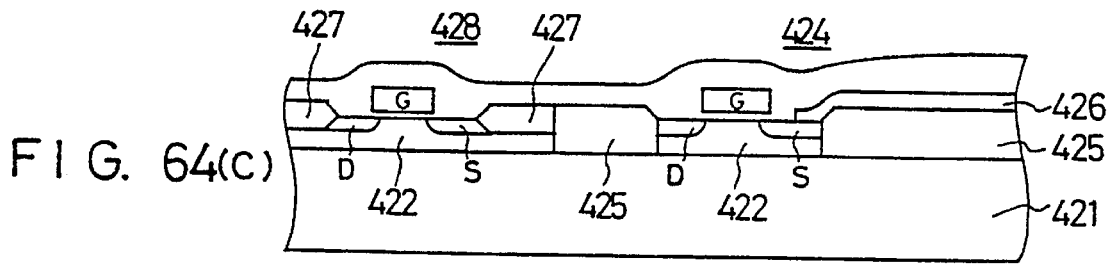
FIG. 64(C)
FIG. 65(A)
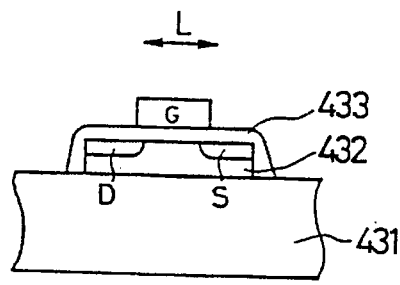
FIG. 65(C)
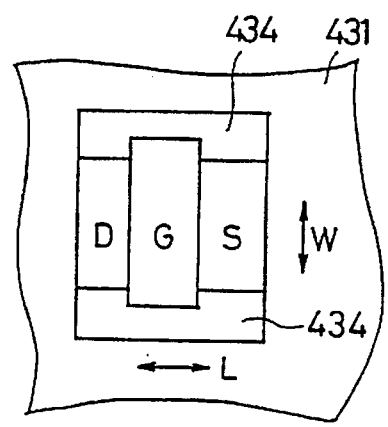
FIG. 65(B)
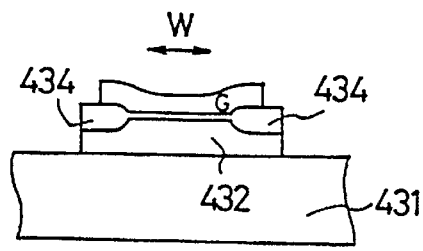

FIG. 68
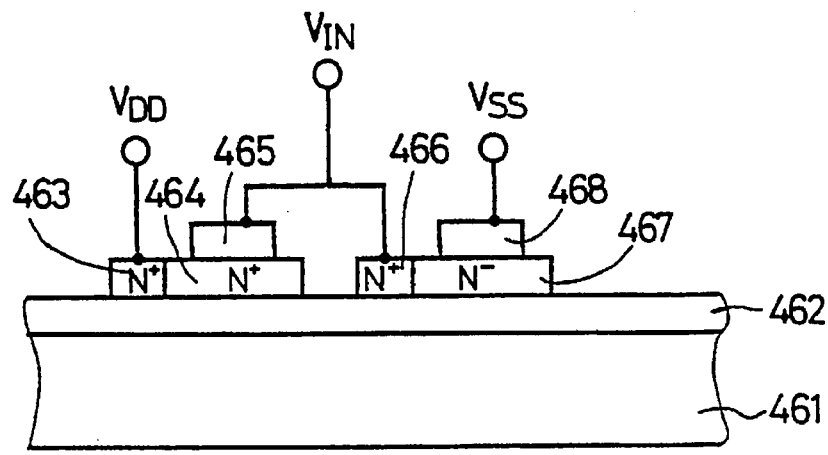
FIG. 69
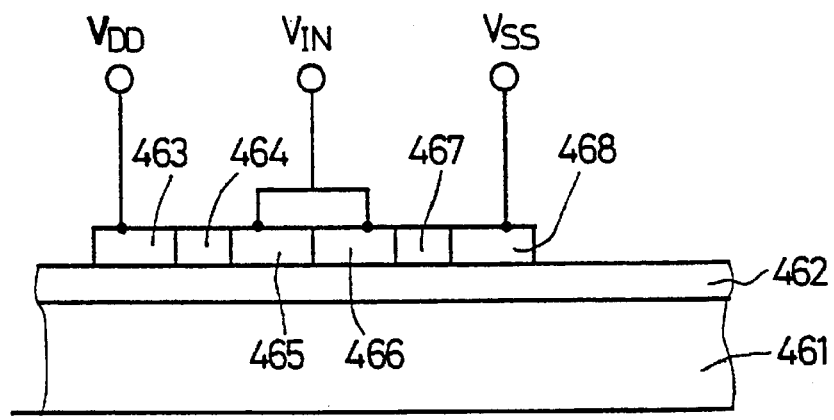
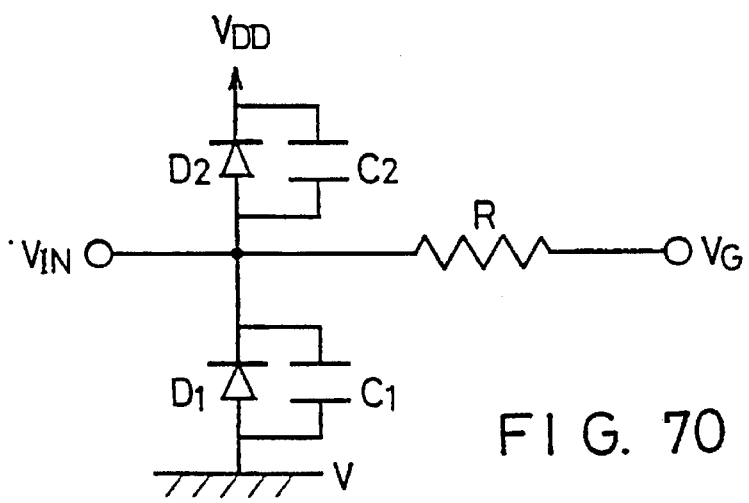
FIG. 70

LIGHT VALVE DEVICE MAKING

This is a division, of application Ser. No. 07/749,292 filed Aug. 23, 1991.

BACKGROUND OF THE INVENTION

1. Field of Industrial Application

The present invention relates to a planar type light valve drive substrate device to be used in a direct viewing type display system or a projection type display system.

More specifically, the present invention relates to a semiconductor integrated circuit substrate device which has a semiconductor thin film coating a substrate surface and formed with a pixel electrode group, a switch element group and a drive circuit element group. This substrate device is packaged integrally with a liquid crystal panel, for example, to constitute the so-called "active matrix device".

2. Prior Art

The active matrix device is based upon a simple principle, in which pixels are individually equipped with switch elements. If specific pixels are selected, the corresponding switch elements are turned on. If no pixel is selected, the switch elements are left nonconductive. In addition, the individual switch elements are driven by peripheral circuit elements constituting the driver circuit. These switch elements and peripheral circuit elements are formed over a glass substrate which forms part of the liquid crystal panel.

Therefore, the technology for making the switch elements and the peripheral circuit elements thin is important. Thin film transistors are usually formed as those elements.

In the active matrix device of the prior art, the thin film transistors are are formed in the surface of an amorphous silicon thin film or a polycrystal silicon thin film, which is deposited on the glass substrate. These amorphous silicon thin film and polycrystal silicon thin film are suited for fabricating an active matrix device of relatively large frame, because they can be easily deposited over the glass substrate by using the vacuum evaporation process or the chemical vapor deposition process. Thus, the active matrix device is suited for the direct viewing type display device.

In recent years, however, there arises a higher demand not for the direct viewing type display device but for a high-speed miniature display device having miniature pixels of high density. That miniature light valve device is used as a plane for forming a primary image of a projection type image device, for example, so that it can be applied as a projection type high-vision TV. For this application, it is desirable to provide a semiconductor integrated substrate device for a high-speed miniature light valve, which has a pixel size of the order of 1 μm and an overall size of several cm by using the miniature semiconductor fabricating technology.

If, however, the existing amorphous thin film is used, the ON current density is too low to operate at a high speed because the material is not made of a single crystal. Moreover, the transistor elements of sub-micron order cannot be formed by applying the miniature semiconductor technology. In the case of the amorphous silicon thin film, for example, its film forming temperature is about 300° C. so that a high-temperature treatment necessary for the miniaturization cannot be executed. In the case of a polycrystal silicon thin film, on the other hand, the crystal particles have a size of several μm which raises a problem in that the miniaturization of the transistor elements is restricted.

In the semiconductor integrated circuit substrate device for the existing active matrix display device using an amorphous material, as has been described hereinbefore, there arises a problem in that it is seriously difficult to realize an integration density, a high-speed operation and a chip size similar to those of the ordinary semiconductor integrated circuit elements.

In order to reduce the size of the semiconductor integrated circuit substrate device, it is especially necessary to integrate a peripheral circuit element group in a remarkably high density in addition to the switch element group. It is, however, difficult to form the peripheral circuit element group requiring a more miniature like technology in a super-high density in the polycrystal silicon thin film or the amorphous silicon thin film. As a result, it has been impossible to realize a semiconductor integrated circuit substrate device for the active matrix device, which has a size substantially equal to that of the ordinary LSI chip.

In view of the aforementioned problems of the prior art, a first object of the present invention is to provide a structure of and a process for fabricating a semiconductor substrate device, which can form a peripheral circuit element group requiring a higher speed and a higher-density integration over a substrate shared with a switch element group for supplying electric power selectively to pixels.

Since, moreover, the silicon single crystal thin film used as the semiconductor single crystal and the transparent electrically insulating substrate have different coefficients of thermal expansion, troubles such as separation or cracking occur in the course of the LSI fabrication process requiring a temperature as high as 800° C. Incidentally, the silicon single crystal film has a coefficient of thermal expansion of $3.6 \times 10^{-6}/°C$., and the transparent insulating substrate has, if made of quartz, a coefficient of thermal expansion of $0.4 \times 10^{-6}/°C$.

In order to eliminate this difficultly, a second object of the present invention is to provide a semiconductor single crystal composite substrate which has a high quality and a high production efficiency by interposing an intermediate layer between the silicon single crystal thin film and the transparent substrate to minimize the separation and cracking of the two due to thermal shock.

If the switch elements of the pixel array unit are miniaturized, their breakdown voltage raises a problem. Specifically, the light valve device or the active matrix device has its individual pixels fed with drive signals at a relatively high voltage. Therefore, the switch elements for supplying the electric power to the individual pixels selectively also have to withstand such high-voltage drive signals. Therefore, a third object of the present invention is to provide a light valve substrate semiconductor device, in which switch element MOSFETs having a special high breakdown voltage are integrated in a high density structure.

On the other hand, the pixel electrode material used in the prior art is exemplified by a transparent conductive thin film such as an ITO film or a NESA film. This transparent conductive thin film can be deposited relatively easily by the vacuum vapor deposition process or the sputtering process but is defective in low heat resistance and has poor patterning precision due to an etching process.

Thus, this material has a poor coordination with the LSI fabrication technology requiring the high-temperature treatment and is accompanied by a problem that the semiconductor process cannot be consistently used. Another problem is that the material is not suited for making the pixels miniature and highly dense because of the poor patterning precision. If, moreover, the roughness of the substrate surface grows relatively serious as the switch element groups are integrated in a high density, the transparent conductive thin film to be formed thereover is stepwise cut to raise a problem that the defect percentage of the pixels grows high. Therefore, a fourth embodiment of the present invention is to provide a light valve substrate semiconductor device having a miniature pixel electrode structure, to which the LSI fabrication technology or the semiconductor process can be consistently applied up to the final step.

In the active matrix device, moreover, a predetermined charge is supplied during a selection period to the pixel electrodes through the switch elements, and the charge supplied is retained during the unselected period in the pixel electrodes to execute the light valve functions for each pixel. If, at this time, the switch elements are formed in the semiconductor single crystal thin film in accordance with the general object of the present invention, its optical dark current is larger than that of the thin film transistors which are formed in the amorphous silicon thin film or the polycrystal silicon thin film. If no counter-measure is taken, the stored charge is allowed to leak due to the high optical dark current during the unselected period occupying a major part of one frame, thus raising a problem that the voltage to be applied to the pixels will drop. Therefore, a fifth object of the present invention is to provide a light valve substrate single crystal thin film semiconductor device which is enabled to effectively prevent the drop of a voltage to be applied to the pixels even if silicon single crystal thin film transistor elements having a relatively high optical dark current are used.

Generally speaking, the light valve device semiconductor substrate has an optically transparent region, which is formed with a switch element group for energizing a pixel electrode group and each pixel electrode selectively, and an optical opaque region which is formed with a peripheral circuit containing a circuit element group for driving the switch element group. In each region, the switch element group and the circuit element group are individually separated electrically by the element separation region. Incidentally, the optically opaque region is required to have a sufficient optical transparency even in the element separate region so as to enhance the optical transparency but is allowed to have a margin for its sizing precision. In the opaque region, on the contrary, the grouped circuit elements such as the transistors constituting the peripheral circuit are integrated in a high density so that the element separate region is required to have fine and highly precise sizing and shaping controls but need not pass any incident light. Thus, the opaque region is preferred to be optically opaque. In view of this point, a sixth object of the present invention is to improve the performance of the whole light valve semiconductor integrated circuit device by forming an element separate region which has different sizing and shaping precisions and different optical characteristics for the optically transparent region and the optically opaque region.

In the existing semiconductor device using the SOI (i.e., Silicon Oxide Insulator) substrate, the diodes used in a protection circuit for the input/output terminals are PN junction diodes. In this case, the diodes have a small junction area because they are formed in a thin film. This is because the impurity region has a thickness as deep as the thin film. This makes it difficult to raise the dielectric withstand voltage.

In view of the aforementioned problems of the prior art, a sixth object of the present invention is to provide a semiconductor device using the SOI substrate with a protection circuit having a high dielectric breakdown voltage.

In the prior art, on the other hand, there are known various types of semiconductor laminated substrates, in which a semiconductor layer is formed over such carrier layer, as is so-called the "SOI substrate". This SOI substrate is prepared by depositing a polycrystal silicon thin film on a carrier surface made of an insulating material, for example, by using the chemical vapor deposition process and then by re-crystallizing the polycrystal film into a re-crystallized structure by irradiating a laser beam. Generally speaking, however, the single crystal prepared by re-crystallizing a polycrystal does not always have a uniform azimuth but has a high lattice defect density. For these reasons, it is difficult to apply the miniaturization technology such as used with the silicon single crystal wafer to the SOI substrate fabricated by the process of the prior art or to package photo voltaic energy elements of high performance. In view of this point, a seventh object of the present invention is to provide a light valve device which packages photo voltaic energy elements of fine and high resolution by using a semiconductor thin film having a crystal azimuth as uniform as that of the silicon single crystal widely used in the semiconductor process and a lattice defect of as low density as the same.

On the other hand, the electrooptical modulation substance to be generally used in the light valve device of the prior art is a liquid crystal. This liquid crystal is confined between a pair of substrates opposed at a predetermined gap to each other and has its molecules arrayed in a predetermined direction. In order to realize this arrayed state of the liquid crystal molecules, the inner surfaces of the substrates are subjected to the so-called "alignment". This alignment is generally accomplished by rubbing the substrate surfaces with cotton cloth.

However, the foregoing general objects of the present invention are troubled by the following problem. In case of element integrations of high density, the roughness of the surface of the semiconductor thin film substrate is serious with respect to the pixel size so that the alignment cannot be executed by the rubbing treatment of the prior art. In other words, the roughness of the substrate surface makes the uniform rubbing treatment difficult which degrades the quality of the displayed image. Another problem is that the switch elements miniaturized to a sub-micron order may be broken by the rubbing treatment. Moreover, the blots or dust generated by the rubbing treatment may be larger than the pixel size causing a problem in that the optical transparency of the pixels is reduced.

In view of the aforementioned problems caused by the rubbing treatment of the prior art, an eighth object of the present invention is to provide an active matrix type liquid crystal light valve device which has such a liquid crystal alignment structure that does deteriorate the miniaturized switch elements or the pixel electrodes.

SUMMARY OF THE INVENTION

In order to achieve the above-specified objects, according to the present invention, there is provided a light valve device, one substrate of which comprises a substrate having at least a portion being electrically insulating, and a semiconductor single crystal thin film arranged in at least a portion of the surface of said substrate for defining a peripheral circuit region. Adjacent to the peripheral circuit region, there is formed a pixel array region which is formed with a group of pixel electrodes and a group of switch elements for respectively energizing the pixel electrodes. According to one mode of embodiment of the present invention, the grouped circuit elements are integrated by using the super LSI fabrication technology, for example, in the semiconductor single crystal thin film for defining the peripheral circuit region. These grouped circuit elements constitute peripheral circuits having various functions, such as a drive circuit for driving the grouped switch elements.

In order to fabricate the light valve substrate semiconductor device having such structure, the semiconductor single crystal thin film is formed all over the surface by adhering a semiconductor single crystal plate such as a silicon single crystal wafer of high quality usually used for forming a super LSI to the surface of a substrate formed thereover with an electric insulating film in at least a portion of the substrate, and then by polishing the wafer mechanically or chemically. Next, the semiconductor single crystal thin film is selectively treated to form a peripheral circuit region formed of the semiconductor single crystal thin film and a pixel array region adjacent to the former. According to one mode of embodiment of the present invention, for example, the peripheral circuit region is formed of the portion which is left after the semiconductor single crystal thin film has been partially removed, and the pixel array region is formed by coating the substrate surface portion, from which the semiconductor single crystal thin film has been removed, with a thin film of a polycrystal semiconductor or an amorphous semiconductor. Subsequently, the pixel array region is formed with a group of pixel electrodes and a group of switch elements for energizing the individual pixel electrodes selectively. Simultaneously or before and after the step of forming the switch element group, moreover, the peripheral circuit region is integrated in high density with a group of circuit elements by the super LSI technology or the LSI technology to form peripheral circuits. These peripheral circuits contain driver circuits for driving the switch element group, for example.

According to one mode of embodiment of the present invention, moreover, the semiconductor substrate is divided into the peripheral circuit region and the pixel array region, at least the former of which is coated with the semiconductor single crystal thin film. The peripheral circuit group is integrated in super-high density in that semiconductor single crystal thin film. As a result, the semiconductor integrated circuit substrate device according to the present invention can be realized to have a remarkably small chip size in its entirety. This circuit element group includes complementary insulated gate field effect transistors formed in the silicon single crystal thin film, for example. These CMOS transistors can be operated at a low power consumption and at a high speed. The CMOS transistors can be formed in high density with respect to the silicon single crystal thin film, but it is difficult to form the CMOS transistors which have sufficient performances (especially in respect of speed) and small sizes with respect to the silicon polycrystal thin film or the silicon amorphous thin film.

The circuit element group formed in the peripheral circuit region constitutes peripheral circuits having various functions. For example, the peripheral circuits contain drive circuits for driving the grouped switch elements formed in the pixel array region. Also included are control circuits for controlling the drive circuits in accordance with pixel signals and so on inputted from the outside. Alternatively, there are included a DRAM sense amplifier for detecting as storage data the charges which are temporarily stored in the individual pixel electrodes formed in the pixel array region. Further included is a temperature sensor for detecting the ambient temperature, a photo sensor for detecting the intensity of an incident light, or a source cell for supplying the electric power. These additional circuits can be remarkably easily fabricated in the silicon single crystal thin film by using the ordinary semiconductor fabrication technology.

Incidentally, the pixel array region adjacent to the peripheral circuit region may be made of the semiconductor single crystal thin film but may also be exclusively made of the semiconductor polycrystal thin film or the semiconductor amorphous thin film. These thin films are not suited for the highly dense integration of the circuit elements in comparison with the semiconductor single crystal thin film but are less sensitive to an incident light. Thus, it is possible to form switch elements which are not adversely affected by the incident light. The integrated density of the switch element group is lower than that of the peripheral circuit element group. These switch elements may be the insulated gate field effect thin film transistors but may also be thin film diodes having a smaller size.

In the present invention, an active matrix type light valve device of super small size and high density is constructed by using the composite substrate formed with the aforementioned integrated circuit. The light valve device is constructed to include an opposed substrate opposed to the composite substrate at a predetermined gap, and a electrooptical material such as a liquid crystal layer confined in the gap. The liquid crystal layer has its optical density changing with the voltage of the pixel electrodes, which is selectively supplied by the switch elements formed in the pixel array unit.

The light valve device of the present invention provides a super-small light valve device having a remarkably high pixel density and a remarkably small pixel size. Further provided is a video projection device which is assembled with a light source, an enlarging lens system and the present light valve device, and which has a super-small size and a high resolution.

The structure of the present invention will be described in the following in connection with the individual embodiments.

BRIEF DESCRIPTION OF THE DRAWINGS

FIGS. 9A and 9B jointly comprise a block diagram showing the circuit structure of a Y-driver circuit formed in the peripheral circuit region of the light valve substrate semiconductor device;

FIGS. 12 to 21 are process charts showing a process for fabricating the light valve substrate semiconductor device shown in FIG. 7;

FIG. 25 is a circuit diagram showing a specific example of the structure of a light sensor circuit contained in the additional circuit shown in FIG. 22;

FIG. 26 is a circuit diagram showing a specific structure of a temperature sensor circuit contained in the additional circuit shown in FIG. 22;

FIG. 27 is a circuit diagram showing an improved example of the same temperature sensor;

FIG. 28 is a schematic section showing a portion of the structure of an NPN transistor shown in FIG. 27;

FIG. 29 is a schematic top plan view showing still another embodiment of the light valve substrate semiconductor device;

FIG. 30 is a schematic section showing a portion of the structure of a solar cell shown in FIG. 29;

FIG. 31 is a schematic top plan view showing a further embodiment of the light valve substrate semiconductor device;

FIGS. 39(A) to 39(F) are process charts showing a process for fabricating a light valve substrate semiconductor device which is equipped with switch element transistors having an anti-backchannel type breakdown voltage structure;

FIGS. 40(A) to 40(E) are process charts showing another process for fabricating a light valve substrate semiconductor device which is equipped with switch element transistors having an anti-backchannel type breakdown voltage structure;

FIGS. 41(A) to 41(E) are process charts showing another process for fabricating a light valve substrate semiconductor device which is equipped with switch element transistors having an LDD type breakdown voltage structure;

FIGS. 50(A) to 50(D) are process charts showing a process for forming the pixel electrodes of silicide;

FIGS. 54(A) to 54(G) are process charts showing a process for fabricating the semiconductor device shown in FIG. 51;

FIGS. 59(A) to 59(F) are process charts showing a process for fabricating the light valve substrate single crystal thin film semiconductor device;

FIGS. 64(A) to 64(C) are process charts showing one embodiment of the present invention;

FIG. 65(A) to 65(C) are schematic diagrams showing one embodiment of the sectional structure of a substrate of the present invention;

FIG. 68 is a section showing a semiconductor device formed over the light valve substrate of the present invention;

FIG. 69 is a section showing a semiconductor device formed over a light valve substrate;

FIG. 70 is an electric circuit diagram showing a protective circuit of the semiconductor device of the present invention;

DESCRIPTION OF THE PREFERRED EMBODIMENTS

[First Embodiment]

Figure 1:
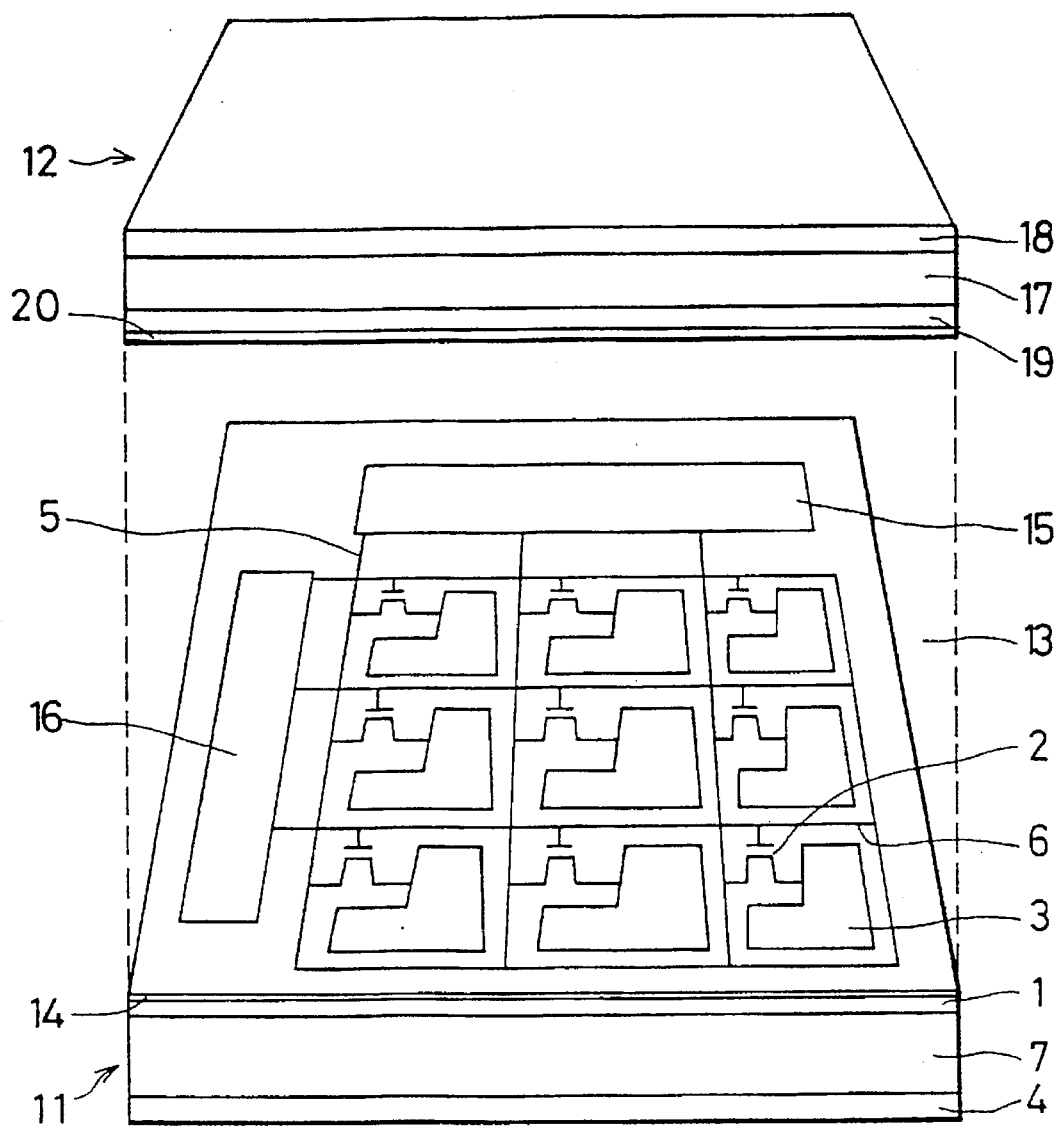
FIG. 1 is an exploded perspective view schematically showing an active matrix liquid crystal display system constructed by using a light valve substrate semiconductor device.

With reference to FIG. 1, here will be described an active matrix liquid crystal display device which is constructed of a light valve substrate semiconductor device according to the present invention. As shown, the light valve device or the active matrix liquid crystal display device is composed of: a light valve substrate semiconductor device 11; an opposed substrate 12 opposed to the semiconductor device 11; and an electrooptical material layer or liquid crystal layer 13 interposed between the semiconductor device 11 and the opposed substrate 12. The semiconductor device 11 is formed with a plurality of pixel electrodes 3 for regulating pixels, and switch elements or high breakdown voltage MOSFETs 2 for driving the pixel electrodes 3 in accordance with predetermined signals. The pixel electrodes 3 are arranged to form a matrix. On the other hand, the MOSFETs 2 are arranged to correspond to the individual pixel electrodes.

As has been described hereinbefore, the semiconductor device 11 has a laminated structure composed of a quartz substrate 7 and a silicon single crystal thin film 1. In addition, a polarizing plate 4 is adhered to the back of the quartz substrate 7. On the other hand, this quartz substrate 7 has its surface coated with an alignment film 14 for aligning the liquid crystal layer 13. Moreover, the MOSFETs 2 have their drain electrodes connected with the corresponding pixel electrodes 3, their gate electrodes connected with scanning lines 6, and their source electrodes connected with signal lines 5. The silicon single crystal thin film 1 is further formed with an integrated X-driver 15, which is connected with the signal lines 5 arranged in columns. Further formed is an integrated Y-driver 16, which is connected with the scanning lines 6 arranged in rows. Since the silicon single crystal thin film used has a high quality, according to the present invention, it is possible to integrate not only the switch element group but also the peripheral circuit such as the aforementioned X-driver 15 and Y-driver 16 simultaneously in a high density by the LSI fabrication technology.

Thus, the number of the external terminals of the present semiconductor device can be drastically reduced to contribute to the reduction in the chip size. The opposed substrate 12 has a laminated structure, in which are laminated a glass carrier 17, a polarizing plate 18 adhered to the outer side of the glass carrier 17, an opposed electrode 19 formed on the inner side of the glass carrier 17, and an alignment layer 20 coating the surface of the opposed electrode 19.

The liquid crystal layer 13 constituting the electrooptical material layer is made of a nematic liquid crystal material, for example. This nematic liquid crystal molecules are characterized to be easily aligned in their major axis direction. The alignment of the liquid crystal molecules is controlled by the paired alignment layers which are formed on the inner sides of the flat semiconductor device 11 and the opposed substrate 12.

Next, the operations of the active matrix device shown in FIG. 1 will be briefly described in the following. As has been described hereinbefore, the individual switch element transistors 2 have their gate electrodes connected with the scanning lines 6 and are fed with the scanning signals by the Y-driver 16 so that their conductiveness controlled in the order of lines. The image signals outputted from the X-driver 15 are sent via the signal lines 5 to the selected transistors 2 in the conducting states. The image signals thus fed are transmitted to the corresponding pixel electrodes 3 to partially excite the liquid crystal layer 13 existing between the pixel electrodes and the opposed electrode 20. As a result, the liquid crystal layer 13 has its alignment partially changed to lose the optical rotatory power to an incident light. This loss of the optical rotatory power is detected by the paired polarizing plates 18 and 4 and observed in terms of change in the light intensity. The image signals applied at this time are given a voltage of several to several tens volts so as to excite the liquid crystal layer 13 sufficiently. Incidentally, the level of this voltage is suitably determined in accordance with the voltage responding characteristics of the electrooptical material used. Even if the video signals applied have a relatively high voltage, the individual switch transistors 2 are not subjected to any dielectric breakdown because they have the aforementioned high breakdown voltage characteristics. Therefore, the light valve device constructed by using the semiconductor device of the present invention is remarkably excellent in its reliability. Incidentally, while the pixels are unselected, the switch transistors 2 are nonconductive to retain the image signals, which are written in the pixel electrodes, as electric charges. An ON/OFF current ratio is usually used for expressing the high-speed switching performance of the transistors 2. The current ratio necessary for the liquid crystal operations is easily determined from the write time and the hold time. If the image signals are TV signals, for example, they have to be written 90% or more for one scanning time period of about 60 μsecs. In this case, 90% or more charges have to be retained for one field time period of about 16 msecs. In this regard, the ON/OFF ratio can be obtains having six or more figures in accordance with the present invention because the high breakdown voltage MOSFETs are formed of a silicon single crystal thin film having a remarkably high charge mobility.

As a result, it is possible to provide an active matrix device having a remarkably high signal responsiveness. In addition, the peripheral circuit containing the X-driver 15 and the Y-driver 16 can be simultaneously formed over the common silicon single crystal thin film by making use of the high mobility of the silicon single crystal thin film.

[Second Embodiment]

Figure 2:
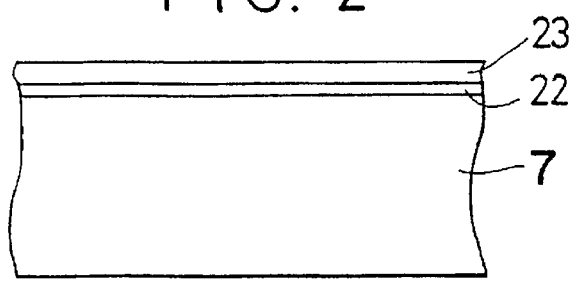
FIG. 2 is a section showing an embodiment of the adhesion structure of a semiconductor single crystal thin film composite substrate.

FIG. 2 shows a second embodiment of the present invention, in which: reference numeral 7 designates a quartz substrate; numeral 22 designates a stress buffer thin film; and numeral 23 designates a silicon single crystal thin film.

The optimum stress buffer thin film 22 is made of PSG (i.e., Phospho-Silicate Glass). Another suitable material is exemplified by a SiO₂ film, a PSG (i.e., Phospho-Silicate Glass) film, a BSG (i.e., Boron-Silicate Glass) film or a Poly-Si film. The quartz substrate 7, the stress buffer thin film 22 and the silicon single crystal film 23 are laminated in the recited order, as shown, and are adhered to each other.

The adhesions are accomplished by the thermo-compressive bonding process.

As has been described, the quartz substrate 7 and the silicon single crystal film 23 have different coefficients of thermal expansion. As a result, the semiconductor single crystal composite thin film substrate constructed to have the silicon single crystal thin film and the transparent substrate adhered directly to each other is troubled by a separation or cracking during the process for the LSI fabrication requiring a temperature as high as 800° C.

In the present embodiment, however, the PSG film is sandwiched as the stress buffer thin film 22 between the two films. As a result, the stress due to the difference between the coefficients of thermal expansion is absorbed by that stress buffer thin film 22 so that the silicon single crystal film 23 can be prevented from the separation or cracking.

This stress buffer thin film 22 can also be formed by a spin coating process for applying SiO₂ which has recently been used for flattening.

[Third Embodiment]

Figure 3:
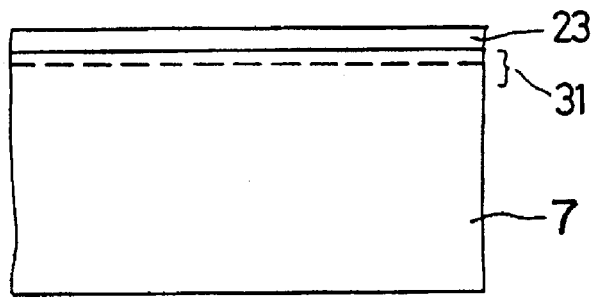
FIGS. 3 to 6 are sections respectively showing other adhesion structures of the present invention.

FIG. 3 shows another embodiment of the present invention.

What is different from that of FIG. 2 resides in that the stress buffer layer is exemplified in the present embodiment by a stress buffer region 31 formed as the surface layer of the quartz substrate 7. This stress buffer region 31 is formed by implanting the surface of the quartz substrate 7 with ions. The seeds of ions to be used are phosphor but also may be exemplified by boron, silicon or germanium. The implanting voltage used was 150 KeV.

[Fourth Embodiment]

Figure 4:
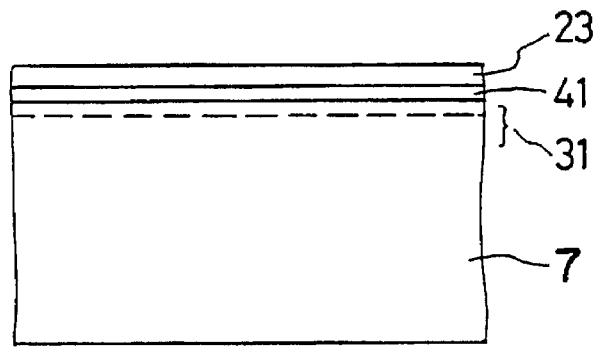

FIG. 4 shows still another embodiment of the present invention. This embodiment is constructed by adhering an impurity stop layer 41 between the silicon single crystal thin film 23 and the quartz substrate 7 of the embodiment of FIG. 3. Thanks to the presence of that impurity stop layer, the ion seeds implanted for forming the stress buffer region 31 can be prevented from diffusing into the silicon single crystal thin film 23 by the impurity stop layer 41. This impurity stop layer 41 is made of a silicon nitride film. An oxide film can also be used for the same application. Moreover, the adhesion between the impurity stop layer 41 and the single crystal thin film 23 is accomplished by the thermo-compressive bonding process.

By this structure, it is possible to provide a more reliable light valve device than that of the embodiment of FIG. 3.

[Fifth Embodiment]

Figure 5:
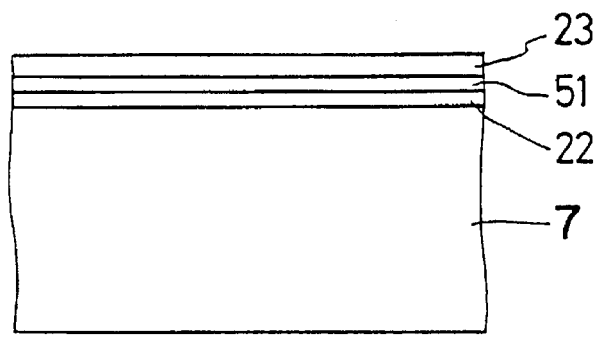

FIG. 5 shows another embodiment of the present invention, which corresponds to an improvement over that of FIG. 2. What is different resides in that an impurity stop layer 51 is adhered between the stress buffer thin film 22 and the silicon single crystal film 23 of FIG. 2. By the presence of the impurity stop layer 51, an impurity or noxious material contained in the stress buffer thin film 22 can be prevented from diffusing or stealing into the silicon single crystal thin film 23.

The impurity stop layer 51 used is identical to that of FIG. 4. By to this structure, it is possible to provide a more reliable light valve device than the embodiment of FIG. 2.

[Sixth Embodiment]

Figure 6:
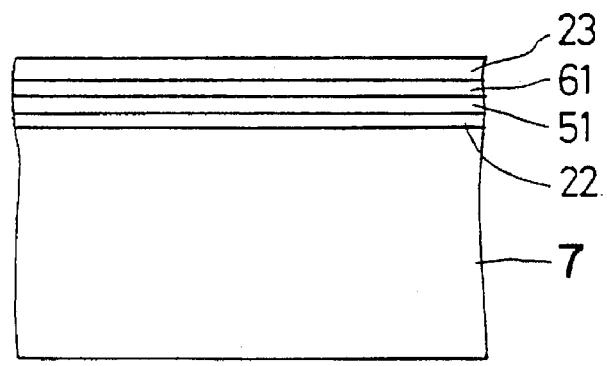

FIG. 6 shows a further embodiment of the present invention, which is improved over that of FIG. 5. What is different resides in that an interface control layer 61 is adhered between the impurity stop layer 51 and the silicon single crystal thin film 23 of FIG. 5. By the presence of that interface control layer 61, the interface charge or interface level between the interface control layer 61 and the single crystal thin film 23 can be decreased to improve the reliability and characteristic dispersion of the transistors to be formed in the single crystal thin film 23.

As a result, it is possible to provide a light valve device which is superior in reliability and mass-productivity as compared to the embodiment of FIG. 5.

The interface control layer 61 used is an oxide film (e.g., SiO₂). This film is formed over the surface of the single crystal thin film 23 by an adhesive. This oxide film may be formed by the thermal oxidation process or the CVD process. Moreover, the interface is stabilized better if the adhesion between the interface control layer 61 and the impurity stop layer 51 is effected by the thermo-compressive bonding process.

This is because the thermo-compressive bonded interface is more stable than that formed by the CVD process or the thermal oxidation process.

Since the stress buffer layer is sandwiched between the silicon single crystal thin film and the transparent substrate by the structures of the foregoing embodiments, it is possible to provide a semiconductor single crystal thin film composite substrate of high quality having neither any separation nor any cracking. Moreover, the semiconductor single crystal thin film composite substrate fabricated is given a stable performance by sandwiching the impurity stop layer and the interface control layer.

[Seventh Embodiment]

Figure 7:
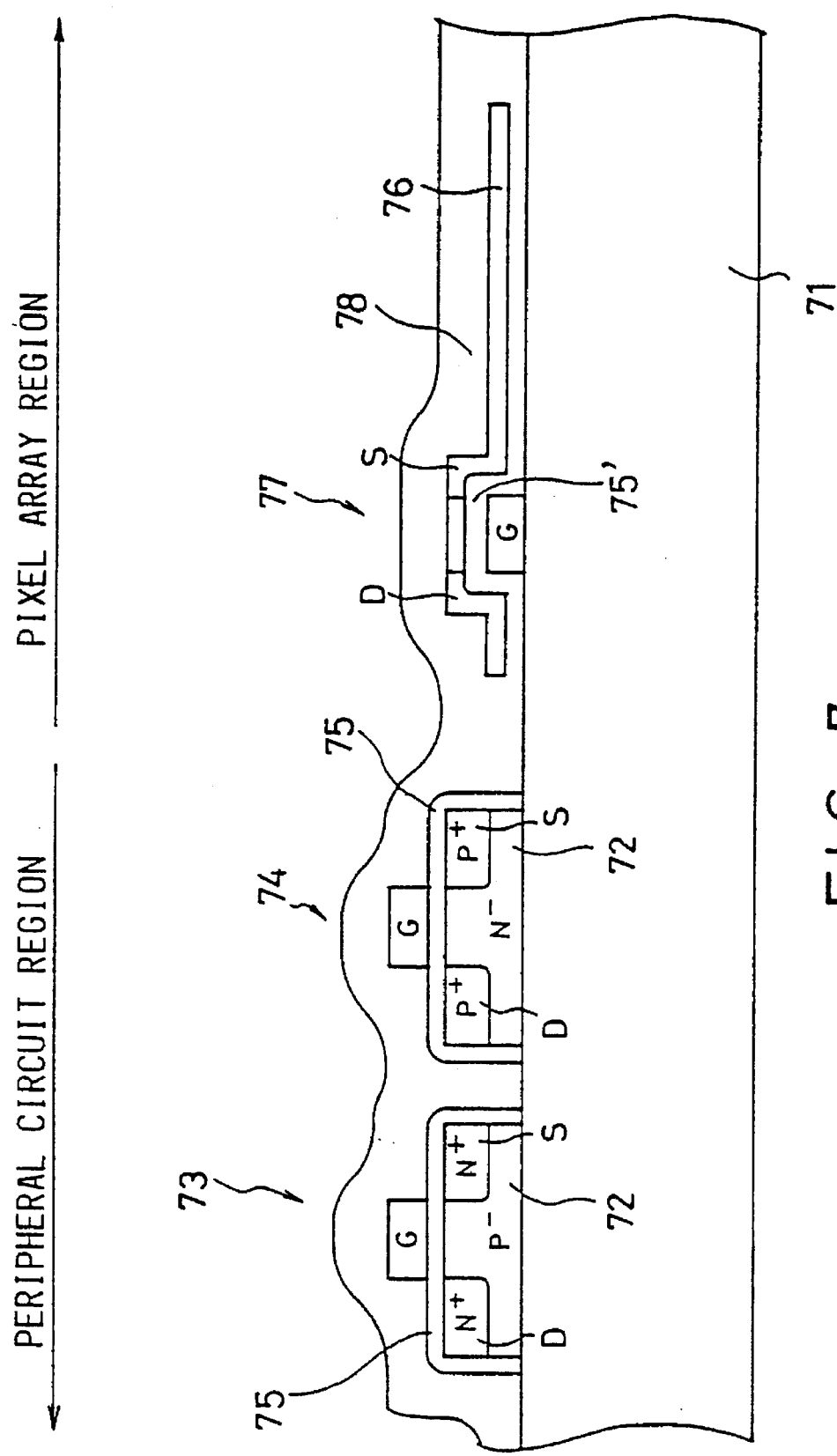
FIG. 7 is a section showing a portion of a typical structure of the light valve substrate semiconductor device.

FIG. 7 is a schematic section showing a portion of a typical structure of the planar type light valve substrate semiconductor integrated circuit device according to the present invention. In this typical example, there is used an electrically insulating transparent substrate 71. As shown, the substrate 71 has its surface divided into a peripheral circuit region and a pixel array region adjacent to the former. The peripheral circuit region is coated with a semiconductor single crystal thin film 72. This semiconductor single crystal thin film 72 is selectively etched and formed with a plurality of island element regions. In FIG. 7, only one pair of element regions are shown for simple illustrations. These element regions are individually formed with circuit elements for forming the peripheral circuits. One element region is formed with an N-type insulated gate field effect transistor 73, whereas the other element region is formed with a P-type insulated gate field effect transistor 74. These paired N- and P-type transistors 73 and 74 constitutes the so-called "CMOS transistor pair". The CMOS transistor is a circuit element of remarkably high performance and is featured by its high speed operations and a low power consumption. The N-type MOS transistor 73 is composed of a pair of $N^+$-type drain region D and source region S, which are spaced in the surface of the $P^-$-type element region, and a gate electrode G laminated thereover through an insulating film 75. On the other hand, the P-type transistor 74 is composed of a pair of $P^+$-type drain region D and source region S, which are spaced in the surface of the $N^-$-type element region, and a gate electrode G laminated thereover through an insulating film 75.

On the other hand, the pixel array region is formed with a group of pixel electrodes and a group of switch elements. For simple illustrations, there are shown in FIG. 7 only one pixel electrode 76 and one corresponding switch element. The switch element is constructed of an insulated gate field effect type thin film transistor 77. This thin film transistor 77 is composed of a gate electrode G formed over the surface of the substrate 71, and a pair of drain region D and source region S, which are formed in a semiconductor polycrystal thin film 78 laminated over the substrate 71 through a gate insulating film 75'. The semiconductor polycrystal thin film 78 constituting the source region S is extended to form the pixel electrode 76. The pixel electrode 76 can be substantially transparent by making the semiconductor polycrystal thin film 78 as thin as several hundreds Å.

[Eighth Embodiment]

Figure 8:
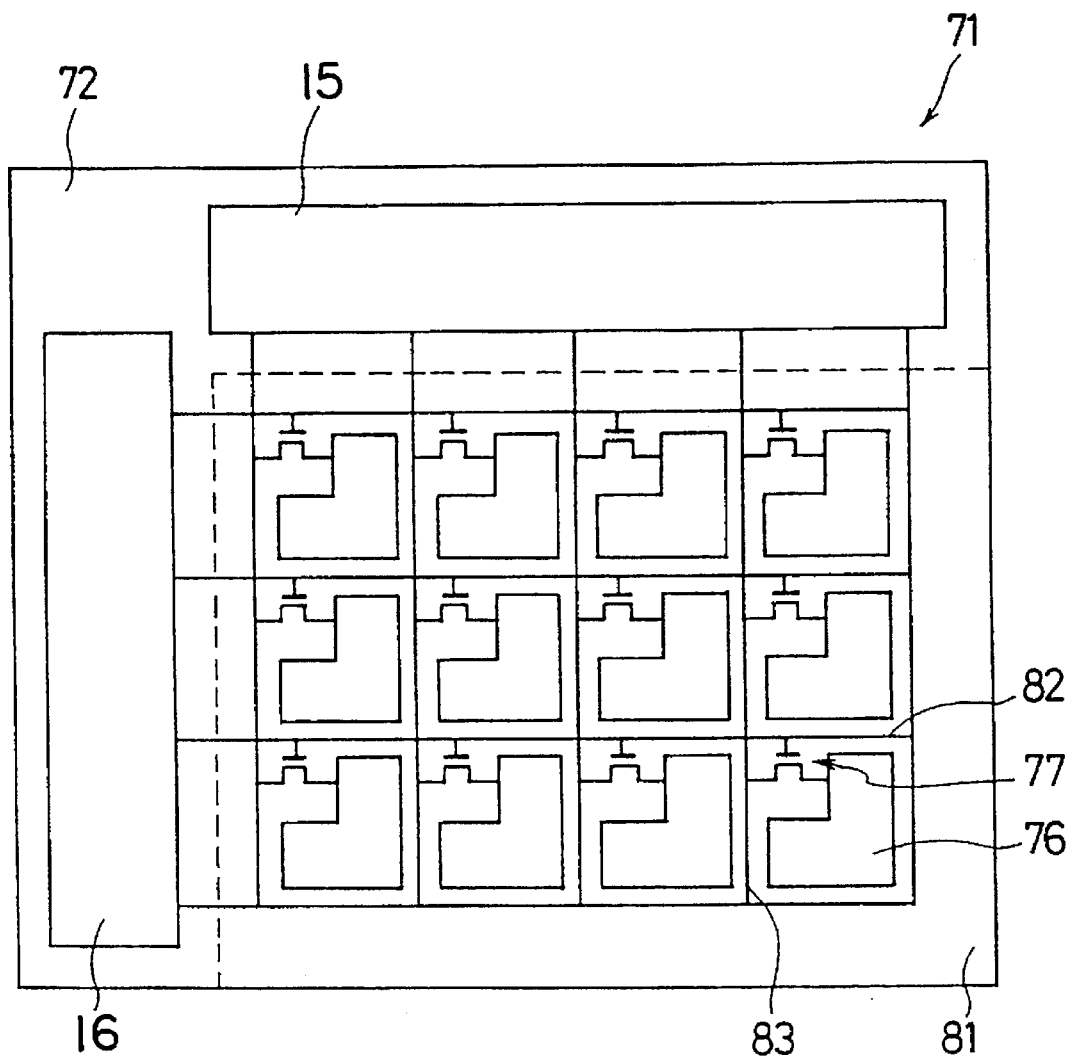
FIG. 8 is a top plan view showing the whole structure of the same light valve substrate semiconductor device.

Next, FIG. 8 is a schematic top plan view showing the structure of a planar type light valve substrate semiconductor integrated circuit device. As shown, the substrate 71 is divided into a peripheral circuit region, which is coated with the semiconductor single crystal thin film 72, and a pixel array region which is coated with the semiconductor polycrystal thin film 78.

The boundary is indicated by dotted lines.

The pixel array region 81 is formed with a group of thin film transistors 77 which are arranged in a matrix shape like the group of matrix-arranged pixel electrodes 76. The thin film transistors 77 have their source electrodes connected with the corresponding pixel electrodes 76, their gate electrodes connected with scanning lines 82 and their drain electrodes connected with signal lines 83.

On the other hand, the peripheral circuit region is formed with an X-driver circuit 15 which is composed of the CMOS transistors or the like, as shown in FIG. 7. This X-driver circuit 15 is connected with the signal lines 83 arranged in columns. There is also included a Y-driver circuit 16 which is connected with the scanning lines 82 arranged in rows. These X- and Y-driver circuits 15 and 16 are used to drive the switch element group composed of the thin film transistors 77. The Y-driver circuit 16 selects the switch element group sequentially in the order of lines through the individual scanning lines 82, and the X-driver circuit 15 feeds the selected switch elements with the image signals through the signal lines 83. The X- and Y-driver circuits 15 and 16 have similar circuit structures.

[Ninth Embodiment]

Figure 9B:
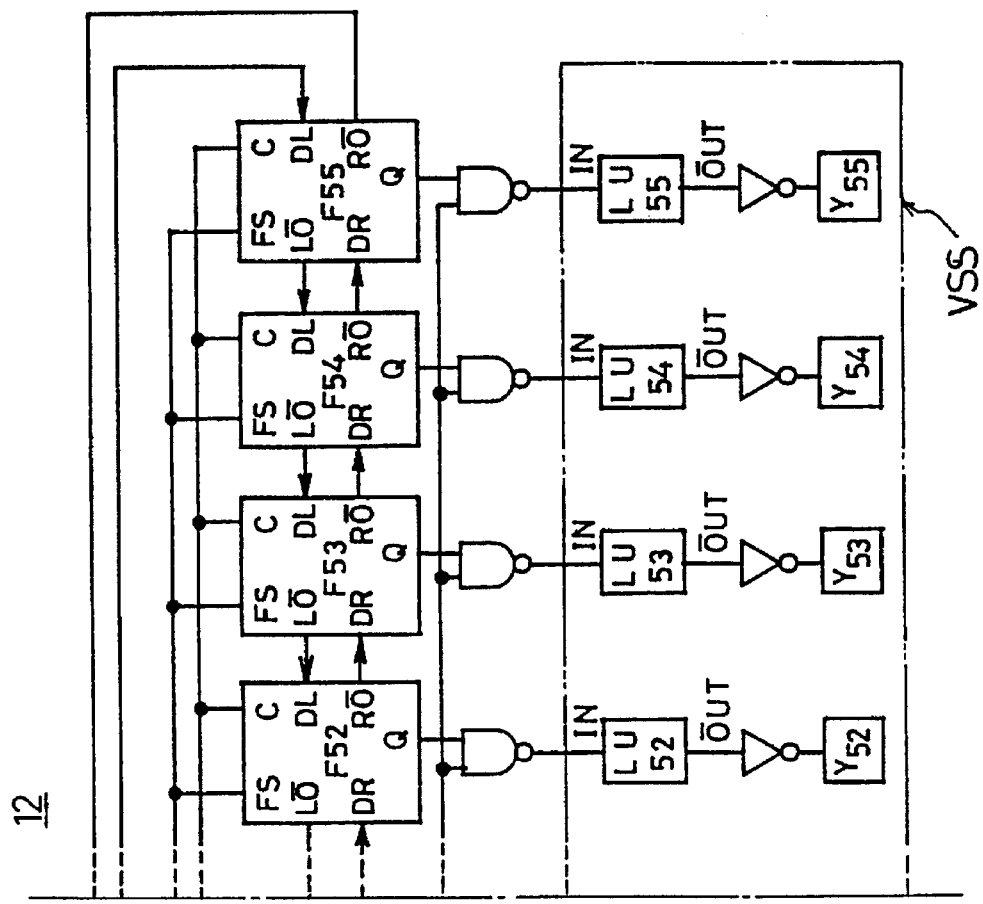

FIG. 9 is a block diagram showing the Y-driver circuit 85 by way of example. In this embodiment, totally fifty five scanning lines Y1 to Y55 are selected in the order of lines. The Y-driver circuit 55 is basically composed of shift registers F1 to F55 connected in fifty five stages. These shift registers are fed with a clock signal YC, a drive signal YD, a frame signal FSY, a synchronous signal $Y_{STF}$ and so on to output timing signals for controlling the selection timings of the scanning lines Y1 to Y55 via individual AND gates. These individual gates have their output terminals connected with level shifters LU1 to LU55, respectively. These level shifters are provided for transforming and outputting the voltage levels of the timing signals to apply high voltages to the gate electrodes of the individual switch elements through the scanning lines Y1 to Y55. Although a voltage as high as about 15 V is usually required for driving the pixel array, a voltage as low as about 4.5 V is sufficient for operating the peripheral circuit including the driver circuits. Thus, a primary voltage of $V_{DD}-V_{GND}=4.5$ V is boosted to a secondary voltage of $V_{DD}-V_{SS}=15$ V by using the level shifters LU1 to LU55. By this structure, the peripheral circuit can have its power consumption reduced in its entirety.

[Tenth Embodiment]

Figure 10:
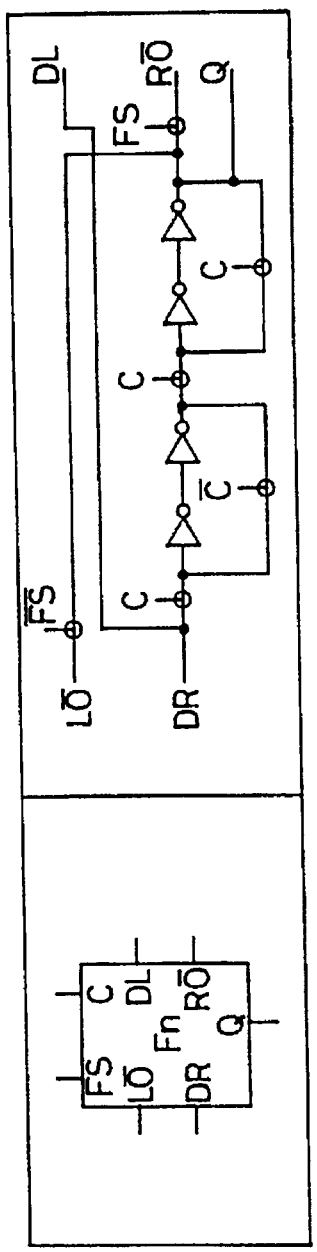
FIG. 10 is a circuit diagram showing the detailed circuit structure of a shift register composing a part of the Y-driver circuit shown in FIG. 9.

Next, FIG. 10 shows an example of the detailed circuit structure of each shift register Fn. As shown, the shift register includes a plurality of inverters. These inverters can be formed easily having a combination of a CMOS transistor pair of the N-type MOS transistor 73 and the P-type MOS transistor 74, as shown in FIG. 7.

[Eleventh Embodiment]

Figure 11:
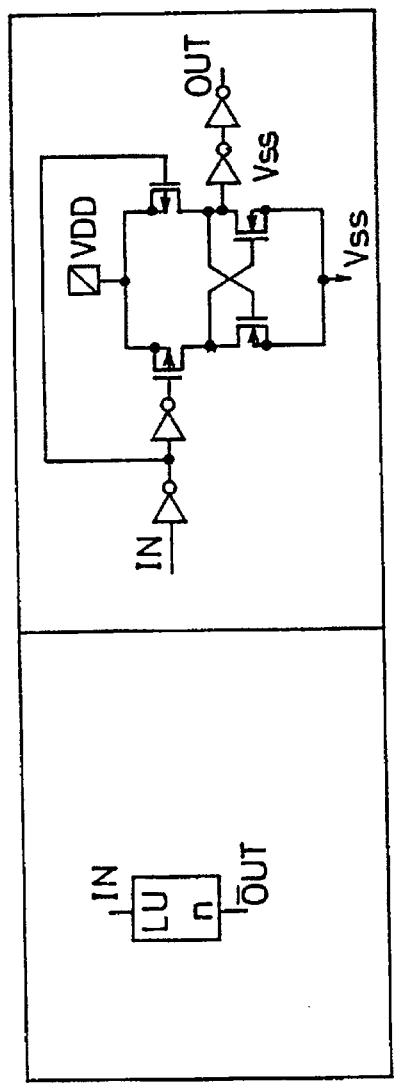
FIG. 11 is a circuit diagram showing the detailed circuit structure of a level shifter composing a part of the same Y-driver circuit.

Moreover, FIG. 11 shows an example of the detailed circuit structure of each level shifter LUn. As shown, the level shifter is composed of a plurality of inverters, a plurality of N-type MOS transistors, a plurality of P-type MOS transistors and so on. Thus, like the shift registers, the level shifters can be integrated in a high density over the semiconductor single crystal thin film 72.

[Twelfth Embodiment]

With reference to FIGS. 12 to 21, the process for fabricating the semiconductor integrated circuit device shown in FIG. 7 will be described in detail in the following. At a first step shown in FIG. 12, there are prepared a transparent electrically insulating substrate 101 made of quartz or the like and a single crystal semiconductor substrate 102 made of silicon. The single crystal silicon substrate 102 is preferably exemplified by a silicon wafer of high quality used in the LSI fabrication and has a crystal azimuth in a uniform range of <100> 0.0±1.0 and a single crystal lattice defect density of 500/cm² or less. The prepared quartz substrate 101 and the prepared silicon wafer 102 have their surfaces precisely finished at first. Subsequently, the two substrates are thermo-compressively bonded by superposing and heating the two polished surfaces. As a result of this thermo-compressive bonding treatment, the two substrates 101 and 102 are fixedly bonded.

At a step shown in FIG. 13, the surface of the silicon wafer 102 is polished. As a result, the quartz substrate 101 is formed on its surface with a single crystal silicon thin film 103 polished to a desired thickness of several microns. In order to thin the silicon wafer substrate 102, the mechanical polishing treatment may be replaced by a chemical etching treatment. Since the single crystal silicon thin film 103 thus obtained substantially retains the quality of the silicon wafer 102 as it is, it is possible to obtain a composite substrate material which is remarkably excellent in the uniformity of crystal azimuth and the lattice defect density.

On the other hand, there is known in the art an SOI substrate which has a two-layered structure composed of a substrate and a silicon single crystal thin film. The SOI substrate is achieved by depositing a polycrystal silicon thin film on the surface of a carrier made of an insulating material, for example, by the chemical vapor deposition process and then by performing a heat treatment with a laser beam to re-crystallize the polycrystal film into a single crystal structure. Despite the use of this prior technology, however, the single crystal thus re-crystallized from the polycrystal does not always have a uniform crystal azimuth and has a high lattice defect density. This shortens the lifetime of the carrier and makes it difficult to form the DRAM.

For this reason, it is difficult to apply the miniaturization technology such as that used with the silicon wafer to the SOI substrate which is fabricated by the existing process. It is also difficult to achieve a quality of high speed. On the contrary, the composite substrate used in the present invention has the two-layered structure composed of the substrate and the silicon wafer single crystal thin film of high quality so that it can be applied directly to the ordinary LSI fabrication technology. Moreover, the performance obtainable is similar to that of the bulk silicon.

At a subsequent step shown in FIG. 14, the single crystal silicon thin film 103 covering all over the surface of the substrate 101 is treated to set the peripheral circuit region and the pixel array region. In FIG. 14, only the boundary portion of these two regions is partially shown. In this example, the silicon single crystal thin film existing in the pixel array region is etched off all over the surface to expose the surface of the substrate 101 to the outside. On the other hand, the peripheral circuit region is subjected to a selective removing treatment such as a plasma ion etching treatment through a mask 104, which is patterned to a predetermined shape, to form a plurality of island element regions 105 made of the silicon single crystal thin film 103. For simple illustrations, only one element region is shown in FIG. 14.

At a step shown in FIG. 15, the surface and sides of the silicon single crystal thin film 103 patterned into the island shapes are subjected to a thermal oxidation to form a gate insulating film 106 made of silicon dioxide.

At a step shown in FIG. 16, a polycrystal silicon film is deposited by the chemical vapor deposition process to cover all over the surface of the substrate 101. This polycrystal silicon film is selectively etched by means of a resist mask (although not shown), which is patterned into a predetermined shape, to form a first gate electrode G1 on the surface of the gate insulating film 108. Simultaneously with this, the polycrystal silicon film is selectively etched in the pixel array region, too, to form a second gate electrode G2.

Figure 17:
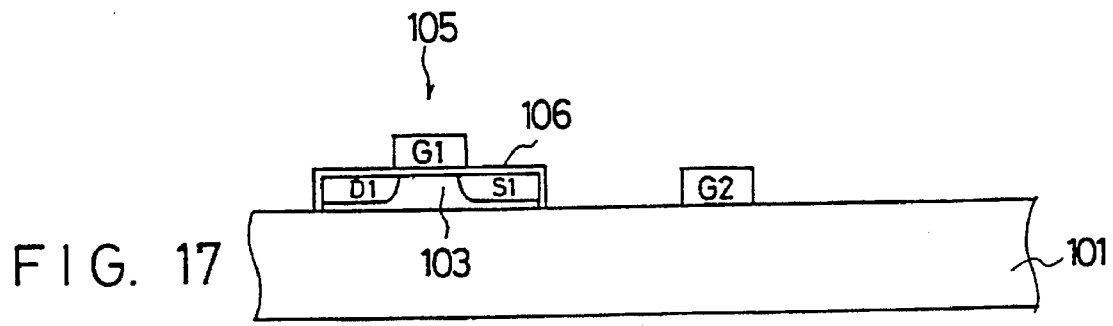
Figure 18:
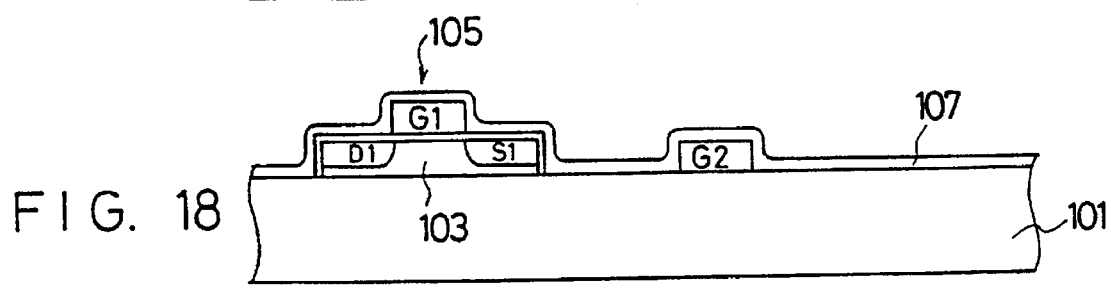

At a subsequent step shown in FIG. 17, the silicon single crystal thin film 103 has its surface implanted with impurity ions through the gate insulating film 106 by using the gate electrode G1 as a mask, to form a first drain region D1 and a first source region S1. As a result, a transistor channel forming region having no impurity doped is formed below the gate electrode G1 and between the drain region D1 and the source region S1. As a result, the island element region 105 is formed with an insulated gate field effect type single crystal thin film transistor. This transistor constitutes the peripheral circuit element, as has been described hereinbefore.

Next, the substrate 101 is coated all over its surface with a silicon dioxide coating film 107 by the chemical vapor deposition process. This silicon dioxide coating film 107 forms a gate insulating film for the second gate electrode G2.

Figure 19:
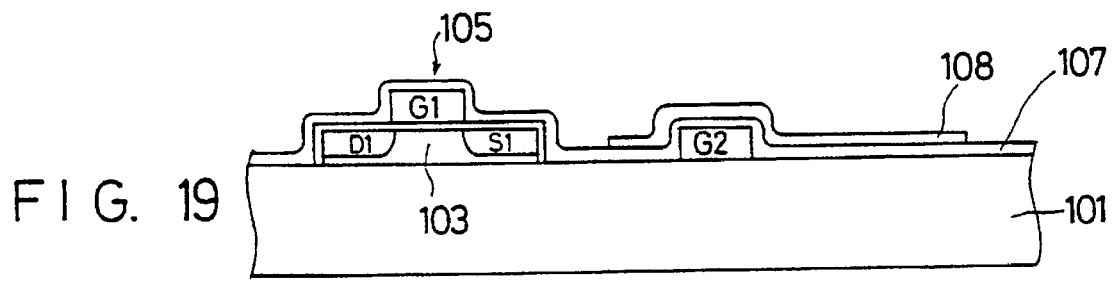

At a subsequent step shown in FIG. 19, the chemical vapor deposition process is sued to form a polycrystal silicon thin film 108 all over the surface of the silicon dioxide coating film 107. The polycrystal silicon thin film 108 is preferably set to have a thickness of several hundreds Å and is substantially transparent. A mask (although not shown) patterned into a predetermined shape is used for a selective etching to remove the polycrystal silicon thin film 108 partially.

Figure 20:
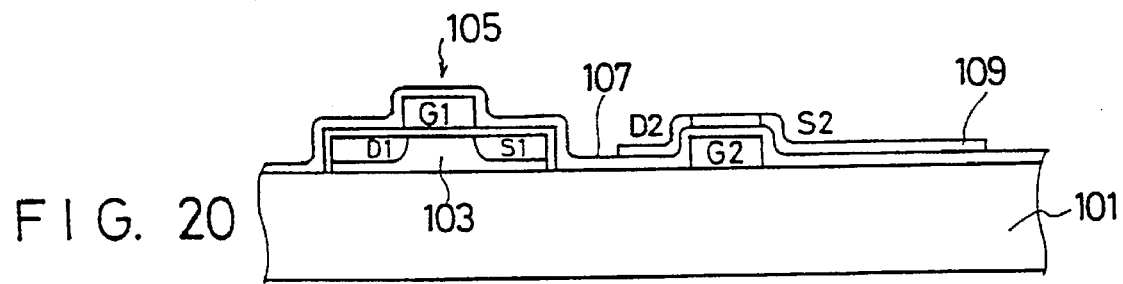

At a step shown in FIG. 20, moreover, the polycrystal silicon thin film 108 thus patterned is selectively implanted with an impurity to form a second drain region D2 and a second source region S2 at the two sides of the second gate electrode G2. This impurity injection is carried out by the impurity ion implantation or the impurity diffusion. As a result, the pixel array region is formed with the insulated gate field effect type polycrystal thin film transistor which is composed of the second gate electrode G2, the second drain region D2 and the second source region S2. Simultaneously with this, the portion of the polycrystal silicon thin film 108, which extends from the source region S2, forms a transparent pixel electrode 109.

Figure 21:
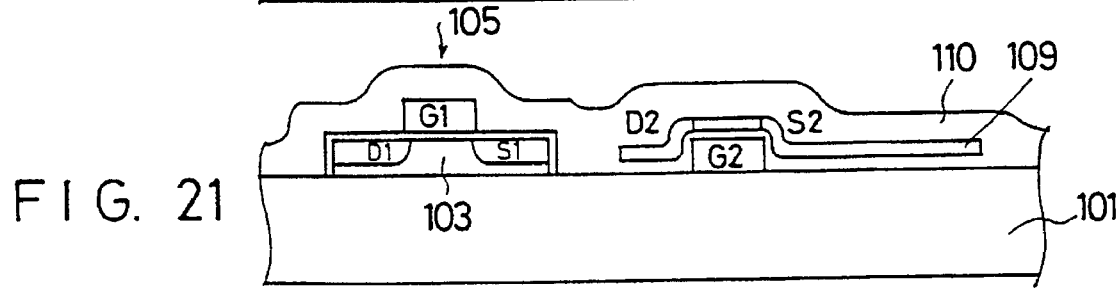

At a final step shown in FIG. 21, a metal wiring is accomplished for a predetermined electric connection, and the substrate 101 is then coated all over its surface with a transparent passivation film 110.

As a result, the pixel array region is formed of the switch elements composed of the polycrystal thin film transistors, and the pixel electrodes composed of the polycrystal silicon thin film.

In the embodiment thus far described, the pixel array region is coated with the polycrystal silicon thin film. Despite of this fact, however, the coating should not be limited thereto but may be carried out by coating the pixel array region with a silicon amorphous thin film and by forming the amorphous thin film with switch elements or the like. Alternatively, the pixel array region may be left with the silicon single crystal thin film to be formed with the switch elements or the like. However, the silicon single crystal thin film has a thickness of about several microns because it is formed by polishing the silicon wafer, as has been described hereinbefore. As a result, the silicon single crystal thin film is substantially opaque so that it cannot be used directly as the transparent pixel electrodes. This makes it necessary to transform the silicon single crystal thin film at the portion to be formed with the pixel electrodes into a field oxide film by the selective thermal oxidation. On the contrary, the silicon polycrystal thin film or the silicon amorphous thin film can be made remarkably thin by the vacuum evaporation process or the chemical vapor deposition process so that it can be utilized as it is as the transparent pixel electrodes. On the other hand, the silicon single crystal thin film transistor has a larger leakage current due to an incident light than that of the silicon polycrystal thin film transistor or the silicon amorphous thin film transistor. Thus, the switch elements may more preferably be exemplified by an insulated gate field effect type thin film transistor which is made of not a single crystal material but a polycrystal or amorphous material. Moreover, the silicon polycrystal thin film or the silicon amorphous thin film can be deposited extremely thin, as has been described hereinbefore, the step size of the surface can be reduced to prevent the stepwise cut of the wiring pattern or the like effectively.

In the present embodiment, the silicon polycrystal thin films shared between the first gate electrode G1 and the second gate electrode G2 are simultaneously patterned. Despite of this fact, however, the second gate electrode G2 should not be limited thereto but can be formed of the silicon single crystal thin film 103 simultaneously as the thin film 103 is to be selectively etched to form the island element regions.

[Thirteenth Embodiment]

Figure 22:
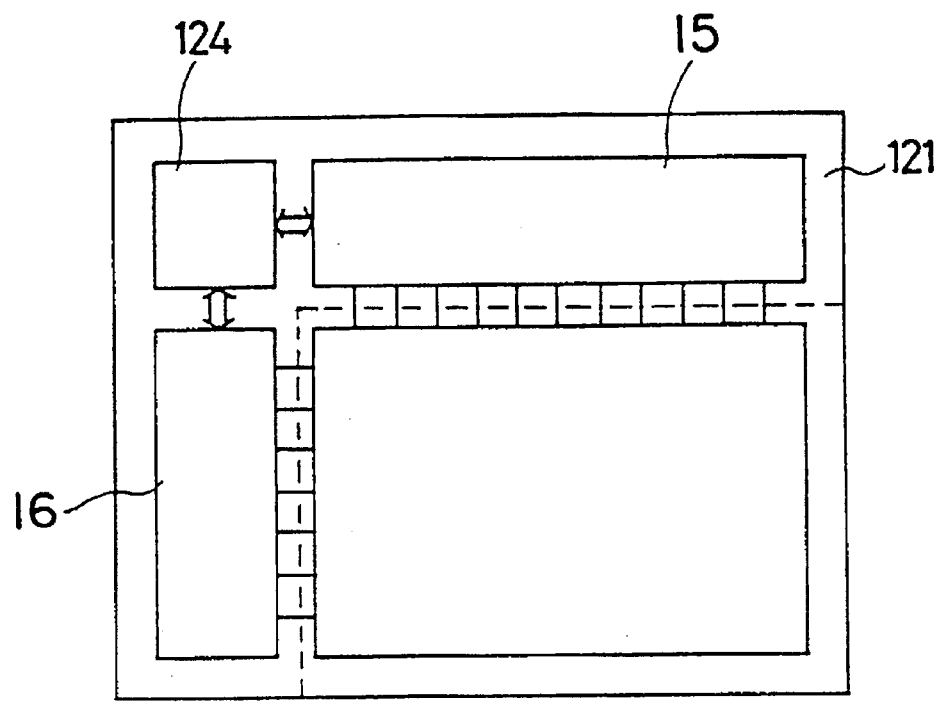
FIG. 22 is a schematic top plan view showing another embodiment of the light valve substrate semiconductor device.

With reference to FIG. 22, a planar type light valve substrate semiconductor integrated circuit device according to the present invention will be described in the following in connection with another embodiment. In the present embodiment, too, a substrate 121 is divided, as indicated by dotted lines, into a pixel array region and a peripheral circuit region. The pixel array region is formed with a group of pixel electrodes and a group of switch elements, which are arranged in a matrix shape. On the other hand, the peripheral circuit region is coated with a silicon single crystal thin film. This thin film is formed not only with an X-driver circuit 15 and a Y-driver circuit 16, as in the foregoing embodiments, but also with an additional circuit 124 having a variety of functions. Since this additional circuit 124 can be formed of a silicon single crystal thin film of high quality, a group of various additional circuits can be integrated in high density by using the ordinary LSI technology. For example, the additional circuit 124 includes a control circuit for controlling the X-driver circuit and the Y-driver circuit.

This control circuit is constructed of a video signal processing circuit for processing the image or video signals inputted from an external signal source to transfer the processed signals to the X-driver circuit 15. By thus adding the video signal processing circuit over the semiconductor integrated circuit substrate device, this substrate device can be connected directly with an external image signal source. As a result, it is possible to achieve a remarkably excellent general-purpose, super-small and high-speed image device. The circuit conceivable to be additionally incorporated is one having various functions in addition to the video signal processing circuit.

[Fourteenth Embodiment]

Figure 23:
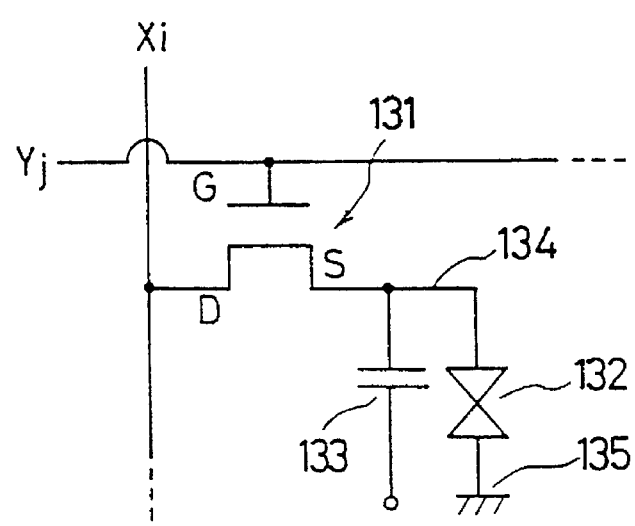
FIG. 23 is an equivalent circuit diagram showing one pixel for explaining the operations of a DRAM sense amplifier contained in an additional circuit shown in FIG. 22.

The additional circuit is exemplified by a DRAM sense amplifier. This DRAM sense amplifier can be used to detect as the stored data the charges, which are temporarily stored in each of the pixel electrodes, thereby to detects the defect of each pixel. First of all, the principle will be briefly described with reference to FIG. 23. FIG. 23 shows an equivalent circuit of one pixel existing at a node between a signal line Xi and a scanning line Yj. The pixel is formed of a switch element 131 made of a transistor, a liquid crystal 132, a capacitance element 133 and so on. The switch element 131 is formed in the surface of the semiconductor substrate device, and the liquid crystal 132 is sandwiched between a pixel electrode 134 formed in the surface of the semiconductor substrate device and an opposed electrode 135 formed in the opposed substrate. In addition, the capacitance element 131 is formed between the pixel electrode 134 and another electrode such as a signal line electrode or a scanning line electrode. Alternatively, the capacitance element 131 can be formed over single crystal silicon. The switch transistor 131 has its gate electrode connected with the scanning line Yj, its drain region connected with the signal line Xi and its source region connected with the pixel electrode 134. If the switch transistor 131 is rendered conductive through the scanning line Yj, the capacitance element 133 is stored with predetermined charges through the signal line Xi. After this, the switch transistor 131 is instantly rendered nonconductive through the scanning line Yj so that the charges are stored in the capacitance element 133. By the voltage to be established between the two ends of the capacitance element 133, the liquid crystal 132 is driven to perform the light valve function. Thus, the equivalent circuit shown in FIG. 23 is substantially identical to one memory cell of the DRAM. Specifically, the capacitance element 133 has a function to store the image signals, which are fed through the signal line Xi, temporarily as the charges. In the present invention, this temporary storage time can be held to be as long as that of the DRAM using the bulk silicon of the prior art. This is because the materials are identical. So long as there is no defect in each pixel, the memory cell will perform normal operations. Thus, by reading out the charges stored in the capacitance element as the stored data, the defect, if any, of each pixel can be tested remarkably easily and promptly.

For this, the additional circuit 124 contains the DRAM sense amplifier for reading out the data stored in the memory cell. If the capacitance elements of the DRAM and transistor are made of polycrystal silicon, the data storage time is too short to operate the DRAM.

[Fifteenth Embodiment]

Figure 24:
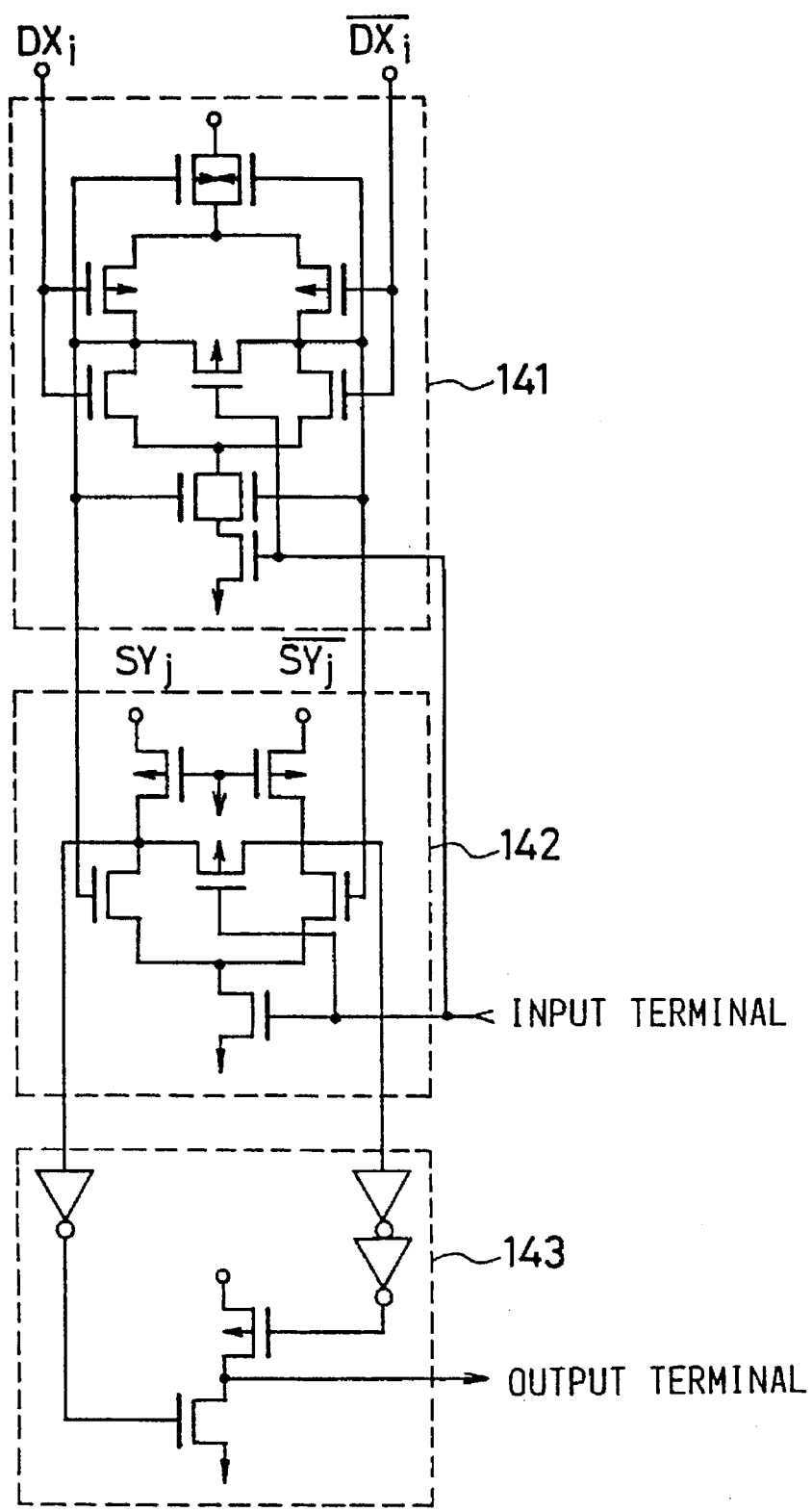
FIG. 24 is a circuit block diagram showing the detailed circuit structure of a DRAM sense amplifier contained in the additional circuit shown in FIG. 22.

FIG. 24 shows an example of a detailed circuit structure of such DRAM sense amplifier. In FIG. 24, there is shown one DRAM sense amplifier which corresponds to each column component of the matrix pixel array. The sense amplifier is connected with the X-driver circuit 15 and the Y-driver circuit 16, as shown in FIG. 22. The sense amplifier has a three-step structure, of which the first step 141 and the second step 142 are rendered operative in response to to a read signal. Specifically, when the data stored in the pixel array to be deemed equivalent to the memory array are to be read out, the read signal is outputted to render the DRAM sense memory circuit readable.

A pair of input terminals at the first step 141 is fed through the X-driver circuit 122 with data DXi read out onto the signal line Xi and their inverted data $\overline{DXi}$.

The first step 141 amplifies the data fed thereto.

Moreover, the second step 142 has its input terminals fed through the Y-driver circuit 16 with a scanning signal SYj appearing on the scanning line and the inverted signal $\overline{SYj}$ of the former. In synchronism with the scanning signal, the second step 142 further amplifies the data fed from the first step. Finally, a third step 143 is a buffer which is sequentially fed with the data read out to the output terminals of the second step 142. Although not shown, the data thus read out are sequentially compared with and evaluated from reference data so that the existence of the defect of each pixel is detected. As is apparent from FIG. 24, the DRAM sense amplifier is composed of a number of transmission gates, inverters, and N- and P-type transistors. All of these circuit elements can be made of insulated gate field effect transistors. The silicon single crystal thin film is the most suitable for integrating those grouped transistor elements in high density, with a low leakage current and in a high-speed operation. Especially, the single crystal silicon CMOS transistors can be utilized so as to warrant the high-speed operation and the low power consumption. In the case of the single crystal, the DRAM function can be easily afforded because the lifetime is longer by one order of magnitude or more as compared with the polycrystal.

[Sixteenth Embodiment]

FIG. 25 shows a photo sensor circuit as another example of the peripheral circuit to be incorporated into the additional circuit. The photo sensor circuit is used to detect the intensity of an incident light for irradiating the semiconductor integrated circuit substrate device. Generally speaking, the light valve device is equipped with a light source. This light source has its lifetime limited to have its emission intensity gradually dropped. By monitoring the drop of the emission intensity at all times, the inspection, maintenance and replacement of the light source can be facilitated. As shown, the photo sensor circuit includes a photo diode 151 which is connected between the supply voltage $V_{DD}$ and the earth terminal. This photo diode 151 can be easily formed such that a PN junction is formed by doping a single crystal silicon thin film of one conduction type with an impurity of the inverse conduction type. The photo diode has its one end connected with a current/voltage conversion resistor 152. This resistor 152 can be easily formed by doping the silicon single crystal thin film with an impurity. The resistor 152 has its one end connected with the positive input terminal of a differential amplifier 153. The negative input terminal of this differential amplifier 153 connected with the output terminal of the differential amplifier 153. As a result, this differential amplifier 153 forms a buffer. The present photo sensor circuit further includes another differential amplifier 154. This differential amplifier 154 has its positive input terminal connected with the output terminal of the buffer 153 through the diffusion resistor 155 and its negative input terminal fed with a reference voltage $V_{ref}$. The differential amplifier 154 compares the detected voltage, which is detected by the photo diode 151 and has a level proportional to the intensity of the incident light, with the reference voltage to output a warning signal when the detected voltage is lower than the reference voltage. This is because the light source of the light valve device requires inspection, maintenance or replacement when the intensity of the incident light drops below a certain value. All the components of the photo sensor circuit shown in FIG. 25 can be integrated over the silicon single crystal thin film.

[Seventeenth Embodiment]

Next, a temperature sensor circuit exemplifying the peripheral circuit contained in the additional circuit will be described with reference to FIG. 26. This temperature sensor circuit contacts in face-to-face relation with an electrooptical material such as a liquid crystal to monitor the temperature change of the same in case the semiconductor substrate device is packaged in a light valve. If an operating range is exceeded due to an overheating of the liquid crystal, the temperature sensor circuit issues a warning signal to maintain the normal operation of the light valve. In the present embodiment, the temperature sensor circuit is composed of one NPN transistor 161 and a constant current circuit 162, which are connected in series between the power supply $V_{DD}$ and the earth $V_{SS}$. As is well known in the art, the base-emitter voltage $V_f$ of the NPN transistor has a voltage dependency. As a result, the output voltage Vf depending upon the temperature is established at one end of the constant current source 162 by feeding a constant current If between the base and the emitter by the constant current source 162. If this output voltage Vf is compared with a predetermined reference voltage, it is possible to detect the overheating of the liquid crystal used in the light valve device. The NPN transistor 161 can be easily fabricated using the CMOS process. Moreover, the constant current circuit 162 can also be easily constructed by using a plurality of insulated gate field effect transistors.

[Eighteenth Embodiment]

FIG. 27 shows a temperature sensor circuit having temperature characteristics of higher sensitivity. What is different from that of FIG. 26 resides in that two NPN transistors are in the Darlington connection. This temperature sensor circuit can also be packaged in the CMOSIC to provide a temperature sensor circuit having a sensitivity substantially equal to that of the thermistor in the operation at 1.5 V, for example. This temperature sensor circuit can provide the temperature sensitivity of $-6$ mV/°C. for a temperature range of $-10°$ C. to $+60°$ C. and is suited for mass-production because of its excellent linearity and little dispersion. If the NPN transistors 161 and 163 are so connected in plurality as to add the base-emitter voltages, as shown, the Darlington connection is necessarily achieved because the collectors are commonly connected. The sensor output voltage Vf is achieved if the constant current IF is fed to the Darlington connection through the constant current source 162.

[Nineteenth Embodiment]

FIG. 28 is a schematic diagram showing the sectional structure of a semiconductor integrated circuit substrate device formed with the NPN transistor as the temperature sensor element. As shown, the electrically insulating quartz substrate 71 has its surface formed thereover with the single crystal silicon thin film 72, thus constructing the aforementioned composite substrate. This composite substrate is formed at its lefthand half with the NPN transistor and at its righthand half with an N-type MOS transistor. As is apparent from FIG. 28, these NPN transistor and N-type MOS transistor can be simultaneously formed. The NPN transistor is used as the temperature sensor element, and the N-type MOS transistor is used as an element for forming part of the constant current circuit, for example. The $N^-$-type single crystal silicon thin film layer 72 is formed with a $P^-$-type base diffusion layer. This base diffusion layer is formed therein with an $N^+$-type emitter region. The $P^-$-type base diffusion layer can be diffused simultaneously with the P-well of the N-type MOS transistor in the CMOS process, and the $N^+$-type emitter region can be formed simultaneously with the $N^+$-type source region and the drain region.

[Twentieth Embodiment]

With reference to FIG. 29, there is shown a planar type light valve substrate semiconductor integrated circuit device which is packaged with a solar cell as the peripheral circuit. As shown, the substrate 71 is divided into two regions. The region, as enclosed by dotted lines, is a pixel array region which is integrated with a pixel electrode group and a switch element group. The region other than that enclosed by the dotted lines is a peripheral circuit region which is formed with the X-driver circuit 15 and the Y-driver circuit 16. At the same time, a solar cell 191 is formed along the peripheral end portion of the peripheral circuit region. This solar cell 191 converts an incident light irradiating the light valve device into an electric energy to supply a drive power to the pixel array, the X-driver circuit 15 and the Y-driver circuit 16. Incidentally, like the foregoing various embodiments, the peripheral circuit region is coated with a silicon single crystal thin film of high quality. This silicon single crystal thin film is achieved by adhering a silicon wafer to the surface of the substrate and then polishing it. The solar cell 191 is a semiconductor element for converting the optical energy of the incident light into the electric energy by making use of a PN junction. At present, a solar cell having the highest conversion efficiency is obtained by using single crystal silicon. As a result, it is remarkably effective to form the solar cell element in the peripheral portion of the semiconductor integrated circuit substrate device.

[Twenty First Embodiment]

FIG. 30 schematically shows the sectional structure of such a solar cell. The single crystal silicon thin film 72 adhered to the surface of the substrate 71 is subjected in advance to a diffusion treatment with an N-type impurity and has a resistivity of 0.1 to 1 Ω cm. A P-type impurity such as boron is diffused into that surface portion to form a P-type layer 202.

As a result, there is achieved a PN junction having a photo voltaic energy. Moreover, the surface of the substrate 71 is passivated with a anti-reflection film 203 made of silicon monoxide. This anti-reflection film can be formed by the vacuum evaporation process. Subsequently, the anti-reflection film 203 is partially formed with a contact hole, and a negative terminal 204 made of a metal is connected with the N-type silicon single crystal thin film 72. Moreover, the anti-reflection film 203 has a contact hole formed in another portion, and a positive terminal 205 made of a metal is connected with the P-type diffusion layer 202.

These electrode terminals 204 and 205 are used as power supply terminals for the peripheral circuit.

[Twenty Second Embodiment]

FIG. 31 is a schematic top plan view showing an example of the pattern of external connection terminals extracted from the X-driver circuit 15 and the Y-driver circuit 16. As shown, a group of external connecting terminal wiring lines 211 are formed in a concentrated manner in one peripheral portion of the surface of the substrate 71. As a result, the electric connection with the external circuits can be remarkably facilitated. Simultaneously as the substrate 71 and the not-shown opposed substrate are subjected to the heat sealing process to fabricate a light valve device, for example, the electrically connecting process for the external connecting terminal wiring lines 211 can be accomplished. Since, at this time, a heating member for the heat sealing process makes no direct abutment against the X-driver circuit 15 and the Y-driver circuit 16. As a result, it is possible to eliminate a fear that the circuit elements formed over the semiconductor integrated circuit substrate device are thermally broken while the light valve device is being assembled.

[Twenty Third Embodiment]

Figure 32:
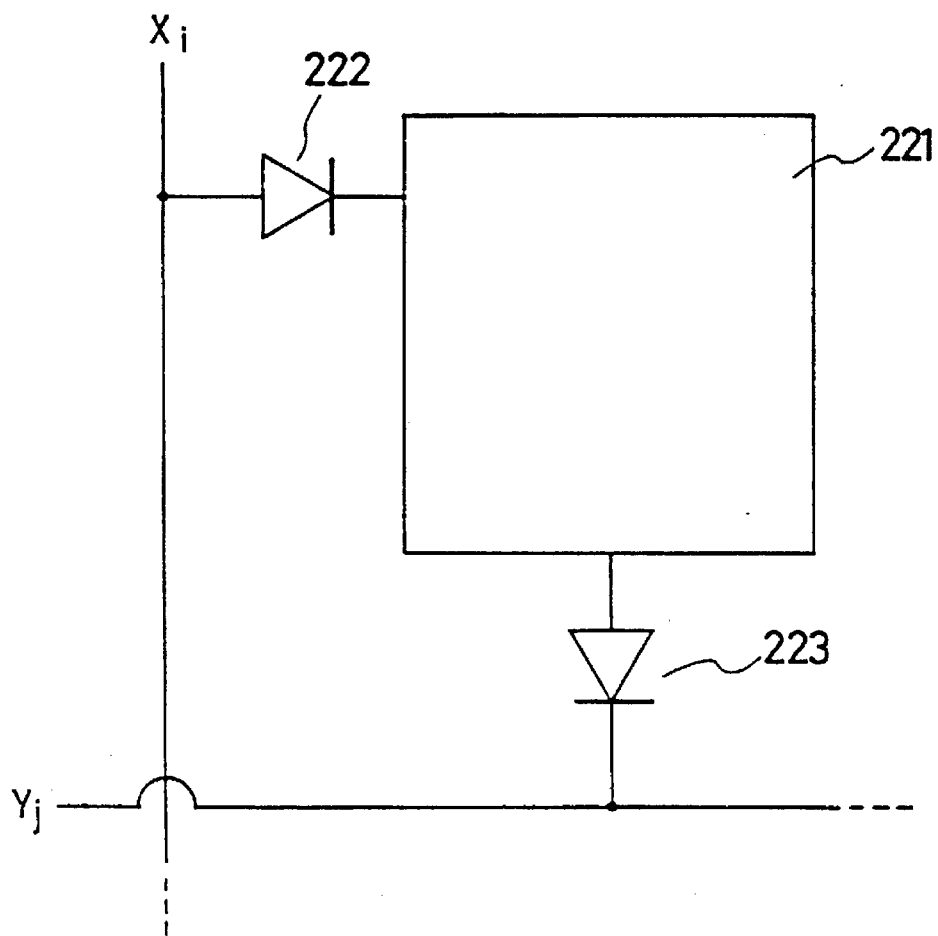
FIG. 32 is a schematic diagram showing an example of a switch element group formed in a pixel array region of the light valve substrate semiconductor device.
Figure 33:
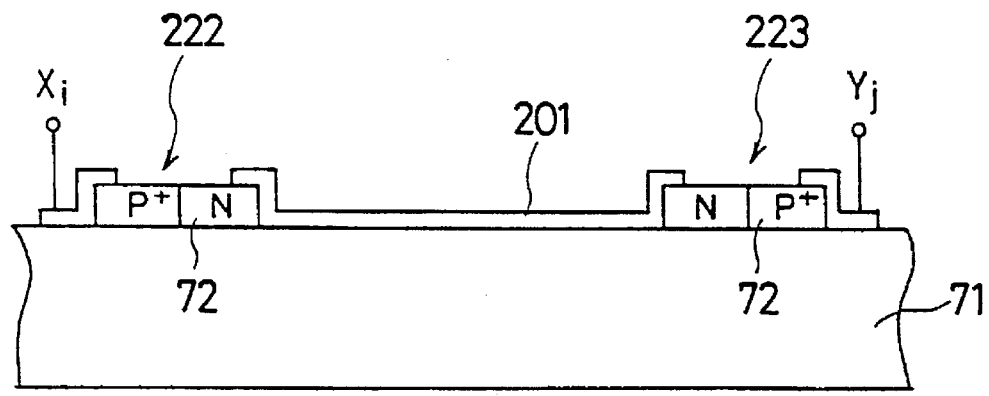
FIG. 33 is a schematic view showing the sectional structure of a switch element shown in FIG. 32.

Finally, with reference to FIGS. 32 and 33, there is shown an example of a switch element for energizing the pixel electrodes selectively.

FIG. 32 is a schematic top plan view showing a portion of one pixel electrode and one switch element, which exist at the node of a certain signal line Xi and a certain scanning line Yj. As shown, one diode 222 is connected between one side of a pixel electrode 221 and the corresponding signal line Xi. Moreover, another diode 223 is connected between another side of the pixel electrode 221 and the corresponding scanning line Yj.

These paired diodes 222 and 223 constitute a switch element for energizing the pixel electrode 221 selectively. In the foregoing embodiments, the switch element is exemplified by the insulated gate field effect type transistor. The diodes have a smaller element area than that of the transistor so that an aperture factor per pixel can be enlarged. Specifically, the areal ratio to be occupied for one pixel by the transparent pixel electrode 221 can be so enlarged as to provide a transparent light valve device which is excellent in the image display performance. By feeding the image signal to the signal line Xi in synchronism with the selection signal applied to the scanning line Yj, as shown, the electric charges can be fed to and stored in the pixel electrode 221 through the paired diodes 222 and 223. FIG. 33 shows the sectional structure of one pixel portion shown in FIG. 32. In the present embodiment, the silicon single crystal thin film 72 adhered to the surface of the substrate 71 is used as it is to form the diodes 222 and 223. However, a silicon poly-crystal thin film or an amorphous thin film may be formed, after the silicon single crystal thin film has been removed from the pixel array region, to form the diodes in that thin film. In the present embodiment, the silicon single crystal thin film 72 is selectively etched to form a pair of island element regions. These individual island element regions are doped with impurities of different conduction types to form a PN junction composed of $P^+$-type region and an N-type region thereby to provide the diodes. Moreover, the pixel electrode 221 made of a transparent material is formed by the vacuum evaporation process or the like between the paired diodes 222 and 223. As is apparent from FIG. 33, the size of the island element regions for forming the diodes can be remarkably small to increase the aperture factor of each pixel accordingly. In case the insulated gate field effect type thin film transistor is used, the aperture factor is 50% to 60%. In case the paired diodes are used, on the contrary, the aperture factor can be improved to about 80%.

According to the present invention, as has been described hereinbefore, the light valve device substrate has its surface divided into the pixel array region and the peripheral circuit region adjacent to the former. And, at least the peripheral circuit region is coated with the semiconductor single crystal thin film of high quality, which is adhered to the substrate. The pixel array region is formed with the pixel electrode group and the switch element group, and the peripheral circuit region can have its semiconductor single crystal thin film integrated with the circuit element group constituting the peripheral circuit having the various functions. Specifically, the transistor made of single crystal silicon can be so formed in the chip as to have a threshold voltage within a dispersion of about 100 mV or less so that the peripheral circuit of high precision can be easily formed. To the semiconductor single crystal thin film, there can be easily added by the integrated circuit technology the peripheral circuits which have so various functions as those of the super-LSI, because the thin film is made of the single crystal. As a result, there can be an effect that it is possible to provide a light valve semiconductor integrated circuit substrate of high speed, small size and multiple functions. The peripheral circuit can be freely exemplified by the X-driver circuit and Y-driver circuit for driving the switch element group, a DRAM sense amplifier, a photo detect circuit, a temperature detect circuit or a solar cell.

[Twenty Fourth Embodiment]

Figure 34:
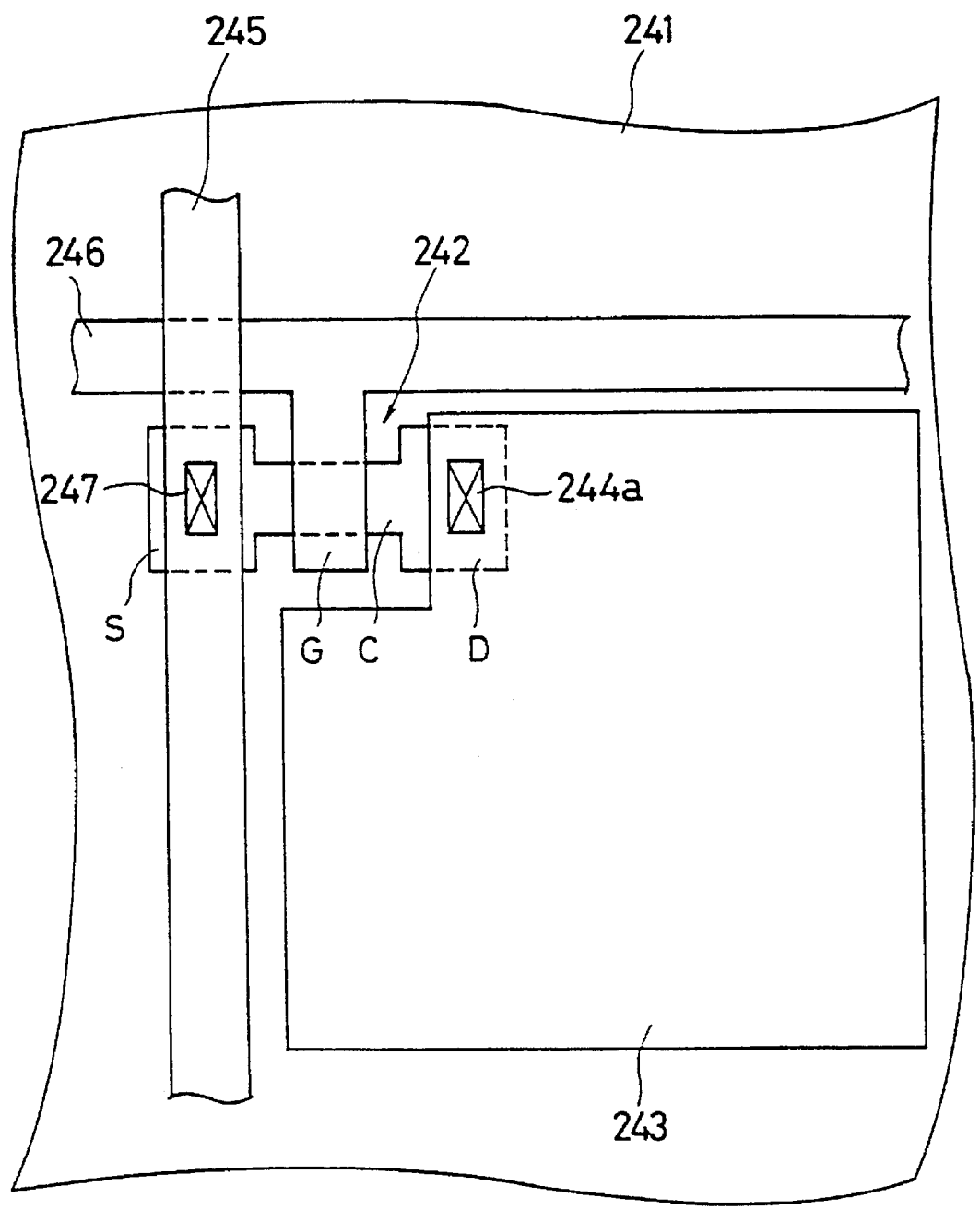
FIG. 34 is a top plan view showing an enlarged section of one pixel portion of the light valve substrate semiconductor device.

Next, another preferred embodiment of the present invention will be described in detail in the following. FIG. 34 is a schematic top plan view showing one pixel portion of the light valve substrate semiconductor device in an enlarged scale. The electrically insulating substrate has its surface coated with a semiconductor single crystal thin film such as a silicon single crystal thin film 241. The silicon single crystal thin film 241 is formed over its surface with a MOSFET 242 having a structure of high breakdown voltage. This MOSFET 242 is formed with a source region S and a drain region D. A channel region C is formed between the two regions S and D. A gate electrode G is overlapped on the channel region C through a gate insulating film. Moreover, the substrate is formed over its surface with a pixel electrode 243 for defining a pixel. This pixel electrode 243 and the drain region D of the MOSFET 242 of high breakdown voltage are electrically connected with each other through a contact hole 244a. On the other hand, the substrate surface is formed with a signal line 245, which is electrically connected with the source region S of the high breakdown voltage MOSFET 242 through a contact hole 244b. Moreover, a scanning line 246 is formed and is partially extended to constitute the gate electrode G.

[Twenty Fifth Embodiment]

Figure 35:
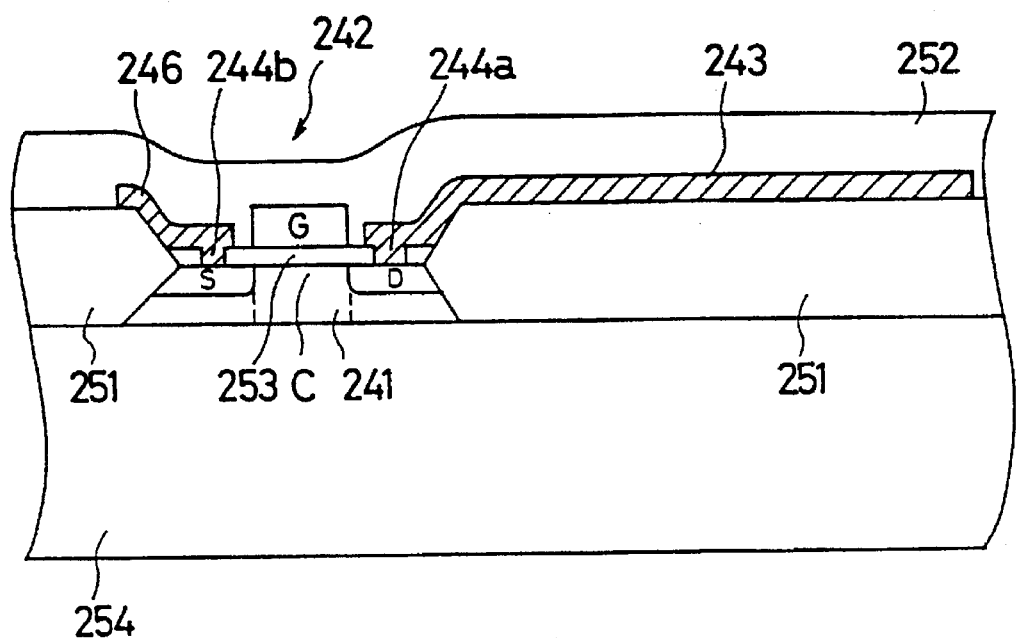
FIG. 35 is a schematic section showing a portion of a light valve substrate semiconductor device, in which switch element transistors having an anti-backchannel type breakdown voltage structure are integrated.

With reference to FIGS. 35 to 38, a specific example of the structure of the high breakdown voltage MOSFET 242 will be described in detail in the following. FIG. 35 exemplifies an anti-backchannel type high breakdown voltage MOSFET 242. A transparent, electrically insulating substrate such as a quartz substrate 254 has its surface coated with the silicon single crystal thin film 241. This silicon single crystal thin film 241 is selectively thermally oxidized to form a field oxide film 251 enclosing the element region. Since this silicon single crystal thin film 241 is completely thermally oxidized, the element separating region 251 is made of substantially transparent silicon dioxide. The silicon single crystal thin film 241 left in the element region has its surface portion formed with a source region S and a drain region D, which are made of a shallow impurity-diffused layer. The impurity diffusion depth of those two regions does not reach the interface between the substrate 254 and the silicon single crystal thin film 241 so that the two regions S and D are spaced from that interface. Over a channel region C formed between the two regions, there is formed a gate electrode G through a gate insulating film 253. Over the surface of the field oxide film 251, moreover, there is formed the transparent pixel electrode 243 which is made of ITO or the like. This pixel electrode 243 has its one end connecting the drain region D electrically through the contact hole 244a. There is further formed the scanning line 246, which is electrically connected with the source region S through the contact hole 244b. Finally, the quartz substrate 254 is coated in its entirety with a transparent passivation film 252. In this embodiment, the pixel thus formed can be transparent because the laminated passivation film 252, pixel electrode 243, field oxide film 251 and quartz substrate 254 are transparent.

Incidentally, in the light valve substrate semiconductor device of the prior art, the MOSFETs are formed in either the silicon amorphous thin film deposited by the vacuum evaporation or sputtering process or the silicon polycrystal thin film deposited by the chemical vapor deposition process. These thin films are so thin that the source and drain regions made of the impurity-diffused layer extend as far as the interface between the substrate and the thin film, as indicated by dotted lines. As a result, the so-called "backchannel" is formed in that interface to raise a problem in the inferior breakdown voltage. In the present embodiment, on the contrary, the polished silicon single crystal thin film 241 is laminated on the quartz substrate 254 so that its thickness can be freely set. As a result, the source region and the drain region thus formed can be given a small junction depth by diffusing the impurity exclusively into the surface portion of the silicon single crystal thin film 241 having a desired thickness.

[Twenty Sixth Embodiment]

Figure 36:
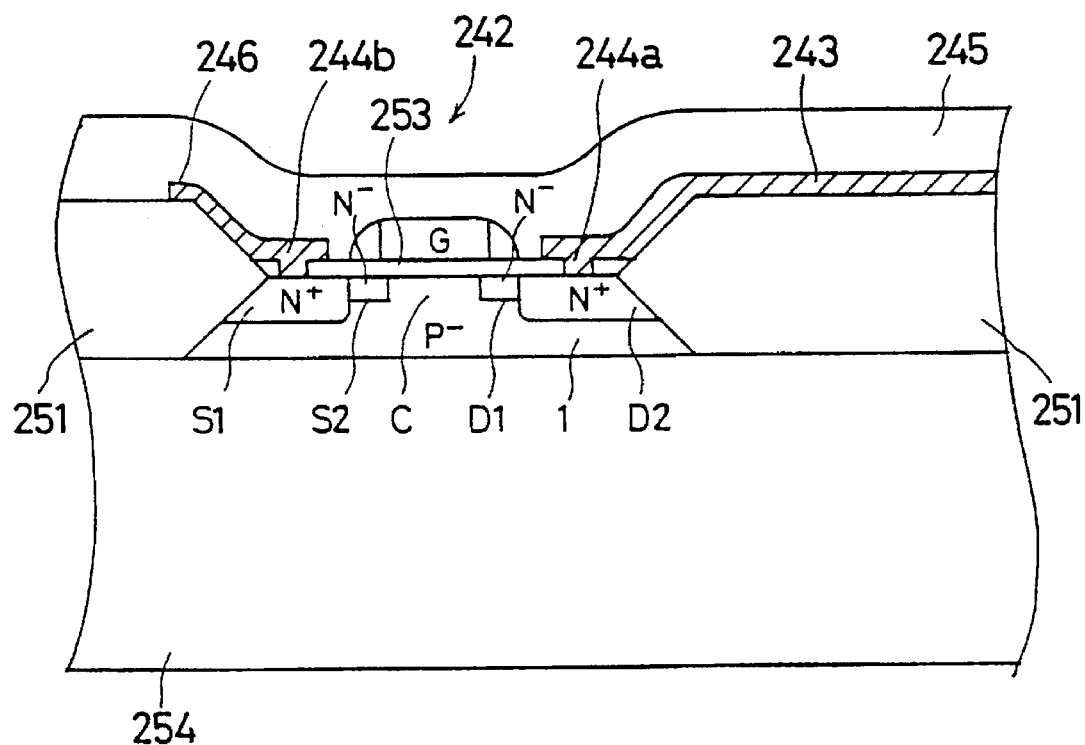
FIG. 36 is a schematic section showing a light valve substrate semiconductor device, in which switch element transistors having an LDD type breakdown voltage structure are integrated.

In the embodiment shown in FIG. 36, there is used a high breakdown voltage MOSFET which has the so-called "LDD structure". As shown, the substrate 254 has its surface coated with the P⁻-type silicon single crystal thin film 241. Here, the P⁻-type means that the impurity concentration is relatively low. This silicon single crystal thin film 241 is selectively oxidized to form the field oxide film 251 around the element region. In this element region, the high breakdown voltage MOSFET 242 is formed by using the LSI fabrication technology. This MOSFET 242 has the LDD structure, in which the channel region C is arranged at its two ends with an N⁻-type source region S1 of lower impurity concentration and an N⁻-type drain region D1 of lower impurity concentration. An N⁺-type source region S2 of higher impurity concentration is formed in contact with the source region S1.

In contact with the drain region D1, on the other hand, there is formed an N⁺-type drain region D2 of higher impurity concentration. Thus, the MOSFET 242 is constructed of the N-type LDD structure. In the LDD structure, the source region S1 and the drain region D1 of lower impurity concentrations are formed at the two ends of the channel region C. As a result, the hot carriers can be effectively prevented to effectively suppress the punch-through phenomena and the short-channel effect, which might otherwise cause the inferior insulations. As a result, the breakdown voltage of the MOSFET 242 can be remarkably improved. Incidentally, the components left untouched in the description of FIG. 35 are designated at the reference numerals identical to those of FIG. 34 and are not especially described.

[Twenty Seventh Embodiment]

Figure 37:
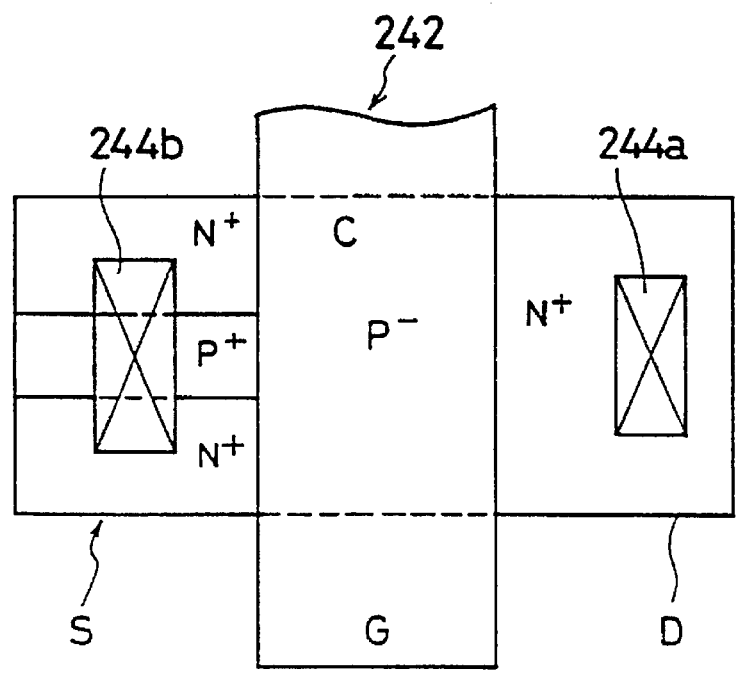
FIG. 37 is an enlarged top plan view showing a switch element transistor having a breakdown voltage structure formed with butting contacts.
Figure 38:
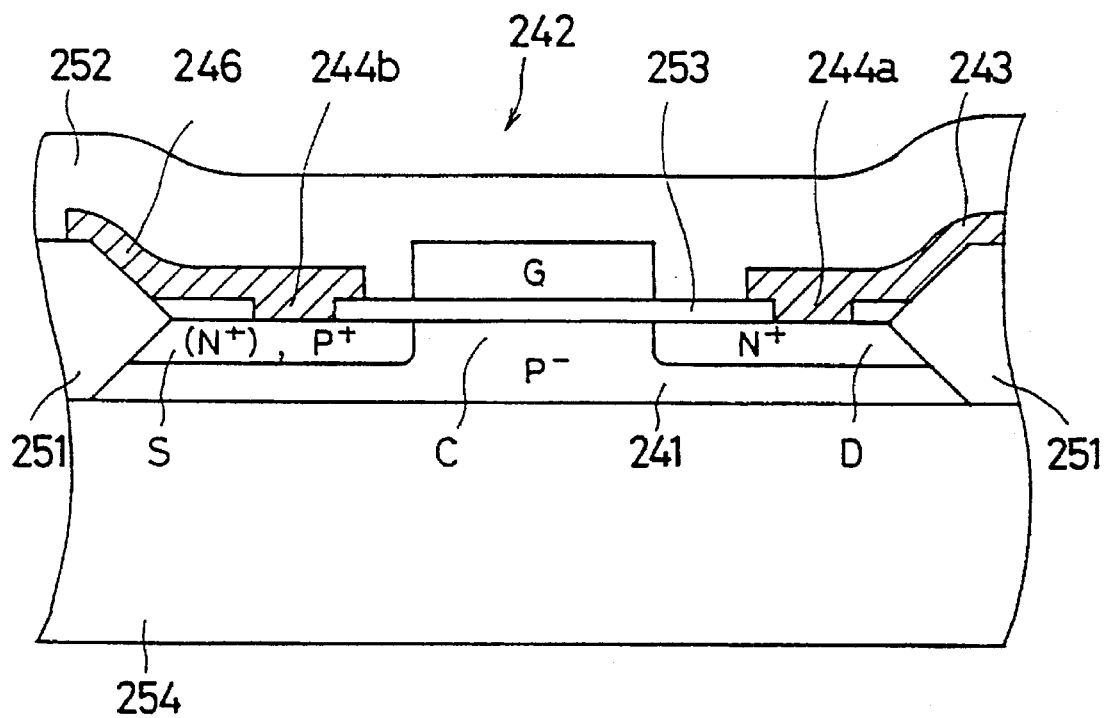
FIG. 38 is a schematic section showing a portion of the light valve substrate semiconductor device, in which switch element transistors having a breakdown voltage structure formed with the butting contacts are integrated.

FIGS. 37 and 38 show an example of a high breakdown voltage MOSFET having the so-called "butting contact structure". FIG. 37 is a top plan view showing the high breakdown voltage MOSFET 242. As shown, the element region is formed at its lefthand with a source region S and at its righthand with a drain region D. In the central portion of the source region, there is arranged a gate electrode G through a gate insulating film. A channel region C just below the gate electrode is made of a P⁻-type impurity-diffused layer. On the other hand, the drain region D is made of an N⁺-type impurity-diffused layer. The source region S is also made of an N⁺-type impurity-diffused layer. In the present embodiment, however, inside of the source region S, the N⁺-type impurity-diffused layer is divided to the right and left by the P⁺-type impurity-diffused layer. Moreover, the contact hole 244b exposed in the source region S is arranged to expose both the N⁺-type impurity-diffused layer and the P⁺-type impurity-diffused layer to the outside. Through the contact hole 244b, the source region S is electrically connected with the not-shown scanning line 246. As a result, the N⁺-type impurity-diffused layer and the P⁺-type impurity-diffused layer are held at the same potential.

In the drain region D, on the other hand, there is opened the contact hole 244a, through which an electric connection is made with the not-shown pixel electrode.

FIG. 38 is a section showing the transistor of FIG. 37 and taken in the longitudinal direction of the channel region C. The same components as those of the transistor shown in FIG. 35 are designated at the common reference numerals. As shown, the source region S includes not only the N⁺-type impurity-diffused layer but also the P⁺-type impurity-diffused layer. As a result, the P⁻-type silicon single crystal thin film 241 left in the element region and the P⁺-type impurity-diffused layer formed inside of the source region S are of the identical conduction type and are ohmically connected without forming the PN junction. As a result, the P⁻-type silicon single crystal thin film 241 is held at the same potential as that of the source region S. Thus, the hot carriers, which might otherwise be generated due to the potential fluctuations, can be eliminated to effectively suppress the punch-through phenomena and the short-channel effect, which might otherwise degrade the insulations.

Next, a process for fabricating the light valve substrate semiconductor device, in which the MOSFETs having the various high breakdown voltage structures shown in FIG. 37 are integrated.

[[Twenty Eighth Embodiment]]

With reference to FIGS. 39(A) to 39(F), a first description is directed to a process for fabricating the light valve substrate semiconductor device which contains the anti-backchannel type high breakdown voltage MOSFET transistor shown in FIG. 35. At a step shown in FIG. 39(A), a quartz substrate 291 and a single crystal silicon semiconductor substrate 292 are prepared. This single crystal silicon semiconductor substrate 292 to be preferably used is a silicon wafer of high quality used in the LSI fabrication and has a crystal azimuth of uniformity within a range of <100> 0.0±1.0 and a single crystal lattice defect density of 500/cm² or less. The surfaces of the quartz substrate 291 and the silicon wafer 292 thus prepared are at first precisely finished to smooth surfaces. Subsequently, the quartz substrate and the silicon wafer are thermo-compressively bonded to each other by superposing and heating the smooth-finished surfaces. As a result of this thermo-coimpressive bonding treatment, the quartz substrate 291 and the silicon wafer 292 are fixedly bonded to each other.

At a subsequent step shown in FIG. 39(B), the silicon wafer has its surface polished. As a result, the quartz substrate 291 is formed on its surface with a silicon single crystal thin film 293 which is polished to a desired thickness (e.g., several microns). In order to make the silicon wafer thin, the polishing treatment may be replaced by an etching treatment. Since the silicon single crystal thin film 293 thus obtained retains the quality of the silicon wafer substantially as it is, it is possible to provide a semiconductor substrate material which is remarkably excellent in the uniformity of the crystal azimuth and in the lattice defect density.

In the prior art, there are known a variety of semiconductor device substrates having a laminated structure composed of an electrically insulating carrier layer and a silicon single crystal thin film, as is called the "SOI substrate". This SOI substrate is fabricated by depositing a silicon polycrystal thin film on the surface of a carrier substrate made of an insulating material, for example, by a chemical vapor deposition process and subsequently by performing a heat treatment with irradiation of a laser beam or the like to re-crystallize the polycrystal thin film into a single crystal structure. Generally speaking, however, the single crystal thus obtained by re-crystallizing the polycrystal does not always have a uniform crystal azimuth but has a large lattice defect density. For these reasons, it is difficult to apply the LSI fabrication technology like that used to produce a single crystal silicon wafer of high quality to the SOI substrate fabricated by the process of the prior art.

At a subsequent step shown in FIG. 39(C), the silicon single crystal thin film 293 is thermally oxidized in a selective manner. This thermal oxidation is accomplished through a mask covering only the element region to be formed with the MOSFET, to form a field oxide film 294 in a manner to surround the element region. This field oxide film 294 is obtained by thermally oxidizing the silicon single crystal thin film 293 completely to the total thickness and is optically transparent to form an ideal element separation region.

At a subsequent step shown in FIG. 39(D), the surface of the silicon single crystal thin film 293 left only in the element region is subjected again to thermal oxidation. As a result, a remarkably thin gate insulating film 295 is formed on the surface of the silicon single crystal thin film. Moreover, the silicon polycrystal thin film is deposited on the substrate surface by using the chemical vapor deposition process, for example. This polycrystal thin film is etched through a mask having a desired pattern to form a gate electrode 296. Simultaneously with this, a scanning line contacting with the gate electrode 296 is also formed, although not shown.

At a step shown in FIG. 39(E), moreover, an impurity is introduced. For example, an ion implantation process is used to dope the silicon single crystal thin film 293 with an ionized impurity through the gate insulating film 295 by using the gate electrode 296 as a mask. At this time, the diffusion depth of the impurity layer can be restricted to the surface portion of the silicon single crystal thin film 293 by adjusting the acceleration energy of the impurity ions suitably and by controlling the implantation time period. As a result, there are formed a source region 297 and a drain region 298 having a relatively small junction depth, as shown. The silicon single crystal thin film 293 has its lower layer portion left unimplanted with the ions so that the source region 297 and the drain region 298 do not extent to the interface between the substrate 291 and the silicon single crystal thin film 293. As a result, it is possible to effectively prevent the backchannel which might otherwise cause inferior insulation.

At a final step shown in FIG. 39(F), a pixel electrode 299 is laminated on the surface of the field oxide film 294. The pixel electrode 299 has its one end electrically connected with the drain region 298 through a contact hole 300a formed in a portion of the gate insulating film 295. There is also formed a signal line 301, which is electrically connected with the source region 297 through a contact hole 300b. Finally, the substrate has its surface coated in its entirety with a transparent passivation film 302 made of PSG or the like.

[Twenty Ninth Embodiment]

FIGS. 40(A) to 40(E) show another embodiment of the process for fabricating the light valve substrate semiconductor device, in which the anti-backchannel type MOSFET transistors are integrated. In this embodiment, the ion implantation process used in the foregoing embodiments is replaced by an impurity adsorption diffusion process. According to this process, a source region and a drain region made of a remarkably thin impurity-diffusion layer can be formed to promote better miniaturization. At a step shown in FIG. 40(A), there is prepared a semi-fabricated product which has an element region enclosed by the field oxide film 294. This semi-fabricated product is identical to that fabricated by the steps shown in FIGS. 39(A) to 39(D). Thus, the identical components are designated with common reference numerals. The element region is formed of the silicon single crystal thin film 293, which is overlaid by the gate electrode 296 through the gate Insulating film 295.

At a subsequent step shown in FIG. 40(B), the gate electrode 296 is used as a mask to remove the gate insulating film 295 thereby to expose the surface of the silicon single crystal thin film 293 to the outside. In this state, however, the silicon single crystal thin film 293 may possibly have its surface still coated with an natural oxide layer having a thickness of about 30 Å or less. In order to remove this natural oxide layer, the substrate is heated at a temperature of about 850° C. or more in an atmosphere having a degree of vacuum of $10^{-4}$ Pa or less. After stabilization of the atmosphere for several minutes, hydrogen gases of about $10^{-2}$ Pa are introduced. By the action of this hydrogen, the natural oxide film left on the surface of the silicon single crystal thin film is removed to clean the surface. As a result, the activated silicon atoms come out to the surface.

At a step shown in FIG. 40(C), an impurity adsorption layer 303 is formed over the surface of the silicon single crystal thin film 293 activated. This impurity adsorption layer acts to feed the activated surface with the gases containing an impurity component while keeping the substrate at a high temperature, for example. The adsorbed gases are thermally decomposed to deposit the impurity adsorption layer 303 on the activated surface. If a P-type impurity adsorption layer is to be formed, for example, diborane gases containing P-type impure boron are used. If an N-type impurity adsorption layer is to be formed, for example, arsine gases containing arsenic are used.

At a step shown in FIG. 40(D), a solid phase diffusion is accomplished by using the impurity diffusion layer 303 as a diffusion source to form the source region 297 and the drain region 298 in the surface portion of the silicon single crystal thin film 293. The diffusion depth and concentration of the impurity-diffused layer forming the source region 297 and the drain region 298 can be freely set by suitably adjusting either the thickness of the impurity adsorption layer 303 deposited as the diffusion source or the solid phase diffusion treating temperature. For example, the diffusion depth can be limited to several hundreds Å from the surface. The value of this diffusion depth can be so smaller than the numerical value obtained by the ion implantation to form extremely thin source region and drain region. As a result, the anti-backchannel structure can be easily realized to promote the miniaturization of the MOSFETs more in accordance with the ratio of reduction of the diffusion depth.

At a final step shown in FIG. 40(E), the pixel electrode 299 and the signal line 301 are formed by the patterning treatment. Since, in the present embodiment, the source region 297 and the drain region 298 have their surfaces uncoated with the gate insulating film 295, it is possible to establish a direct electric conduction by the face-to-face contact. After these steps, the substrate is coated all over its surface with the transparent passivation film 302.

[Thirtieth Embodiment]

Next, with reference to FIGS. 41(A) to 41(E), here will be described in detail a process for fabricating a light valve substrate semiconductor device, in which the high breakdown voltage MOSFET transistors having the LDD structure are integrated. At a step shown in FIG. 41(A), the shown semi-fabricated product is prepared. This semi-fabricated product is obtained by a process similar to that composed of the aforementioned steps shown in FIGS. 39(A) to 39(D). In this semi-fabricated product, a substrate 311 has its surface formed with a field oxide film 312 enclosing the element region. This element region is made of a silicon single crystal thin film 313. This silicon single crystal thin film 313 is obtained by polishing a silicon wafer. The silicon single crystal thin film 313 is overlaid by a gate electrode 315 through a gate insulating film 314. Incidentally, the silicon single crystal thin film 313 used in the present embodiment is of the $P^+$-type.

At a step shown in FIG. 41(B), the ion implantation of an N-type impurity is accomplished. Specifically, the gate electrode 315 is used as a mask to implant an N-type impurity of relatively low acceleration energy through the gate insulating film 314 for a relatively short time period. As a result, the $P^-$-type silicon single crystal thin film 313 is formed over its surface with remarkably shallow $N^-$-type source region 316 and $N^-$-type drain region 317.

At a step shown in FIG. 41(C), for example, the chemical vapor deposition is used to deposit a silicon dioxide film all over the surface. The film thickness is preferably as equal as that of the gate electrode 315. Subsequently, anisotropic etching is performed to remove the deposited silicon dioxide film. Because of the anisotropic etching, a side wall 318 of etching residues is formed around the gate electrode 315. This side wall 318 is formed to cover the leading end portions of the $N^-$-type source region 316 and drain region 317 formed in advance.

At a step shown in FIG. 41(D), an ion implantation of an N-type impurity. This ion implantation is accomplished for a longer time period and with a higher acceleration energy than those of the previous ion implantation. The gate electrode 315 and the side wall 318 formed around the former are used as masks to effect the ion implantation through the gate insulating film 314 thereby to form an $N^+$-type source region 319 and an $N^+$-type drain region 320. As shown, the $N^-$-type source region 318 and the $N^-$-type drain region 317 are left just below the side wall 318 so that the so-called "LDD structure" is formed. This LDD structure can prevent generation of hot electrons to effectively suppress the punch-through phenomena and the short-channel effect, which might otherwise cause the inferior insulation, because the source region and drain region of lower impurity concentrations are present at the two ends of the channel region.

At a final step shown in FIG. 41(E), a pixel electrode 321 is formed. This pixel electrode 321 has its one end electrically connected with the drain region 320 through a contact hole opened in the gate insulating film 314. There is further formed a signal line 322, which is electrically connected with the source region 319 through another contact hole.

After these steps, the substrate is coated all over its surface with a passivation film 323.

[Thirty First Embodiment]

Figure 42A:
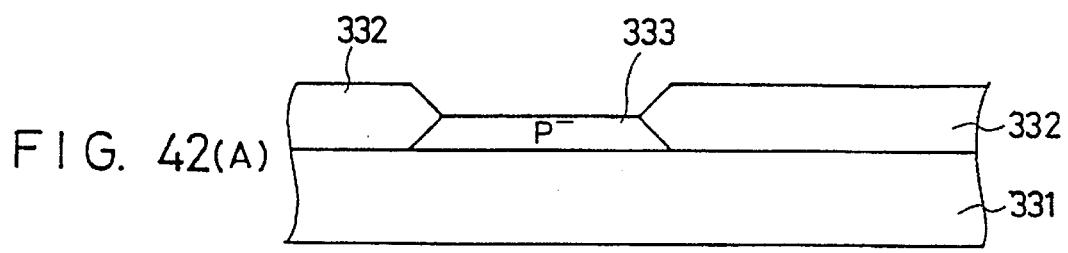
FIGS. 42(A) to 42(F) are process charts showing another process for fabricating a light valve substrate semiconductor device which is equipped with switch element transistors having the butting contacts.
Figure 42B:
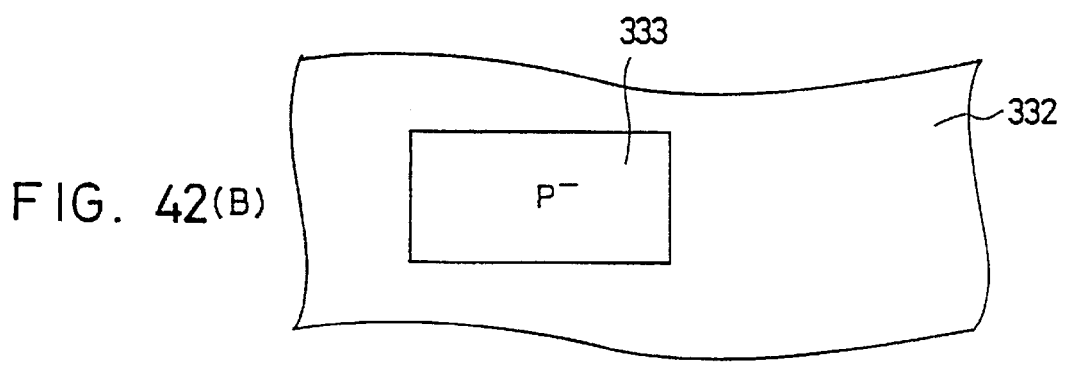

Finally, with reference to FIGS. 42(A) to 42(F), here will be described in detail a process for fabricating a light valve substrate semiconductor device, in which high breakdown voltage MOSFET transistors having the so-called "butting contact structure" are integrated. At first, a semi-fabricated product is prepared at a step shown in FIG. 42(A). This semi-fabricated product is prepared by a process having steps similar to those shown in FIGS. 39(A) to 39(C). Specifically, as shown, a substrate 331 is formed over its surface with an element region which is surrounded by a field oxide film 332. This element region is formed of a $P^-$-type silicon single crystal thin film 333. This single crystal thin film 333 is formed by the adhering and polishing processes. FIG. 42(B) is a top plan view showing the semi-fabricated produce shown in FIG. 42(A). There is opened the rectangular element region which is surrounded by the field oxide film 332.

Figure 42C:
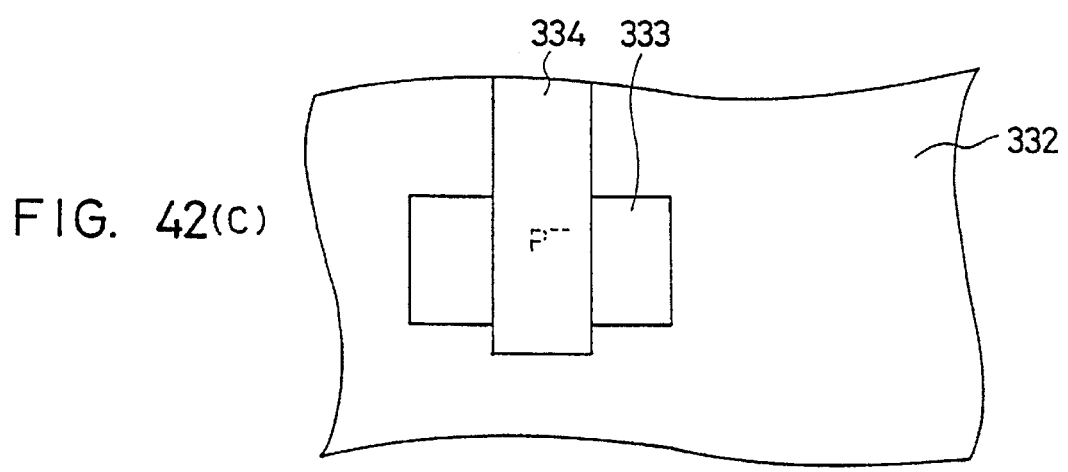

At a subsequent step shown in FIG. 42(C), a gate electrode 334 is formed in the widthwise direction at the central portion of the element region. Although not shown, a gate insulating film is interposed between the gate electrode 334 and the silicon single crystal thin film 333 exposed to the element region.

Figure 42D:
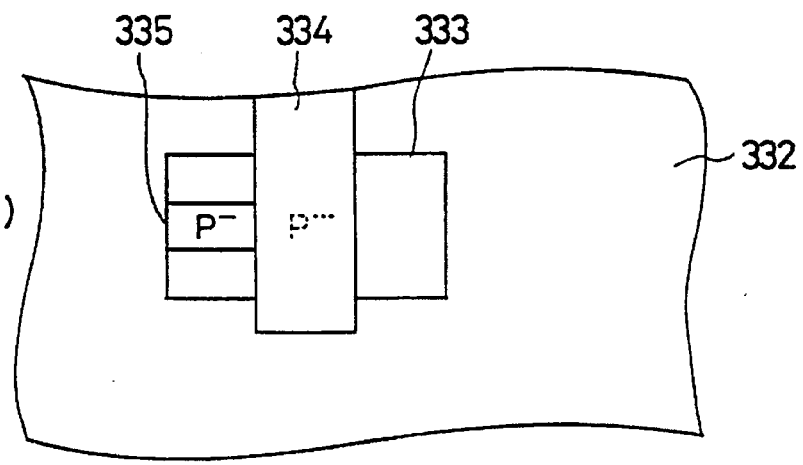

At a step shown in FIG. 42(D), a selective ion implantation is accomplished by using a P-type impurity. This ion implantation is selectively carried out only at the widthwise center portion at the lefthand side of the element region to form a $P^+$-type impurity-diffused layer 335. This $P^+$-type impurity-diffused layer 335 is in electric contact with the $P^-$-type silicon single crystal thin film in the element region. As a result, the $P^-$-type silicon single crystal thin film can have its potential fixed through the $P^+$-type impurity-diffused layer 335.

Figure 42E:
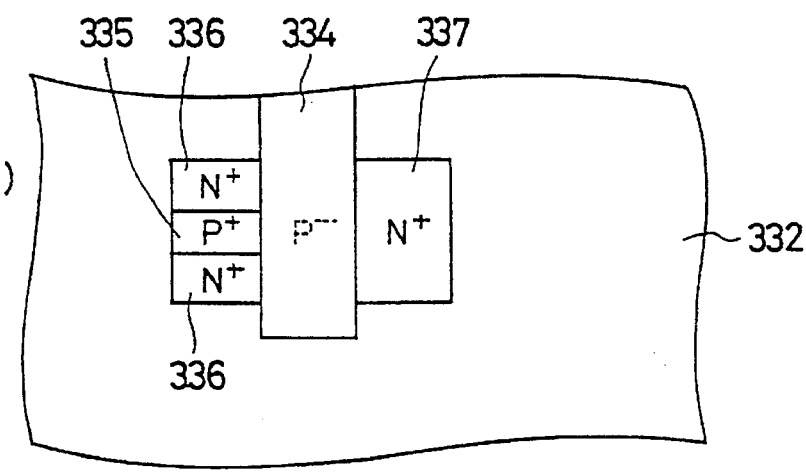

At a step shown in FIG. 42(E), a selective ion implantation is carried out by using an N-type impurity. This ion implantation is accomplished while avoiding the $P^+$-type impurity-diffused layer 335. As a result, an $N^+$-type impurity-diffused layer 336 is formed at the lefthand portion of the element region which is divided in the longitudinal direction by the gate electrode 334. This $N^+$-type impurity-diffused layer 336 forms a source region. An $N^+$-type impurity-diffused layer 337 is also formed at the righthand side of the element region. This diffusion layer 337 forms the drain region. The source region and the drain region have their surfaces coated with the gate insulating film, although not shown.

Figure 42F:
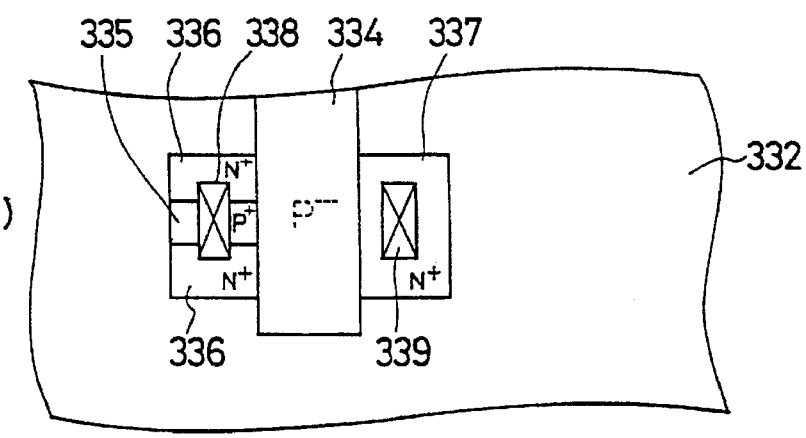

At a final step shown in FIG. 42(F), the gate insulating film existing on the surface of the source region is partially opened to form a contact hole 338. This contact hole 338 is formed to cross the $N^+$-type impurity-diffused layer 336 and the $P^+$-type impurity-diffused layer 335. Through this contact hole 338, the source region is electrically connected with the not-shown signal line, thus constituting the so-called "butting contact". In other words, the $P^-$-type silicon single crystal thin film can be held and fixed at the voltage level which is fed to the signal line through the $P^+$-type impurity-diffused layer 335. On the other hand, the gate insulating film existing over the surface the drain region is also opened to form a contact hole 339. Through this contact hole 339, the not-shown pixel electrode is electrically connected with the drain region. The section of the semiconductor device of FIG. 42(F) taken in the longitudinal direction of the element region is present in FIG. 38.

According to the present embodiments (in plurality), as has been described hereinbefore, the light valve substrate semiconductor device is fabricated by integrating the pixel electrode group and the switch element group by the LSI fabrication technology in the silicon single crystal thin film of high quality formed over the insulating substrate. As a result, there can be attained an effect that it is possible to provide a light valve substrate semiconductor device having a remarkably high pixel density. Another effect is that the chip size of the semiconductor device according to the present invention can be made as small as that of the ordinary LSI chip.

Since the silicon single crystal thin film is used, the LSI fabrication technology can be directly applied to establish another effect the miniaturization of the switch elements can be further promoted. Since, moreover, the switch elements are made of the insulated gate field effect transistors having the high breakdown voltage structure, there can be attained such an effect featuring the present invention that that a light valve substrate semiconductor device which is remarkably excellent in reliability and reluctant in dielectric breakdown. By the adoption of this high breakdown voltage structure, the miniaturization of the switch elements can be further promoted.

[Thirty Second Embodiment]

Figure 43:
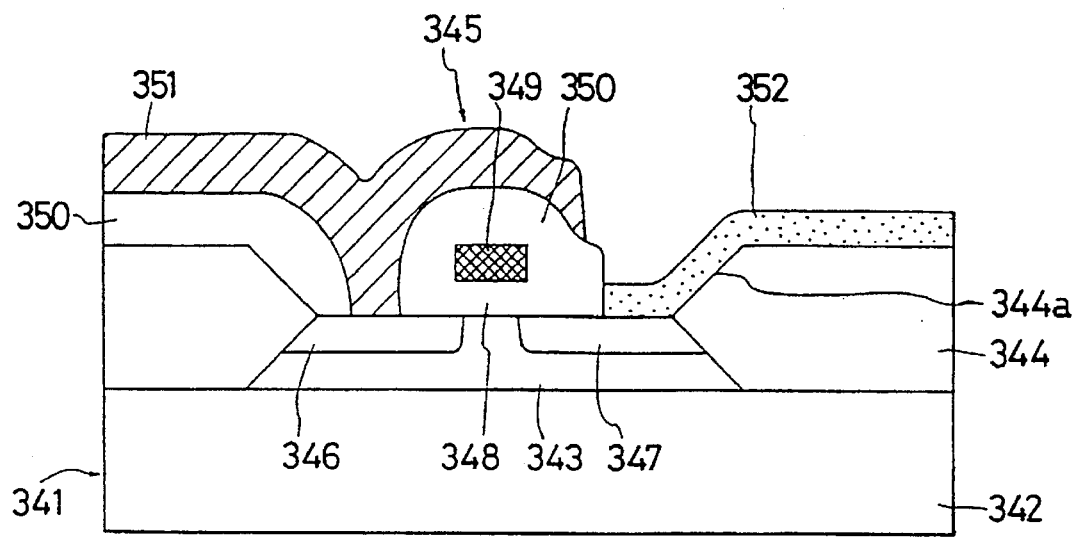
FIG. 43 is a schematic section showing a typical example of the light valve substrate single crystal thin film semiconductor device.

FIG. 43 is a schematic section showing another typical embodiment of the light valve substrate single crystal thin film semiconductor device according to the present invention. In order to facilitate the understanding of this aspect of the invention, only one pixel portion is shown. As shown, the present semiconductor device uses a composite substrate 341. This composite substrate 341 has a two-layered structure which is composed of an electrically insulating transparent carrier such as a quartz glass plate 342 and a semiconductor single crystal thin film such as a silicon single crystal thin film 343 formed over the quartz plate 342. The silicon single crystal thin film 342 is obtained by thermo-compressively bonding a silicon wafer of high quality to the quartz plate 342 and subsequently by polishing and thinning it. In this embodiment, the silicon single crystal thin film 343 has its portion selectively subjected to a thermal oxidation to form a field oxide film 344. This field oxide film 344 is transparent because the optically opaque silicon single crystal thin film 343 is converted throughout its thickness into optically transparent silicon dioxide. The portion surrounded by the field oxide film 344 is formed with an element region of the silicon single crystal thin film 343 left unconverted. In this element region, there is integrally formed a switch element 345 which is made of an insulated gate field effect transistor. This transistor switch element 345 is composed of: a source region 346 and a drain region 347 made of a pair of impurity-diffused regions formed over the surface portions of the silicon single crystal thin film 343; and a gate electrode 349 having a predetermined shape and laminated through a gate insulating film 348. There is further formed a wiring metal pattern 351. This metal pattern 351 is electrically connected with the source region 346 through a contact hole formed in an inter-layer insulating film 350 and is partially extended to cover the gate electrode 349 so that it also acts as a light shield film for an incident light.

Over the field oxide film, on the other hand, there is formed a pixel electrode 352 which is made of a semiconductor polycrystal thin film such as a silicon polycrystal thin film. The silicon polycrystal is intrinsically optically opaque but is able to transmit an incident light substantially therethrough by having its thickness extremely reduced. The silicon polycrystal thin film can be deposited, while having its thickness controlled, by the chemical vapor deposition process. Moreover, the silicon polycrystal can be patterned highly precisely by the photolithography and the anisotropic etching process to form the pixel electrode 352. Since the silicon polycrystal thin film has a sufficient heat resistance, it is freed from being degraded, while it is being subjected to the semiconductor process or the IC process.

As a result, the order of the process for forming the pixel electrode S52 is not restricted in the least but can set the process flow suitably efficiently.

In the present embodiment, the pixel electrode 352 is electrically connected with the drain region 347 of the switch element 345 through a bird's beak, i.e., the sloped end portion 344a of the field oxide film 344. According to this structure, it is possible to effectively prevent a defect such as the step cut which has been relatively frequently caused at the step portion in the prior art.

[Thirty Third Embodiment]

Figure 44:
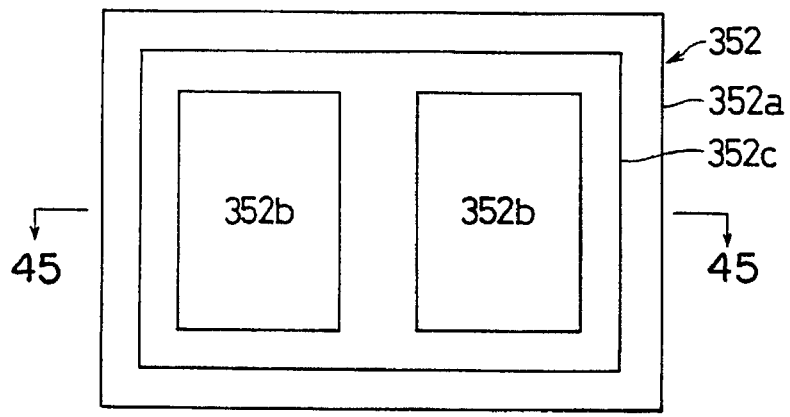
FIG. 44 is a schematic top plan view showing a modification of the structure of pixel electrodes contained in the light valve substrate single crystal thin film semiconductor device.

FIG. 44 is a schematic top plan view showing another embodiment of the structure of the pixel electrode. As shown, the pixel electrode 352 has a two-layered structure which is composed of: a silicon polycrystal thin film 352a having an aperture 352b patterned into a predetermined shape; and a transparent conductive thin film 352c such as an ITO thin film patterned into a predetermined shape to cover the aperture 352b. In this embodiment, the pixel electrode 352 has its outer periphery defined by the silicon polycrystal thin film 352a. The silicon polycrystal thin film 352a can be patterned highly precisely and finely by the photolithography and the anisotropic ion etching process. Since, however, the silicon polycrystal material is intrinsically optically opaque, it will absorb a portion of an incident light even if it is made thin. In order to solve this problem, the silicon polycrystal thin film 352a is formed therein with the aperture 382b for transmitting the incident light. This aperture is coated with the transparent ITO film 352c so that it may be an effective electrode face. This ITO film 352c may have its outer periphery patterned with such a precision as to cover the aperture 352b. By the two-layered structure of the pixel electrode 352, it is possible to achieve miniaturization and the high transparency at the same time. Since, moreover, the ITO film 352c may be formed after the end of the semiconductor process including the patterning of the silicon polycrystal thin film 352a, its formation will not affect the semiconductor process adversely.

Figure 45:
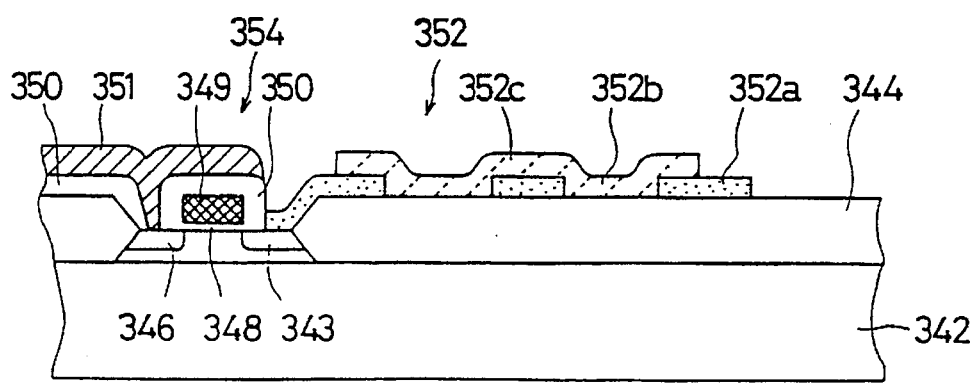
FIG. 45 is a schematic section showing the structure of a light valve substrate single crystal thin film semiconductor device using the pixel electrodes having the structure shown in FIG. 44.

FIG. 45 is a schematic section showing the structure of the light valve substrate single crystal thin film semiconductor device having the pixel electrode structure shown in FIG. 44. FIG. 45 is a section taken along line 45—45 of FIG. 44 and showing only one pixel portion so as to facilitate the understanding of this aspect of the invention. The components identical to those of the embodiment shown in FIG. 43 are designated with the common reference numerals, and their descriptions will be omitted. As is apparent from FIG. 45, the aperture 352b does not have the silicon polycrystal thin film 352a but is partially filled up with the ITO film 352c. As a result, it is possible to improve the average transparency of the pixel electrode 352 for the incident light.

[Thirty Fourth Embodiment]

Figure 46:
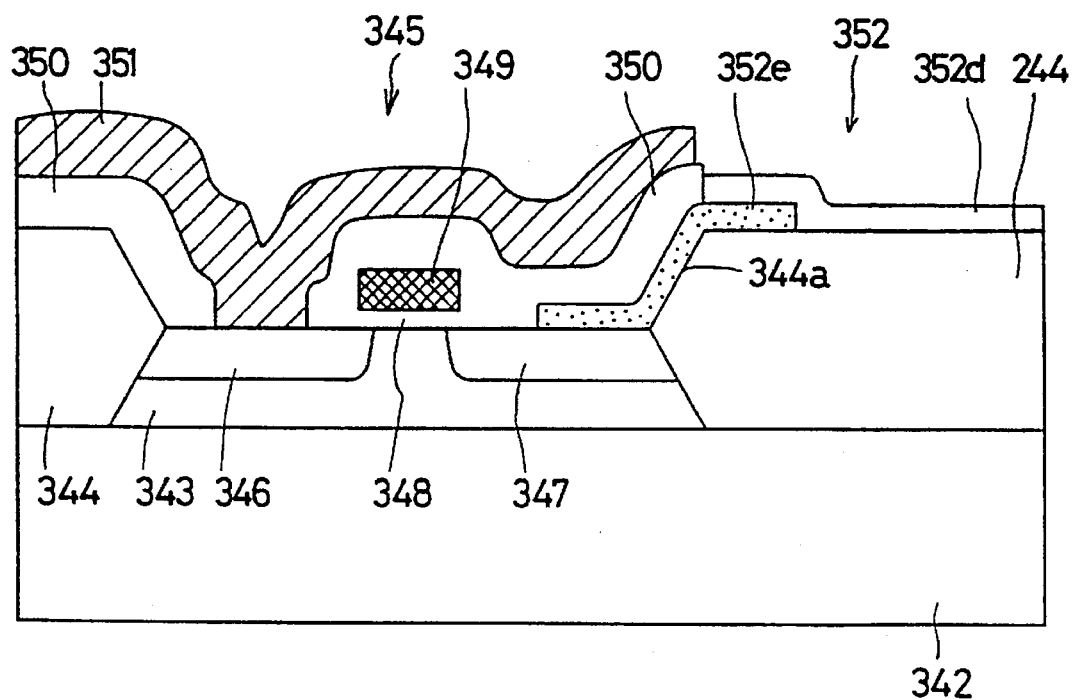
FIG. 46 is a schematic section showing another example of the light valve substrate single crystal thin film semiconductor device.

FIG. 46 is a schematic section showing still another embodiment of the light valve substrate single crystal thin film semiconductor device according to the present invention. In order to facilitate the understanding of this aspect of the invention, only one pixel portion is shown, and the description of the components identical to those of the embodiment shown in FIG. 43 will be omitted by designating the components at the common reference numerals. What is different from the embodiment shown in FIG. 43 resides in that the pixel electrode 352 is composed of: a transparent conductive thin film 352d such as an ITO thin film for defining the effective area of the pixel; and a silicon polycrystal thin film terminal 352e for connecting the transparent conductive thin film 352d and the drain region 347 of the corresponding switch element 345 electrically. The semiconductor device having such structure is constructed by forming the drain region 347, by subsequently forming the silicon polycrystal thin film terminal 352e patterned into the predetermined shape, and by depositing the metal pattern 351 of aluminum or the like thereon through the interlayer insulating film 350.

A series of steps thus far described are accomplished by the semiconductor process. The silicon polycrystal thin film terminal 352e is excellent in adhesiveness and is arranged along the sloped end portion 344a of the field oxide film 244 so that it is freed from any possibility of step cut. Moreover, the metal pattern 351 formed at the final step of the semiconductor process can cover the switch element 345 completely so that it can retain an ideal light shielding function.

At the stage of ending the semiconductor process completely, the ITO thin film 352d is formed over the field oxide film 344. Then, the ITO thin film 352d has its portion overlapped in the exposed portion of the silicon polycrystal thin film terminal 352e. Since the ITO thin film 352d is deposited on the substantially flat field oxide film 244, it can be freed from any fear of the step cut so that it can be sufficiently thinned. If the ITO thin film 352d has a thickness of 200 Å or less, for example, the pixel electrode can be patterned in a precision of micron order. Generally speaking, the etching process of the ITO thin film is of the wet type. The patterning precision is deteriorated more by the influences of the side etching as the ITO thin film becomes thicker.

If the pixel electrode is formed of the ITO thin film only as in the prior art, its heat resistance is so low that the metal pattern or the like cannot be formed in an overlapped manner by the semiconductor process. In the structure of the prior art, the facial contact portion between the ITO thin film and the drain region 347 cannot be covered with the light shielding film made of a metal pattern so that a complete light shielding effect cannot be attained.

[Thirty Fifth Embodiment]

Figure 47:
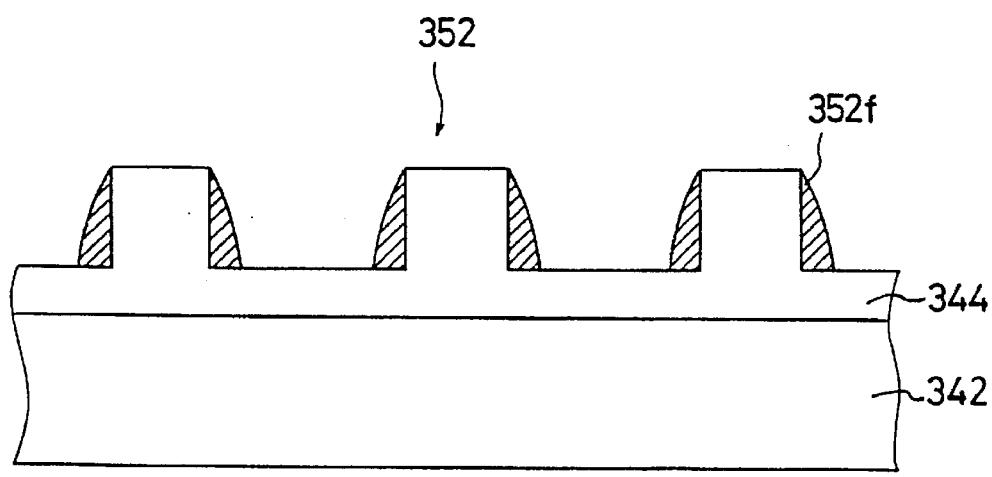
FIG. 47 is a schematic section showing a portion of another modification of the pixel electrodes used in the light valve substrate single crystal thin film semiconductor device.

FIG. 47 is a schematic section showing a further embodiment of the pixel electrode structure. For simplicity, only a portion of the pixel electrode is extracted and shown. As shown, the pixel electrode 352 is formed of a linear pattern 352f of the silicon polycrystal which is formed into a side wall shape.

This linear pattern 352f is formed on the sizes of the linear ridges which are obtained by anisotropically etching the field oxide film 344 formed over the quartz plate 342. This side wall structure is attained by depositing the silicon polycrystal thin film all over the corrugated surface of the field oxide film 344 and by anisotropically etching the whole surface with ions. Specifically, if the anisotropic ion etching is stopped at the state when the ridge surfaces of the field oxide film 344 are exposed, the etching residues are left on the side walls of the linear ridges to provide the side wall structure. Although not shown, the linear patterns of the silicon polycrystal are commonly connected with each other and electrically connected with the drain regions of the switch elements. With this structure, in the region of the pixel electrode 352, there are left many portions which are not covered with the optically opaque silicon polycrystal, so that the transparency of the whole pixel electrode is improved. Moreover, a remarkably miniature pixel electrode can be formed because the linear pattern 352f of the silicon polycrystal formed in the side wall shape can be made as small as 0.2 μm.

[Thirty Sixth Embodiment]

Next, with reference to FIGS. 48(A) to 48(F), here will be described in detail a process for fabricating the light valve substrate single crystal thin film semiconductor device shown in FIG. 43. At a first step shown in FIG. 48(A), there are prepared a quartz plate 361 and a single crystal silicon plate 362. The single crystal silicon plate 362 to be used may preferably be a silicon wafer of high quality used for the LSI fabrication and has a crystal azimuth of uniformity within a range of <100> 0.0±1.0and a single crystal lattice defect density of 500/cm$^2$ or less. At first, the quartz plate 361 and the single crystal silicon plate 362 have their respective surface and back precisely finished and smoothed. Subsequently, these two faces thus smoothly finished are heated so that the two substrates are thermo-compressively bonded. Thanks to this thermo-compressive bonding, the two substrates 361 and 362 are fixedly bonded.

Figure 48A:
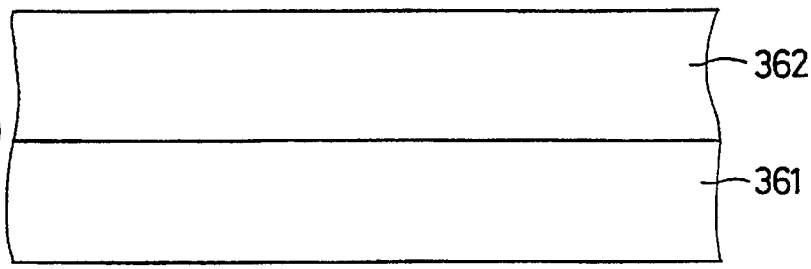
FIGS. 48(A) to 48(F) are process charts showing a process for fabricating the light valve substrate single crystal thin film semiconductor device shown in FIG. 43.
Figure 48B:
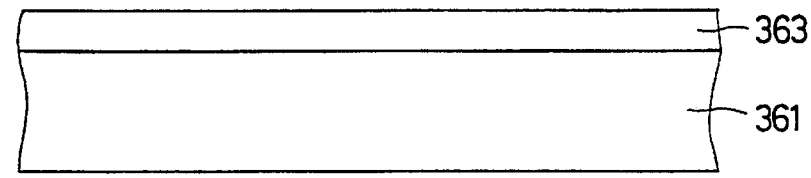

At a subsequent step shown in FIG. 48(B), the single crystal silicon plate or the silicon wafer has its surface polished. As a result, the quartz plate 361 has its surface formed with a silicon single crystal thin film 363 which has been polished to a desired thickness. Thus, there is obtained a composite substrate which has a two-layered structure composed of the quartz plate 361 and the silicon single crystal thin film 363. Incidentally, the silicon wafer 362 may be thinned by the etching treatment in place of the polishing treatment. Since the silicon single crystal thin film 363 thus obtained retains the quality of the silicon wafer 362 substantially as it is, it is possible to obtain a semiconductor device material which is remarkably excellent in the uniformity of the crystal azimuth and the lattice defect density.

Figure 48C:
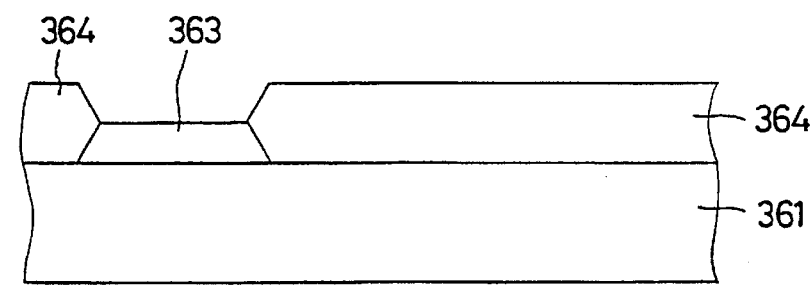

At a subsequent step shown in FIG. 48(C), the selective thermal oxidation of the silicon single crystal thin film 363 is accomplished to form a field oxide film 364. Since this selective thermal oxidation is effected throughout the thickness of the silicon single crystal thin film 363, the field oxide film 364 thus obtained is optically transparent. The silicon single crystal thin film 363 thus left in the portion surrounded by the field oxide film 364 forms the element region.

Figure 48D:
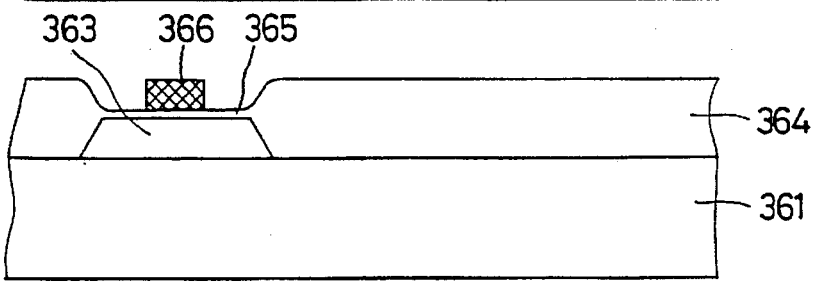

At a subsequent step shown in FIG. 48(D), the silicon single crystal thin film 363 existing in the element region has its surface thermally oxidized to form a remarkably thin and dense gate insulating film 365. Subsequently, a silicon polycrystal film is deposited all over the substrate by the chemical vapor deposition process or the like, and the photolithography and the etching process are then accomplished to form a gate electrode 363 having a predetermined shape.

Figure 48E:
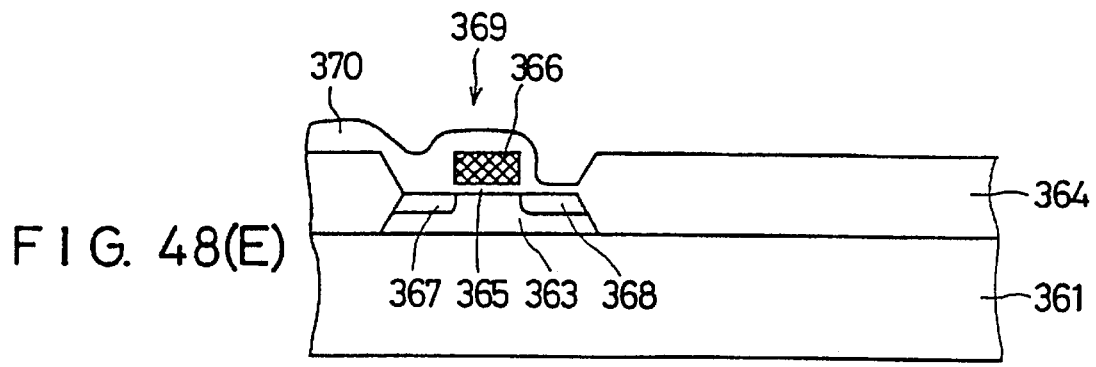

At a subsequent step shown in FIG. 48(E), an impurity such as arsenic is introduced to form a pair of impurity regions in the surface of the silicon single crystal thin film 363. For example, the gate electrode 366 is used as a mask through the gate insulating film 365 to introduce the impurity ions hereby to form a source region 367 and a drain region 368. As a result, a transistor channel forming region is formed between those two regions and below the gate electrode 366, and a switch element 369 made of an insulated gate field effect transistor is formed in the element region. After this, a silicon oxide film is deposited by the chemical vapor deposition process to form an inter-layer insulating film 370.

Figure 48F:
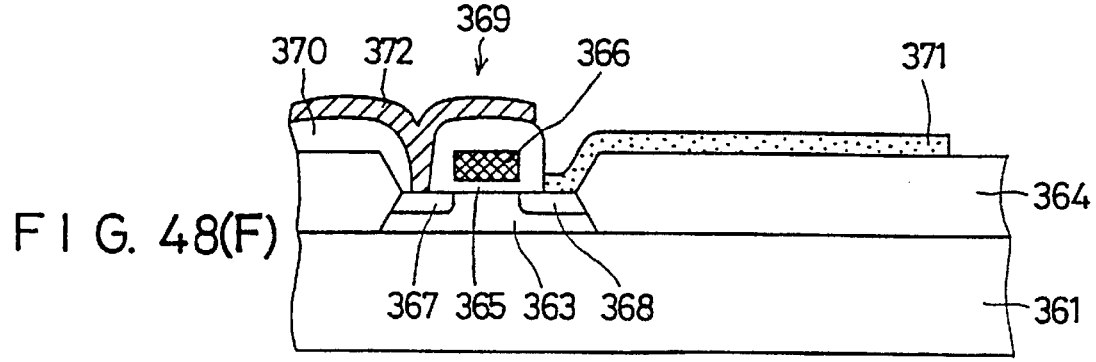

At a final step shown in FIG. 48(F), the gate insulating film 365 is removed from the upper face of the drain region 368 to expose a portion of the drain region 368 to the outside, and a contact hole is opened in the inter-layer insulating film 370 to expose a portion of the surface of the source region 367 to the outside. In this state, the silicon polycrystal film is deposited all over the surface by the chemical vapor deposition process. Subsequently, the deposited silicon polycrystal thin film is patterned by the photo-lithography and the etching process to form a pixel electrode 371 and a wiring pattern 372 simultaneously. Alternatively, the pixel electrode 371 may be made of the silicon polycrystal thin film, whereas the wiring pattern 372 may be formed by depositing another material such as aluminum by vacuum evaporation and subsequently patterning it.

As is apparent from the description thus far made, the light valve substrate single crystal thin film semiconductor device can be fabricated by the semiconductor process which is completely consistent to the final step. Especially, the switch elements are integrated in the silicon single crystal thin film, and the pixel electrodes are formed of the polycrystal silicon film, so that the miniature and highly precise switch element group and pixel electrode group can be simultaneously formed by making direct use of the LSI fabrication technology.

In case the silicon polycrystal thin film is used as the pixel electrode, its thickness has to be so reduced as to exhibit a substantially transparent state so that a transparent type light valve device may be constructed. On the other hand, the resistance of the pixel electrode has to be so minimized as to prevent any drop of the voltage applied. For this necessity, the silicon polycrystal film constituting the pixel electrode is doped in high concentration with an impurity. The process called "molecular layer doping" is effective for implanting the extremely thin silicon polycrystal thin film in the high concentration with the impurity.

[Thirty Seventh Embodiment]

Figure 49A:
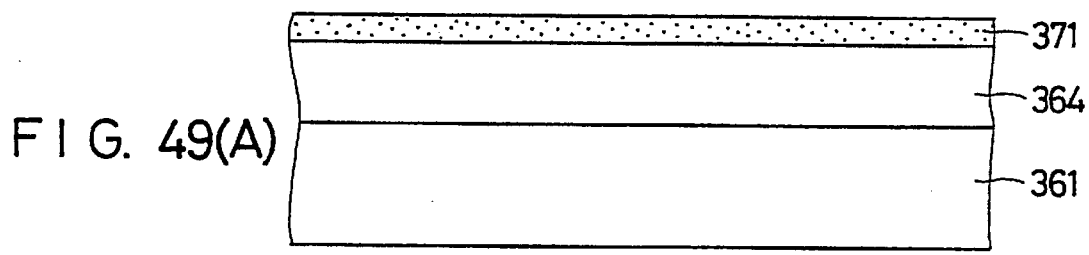
FIGS. 49(A) to 49(C) are process charts showing a process for diffusing an impurity into the pixel electrode made of a polycrystal silicon thin film.
Figure 49B:
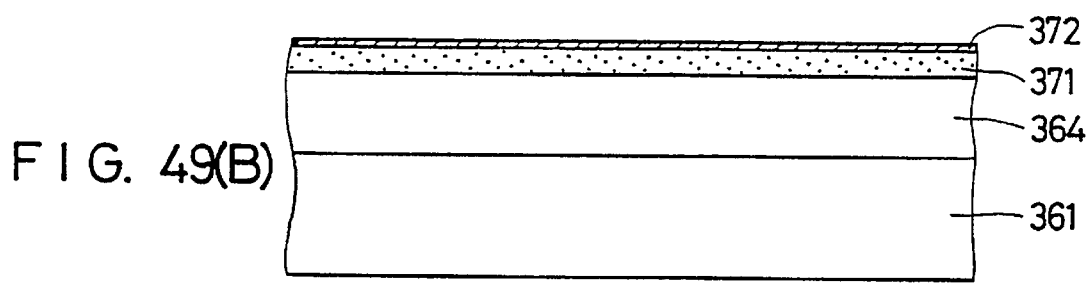
Figure 49C:
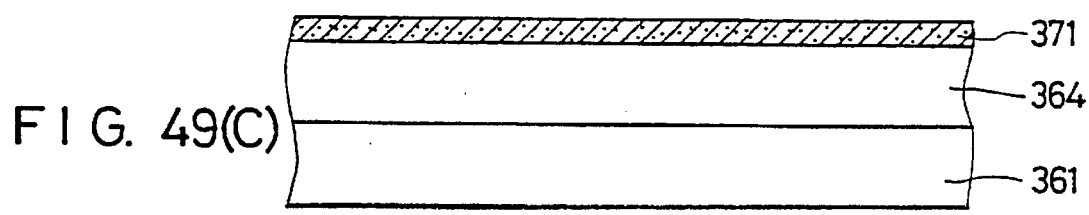

With reference to FIGS. 49(A) to 49(C), the molecular layer doping process will be briefly described in the following. At a first step shown in FIG. 49(A), there is prepared the semiconductor device shown in FIG. 48(F). FIG. 49(A) shows a portion of FIG. 48(F), namely, only the laminated structure of the pixel electrode 371 which is composed of the quartz plate 361, the field oxide film 364 and the silicon polycrystal thin film. This pixel electrode 371 is subjected to the aforementioned molecular layer doping treatment. For this molecular layer doping, the silicon polycrystal thin film constituting the pixel electrode 371 at first has its surface cleaned. The semiconductor device is set in the central portion of a vacuum chamber having a background pressure of 1×10$^{-4}$ Pa or less. The substrate temperature is held at 850° C., for example, and hydrogen gases are introduced for a constant time period. The amount of these hydrogen gases to be introduced is so set that the pressure in the chamber may be at $1.3\times10^{-2}$ Pa, for example. As a result, the natural oxide film covering the surface of the pixel electrode 371 is removed to expose the chemically active silicon polycrystal surface to the outside.

At a subsequent step shown in FIG. 49(B), the impurity, e.g., boron adsorptive layer 372 is formed over the surface of the activated pixel electrode 371. Specifically, after completion of cleaning the pixel electrode surface, the introduction of the hydrogen gases is interrupted, and the substrate temperature is set to 825° C., for example. After this set temperature has been reached and stabilized, the pixel electrode 371 has its surface fed for a constant time period with diborane or chemical gases containing boron. The amount of diborane to be fed is so set that the internal pressure of the chamber may be at $1.3\times10^{-2}$ Pa. As a result, the diborane gases are decomposed on the surface of the activated pixel electrode 371 so that the decomposed product or boron is chemically adsorbed by the surface of the pixel electrode. As a result, the boron-adsorbed layer 372 is formed.

At a last step shown in FIG. 49(C), a solid phase diffusion is effected by using the boron-adsorbed layer 372 as a diffusion source so that the impurity boron is introduced into the polycrystal silicon thin film constituting the pixel electrode 371. After the boron-adsorbed layer 372 has been formed, the introduction of the diborane gases is interrupted to anneal the substrate in the vacuum. As a result, the impurity boron is activated simultaneously with the solid phase diffusion using the boron-adsorbed layer 372 as the diffusion source. The electric resistivity of the pixel electrode 371 is controlled depending upon the degrees of the diffusion and activation of the impurity. In this process, a silicon polycrystal thin film having a desired impurity concentration can be formed by adjusting the amount of adsorption of boron and the annealing conditions such as the temperature or the time period.

In the embodiments thus far described, the doping gases used for doping the silicon polycrystal thin film with the P-type impurity are exemplified by diborane gases. The doping gases should not be limited thereto but can naturally be effectively replaced by chemical gases of III group elements, as represented by trimethyl gallium or boron trichloride. Moreover, the N-type doping gases used for the silicon polycrystal thin film can be exemplified by arsine, phosphor trichloride, antimony tetrachloride or phosphine. By using the molecular layer doping technology, the pixel electrode made of an extremely thin silicon polycrystal thin film can be doped with an impurity in an extremely high concentration so that its resistivity can be sufficiently dropped.

[Thirty Eighth Embodiment]

Finally, with reference to FIGS. 50(A) to 50(D), a process for fabricating a pixel electrode made of a silicified polycrystal silicon thin film will be described in the following. A silicide or a chemical compound of the so-called "refractory metal" and silicon is suited for a material of the pixel electrode because it has a higher transparency than that of silicon. Since a high-temperature process can be applied, moreover, the silicide is coordinated with the LSI fabrication technology. At a first step shown in FIG. 50(A), there is prepared a composite substrate which is formed with a pixel electrode made of a polycrystal silicon thin film. As shown, this composite substrate is constructed by superposing the field oxide film 364 on the quartz plate 361 and by further superposing the pixel electrode 371 of polycrystal silicon. In other words, the structure shown in FIG. 50(A) shows one portion extracted from the structure shown in FIG. 48(F). Preferably, the active film or the natural oxide film is removed from the surface of the pixel electrode 371.

At a subsequent step shown in FIG. 50(B), the vacuum evaporation process or the sputtering process is used to deposit a refractory metal film 373 on the surface of the pixel electrode 371 made of polycrystal silicon. The material for the refractory metal can be selected from chromium, aluminum, molybdenum, titanium or tungsten.

At a subsequent step shown in FIG. 50(C), the substrate is subjected in its entirety to a hot heat treatment to cause a reaction between the refractory metal and the silicon thereby to produce their silicide. In other words, the metal contained in the metal film 373 is thermally diffused into the polycrystal silicon film so that a chemical reaction is caused to change the polycrystal silicon into the silicide.

At a final step shown in FIG. 50(D), the metal film 373 left is removed by sputtering or the like to expose the pixel electrode 371 of the silicide to the outside. As a result, the pixel electrode 371 has its transparency and electric conductivity improved. Since the silicide composing the pixel electrode 371 is extremely excellent in its heat resistance, its characteristics will not be changed even if the composite substrate should be subjected thereafter to the semiconductor process.

As has been described hereinbefore, according to the present embodiments (in plurality), the switch element group and the peripheral circuit are integrated by the semiconductor miniature like technology or the LSI fabrication technology in the semiconductor single crystal thin film of high quality formed over the insulating substrate. As a result, there can be attained an effect that it is possible to provide a remarkably miniaturized highly dense light valve substrate semiconductor device integrated circuit chip. Since, moreover, the pixel electrode group is made of a semiconductor polycrystal thin film, the semiconductor process can be applied like the switch element group, thus raising an effect that it is possible to form a remarkably miniaturized and highly fine pixel. Since the switch element group is formed of the semiconductor single crystal thin film whereas the pixel electrode group is formed of the semiconductor polycrystal thin film, the semiconductor process can be applied consistently up to the final step, thus raising an effect that the throughput can be remarkably improved. In addition, the semiconductor polycrystal thin film constituting the pixel electrode is excellent in adhesive properties and can be deposited on the field oxide film for element separations. Thus, another effect is that none of the wiring defect, such as the step cut, is caused even if the substrate surface becomes seriously rough as the elements are miniaturized.

[Thirty Ninth Embodiment]

Figure 51:
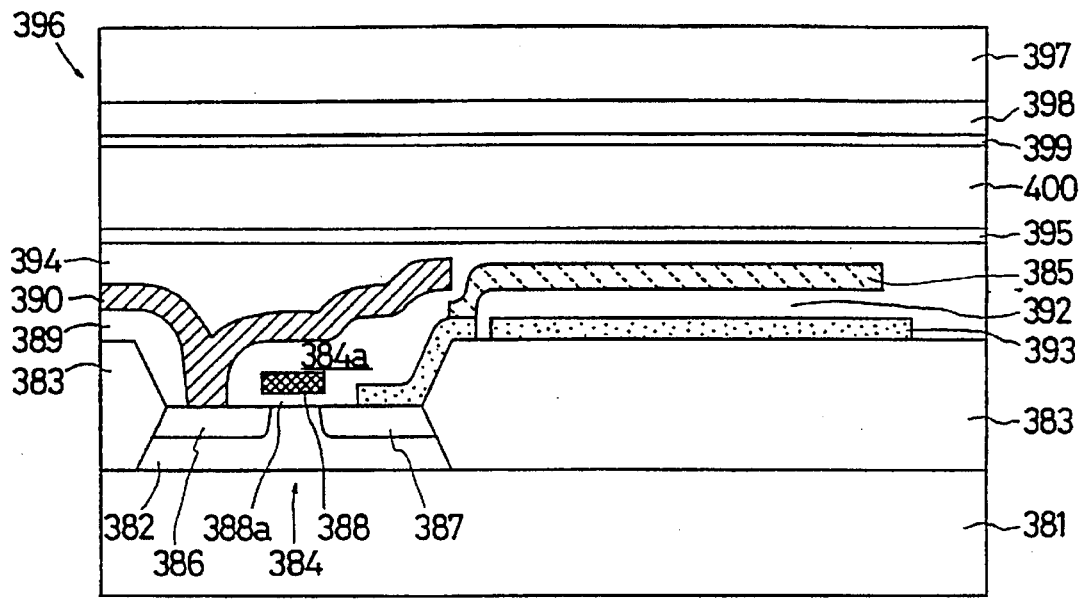
FIG. 51 is a schematic section showing a portion of the structure of the light valve substrate single crystal thin film semiconductor device.

FIG. 51 is a schematic section showing a portion of the light valve substrate single crystal thin film semiconductor device according to the present invention and shows the assembled state of the light valve device. For simplicity, one pixel portion is cut away and shown. As shown, this semiconductor device uses a composite substrate having the two-layered structure, which is composed of: an electrically insulating substrate 381; and a semiconductor single crystal thin film 382 arranged over the substrate surface. The substrate 381 is made of quartz, for example, and the semiconductor single crystal thin film 382 is made of a silicon single crystal, for example. The semiconductor single crystal thin film 382 is so selectively thermally oxidized that it is partially converted into a field oxide film 383. The portion of the semiconductor single crystal thin film 382, which is left without being selectively thermally oxidized, forms an element region 384. The field oxide film 383 is arranged thereover with pixel electrodes 385 for defining the individual pixels. This pixel electrode is obtained by patterning a silicon polycrystal thin film, for example, into a predetermined shape. In the element region 384, on the other hand, switch elements 384a are integrated.

These switch elements 384a are provided for energizing the corresponding pixel electrodes 385 selectively and are made of silicon single crystal thin film insulated gate field effect transistors, for example. Specifically, each transistor switch element 384a is composed of a pair of source region 386 and drain region 387 formed at a spacing in the surface portion of the semiconductor single crystal thin film 382, and a gate electrode 388 laminated through a gate insulating film 388a and having a predetermined shape. The drain region 387 is electrically connected with the pixel electrode 385, and the source region 386 is connected with a metal wiring line 390 through a contact hole formed in an interlayer insulating film 389. The metal wiring line 390 is extended to cover the transistor switch element 384a so that it also acts as a light shield film.

The pixel electrode 385 is connected with a capacitance element 391 for storing electric charges which are selectively fed through the switch element 384a. This capacitance element 391 has an electrode laminated below the pixel electrode 385 through a dielectric film 392. This dielectric film 392 is obtained by thermally oxidizing a silicon polycrystal thin film, for example. The thermally oxidized film is the most proper for the dielectric film 392 because it is excellent in insulating properties and dense can can be made extremely thin. In the present embodiment, the capacitance element 391 is a capacitor which is composed of a pair of pixel electrode 385 and the electrode 393, and the dielectric film 392 sandwiched between the two electrodes. The electrode 393 is made of a transparent electrode material such as an ITO. Since the dielectric film 392 laminated below the pixel electrode 385 is made of a transparent thermally oxidized film and since the electrode 393 is made of a transparent material, the presence of the capacitance element 391 raises no optical obstruction against the pixel electrode 385. If, in addition, the silicon polycrystal film constituting the pixel electrode 385 is thinned to make the pixel electrode 385 itself transparent, the pixel itself becomes transparent in its entirety because the field oxide film 383 and quartz substrate 381 underlying the pixel electrode 385 are also transparent. As a result, the pixel can function as a transparent light valve.

The substrate surface formed with the switch element 384a, the pixel electrode 385 and the capacitance element 391 is coated with a flattened passivation film 394. If the semiconductor device having such structure is used as a liquid crystal light valve, a liquid crystal alignment layer 395 is formed over the flattened passivation film 394. This structure is exemplified in the present embodiment, in which an opposed substrate 396 is arranged over the semiconductor device at a predetermined gap. This opposed substrate 396 is formed of a glass carrier 397, a common electrode 398 formed inside of the glass carrier 397, and a liquid crystal alignment layer 399 covering the common electrode surface. The aforementioned gap is filled up with a liquid crystal layer 400.

As has been described hereinbefore, the present semiconductor device employs a composite substrate, in which the substrate 381 is formed on its surface with the semiconductor single crystal thin film 382. This semiconductor single crystal thin film 382 is preferably formed by thermocompressively bonding a silicon single crystal wafer of high quality to the substrate surface and by subsequently polishing and thinning it. Since the silicon single crystal thin film 382 thus obtained retains the high quality of the silicon single crystal wafer as it is, the LSI fabrication technology can be directly applied to miniaturize the switch element such as the insulated gate field effect transistor.

Incidentally, the insulated gate field effect transistor formed in the silicon single crystal thin film has a higher dark current than that of the transistor which is formed in the amorphous silicon thin film or the polycrystal silicon thin film according to the prior art. According to the present invention, however, the pixel electrode 385 is connected with the capacitance element 391 so that the amount of charge capable of sufficiently compensating the charge loss due to the dark current can be stored.

[Fortieth Embodiment]

Figure 52:
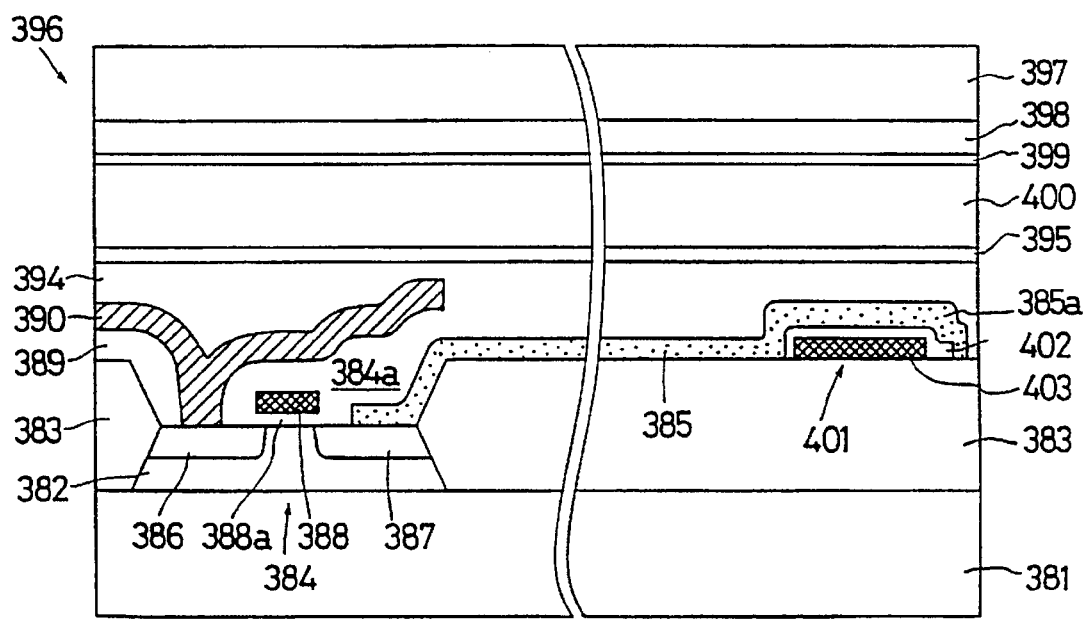
FIG. 52 is a schematic broken section showing another embodiment of the light valve substrate single crystal thin film semiconductor device.

FIG. 52 is a schematic broken section showing a portion of another embodiment of the light valve substrate single crystal thin film semiconductor device according to the present invention. The description of the components identical to those of the embodiment shown in FIG. 51 will be omitted and the identical components are designated by common reference numerals. What is different from the foregoing embodiments resides in the structure of the capacitance element. In the present embodiment, more specifically, the capacitance element 401 is composed of a scanning electrode bus 403 or a gate line, an extension 385a of the transparent pixel electrode 385, and a dielectric film 402 sandwiched between the former two. The gate line 403 is electrically connected with the gate electrode 388 and feeds a scanning signal for selecting each switch element 384a. This gate line 403 is obtained by patterning a polycrystal silicon thin film such as the same thin film as that of the gate electrode 388 into a predetermined shape. The gate line 403 is usually arranged over the field oxide film 383. On the other hand, the dielectric film 402 coating the gate line 403 is obtained by thermally oxidizing a silicon polycrystal thin film. As a result, the dielectric film 402 is excellent in the insulating properties and density and can be made extremely thin so that it can be given a large electrostatic capacity. The extension 385a of the pixel electrode 385 is also made of a transparent electrode material. As is different from the foregoing embodiment, according to the present embodiment, no special electrode is required so that the structure is better simplified to make the fabrication process efficient.

[Forty First Embodiment]

Figure 53:
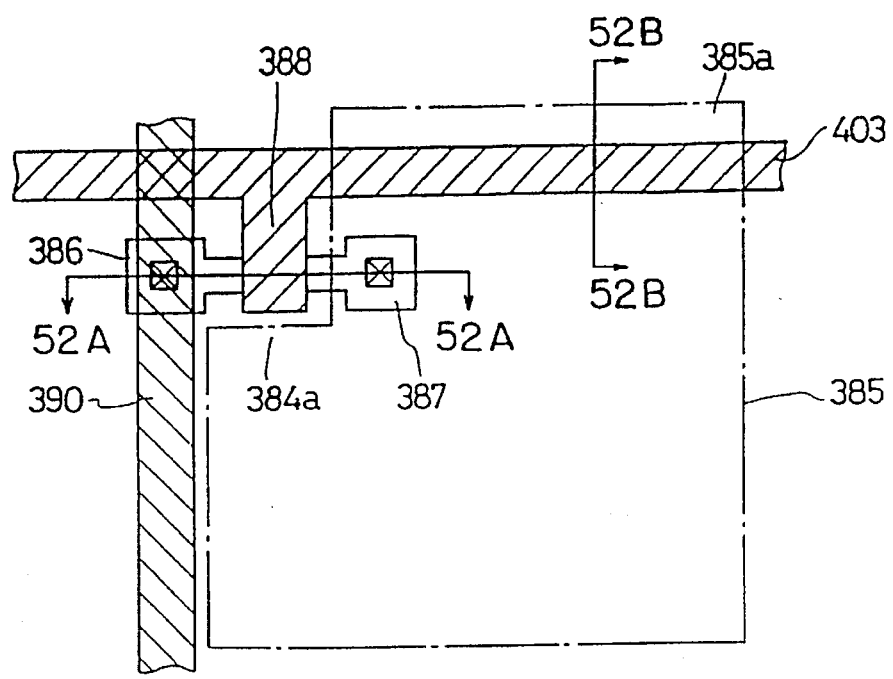
FIG. 53 is a schematic top plan view showing the light valve substrate single crystal thin film semiconductor device shown in FIG. 52.

FIG. 53 is a top plan view showing one pixel portion of FIG. 52. Incidentally, the lefthand portion of the structure shown in FIG. 52 corresponds to the sectional structure taken along line 52A—52A of FIG. 53, and the righthand portion of the structure shown in FIG. 52 corresponds to the sectional structure taken along line 52B—52B of FIG. 53. As shown in FIG. 53, the gate electrode 388 of the switch element 384a is extended from a portion of the scanning electrode bus or the gate line 403 such that its drain region 387 is electrically connected with the pixel electrode 385 through a contact hole whereas its source region 386 is electrically connected with the signal electrode bus or the metal pattern 390 through a contact hole. Although not shown, the signal electrode bus 390 is partially extended to cover the switch element 384a. This extension is clearly shown at the lefthand portion of the structure shown in FIG. 52.

The extension 385a of the pixel electrode 385 is formed to cover the surface of the scanning electrode bus or the gate line 403. As is apparent from FIG. 53, the extension 385a constitutes a capacitor together with the scanning electrode bus 403 arranged therebelow so that the amount of charge fed selectively to the pixel electrode 385 through the switch element 404a can be temporarily stored.

[Forty Second Embodiment]

Next, with reference to FIGS. 54(A) to 54(G), a process for fabricating the light valve substrate single crystal thin film semiconductor device shown in FIG. 51 will be described in detail in the following. At a first step shown in FIG. 54(A), there are prepared a quartz substrate 411 and a silicon single crystal substrate 412. The silicon single crystal substrate 412 to be used is preferably exemplified by a silicon wafer of high quality used in the LSI fabrication and has a crystal azimuth of uniformity within a range of <100> 0.0±1.0 and a single crystal lattice defect density of 500/cm$^2$ or less. The quartz substrate 411 and the silicon single crystal substrate 412 thus prepared have their respective surface and back precisely smoothed and finished at first. Subsequently, the two substrates are thermo-compressively bonded by superposing and heating the two faces smoothly finished. As a result of this thermo-compressive bonding, the two substrates 411 and 412 are fixedly bonded to each other.

Figure 54A:
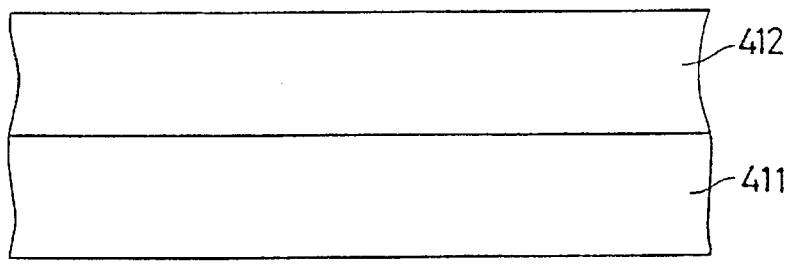
Figure 54B:
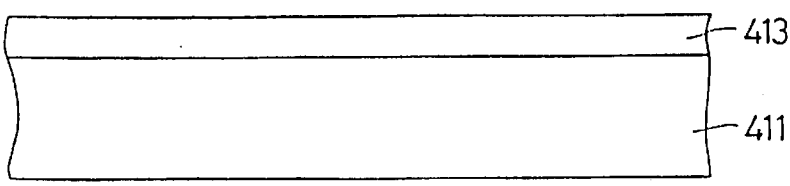

At a subsequent step shown in FIG. 54(B), the silicon single crystal substrate 412 has its surface polished. As a result, the quartz substrate 411 has its surface formed with a silicon single crystal thin film 413 polished to a desired thickness. Incidentally, the polishing treatment may be replaced by a wet or dry etching treatment so as to thin the silicon single crystal substrate 412. The silicon single crystal thin film 413 thus obtained can retain the quality of the silicon wafer 412 substantially as it is, to produce a semiconductor substrate material which is remarkably excellent in the uniformity of the crystal azimuth and the lattice defect density. As a result, the LSI fabrication technology can be directly applied to form remarkably miniature switch elements or the like of micron or sub-micron order in a high production yield.

Figure 54C:
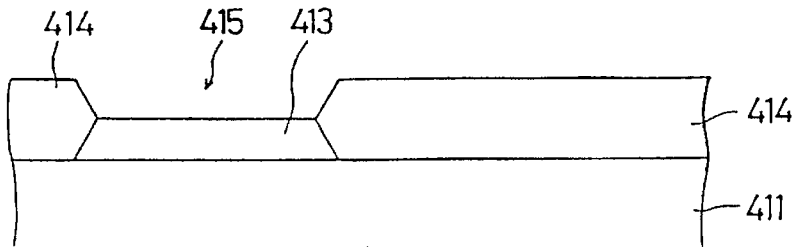

At a subsequent step shown in FIG. 54(C), the silicon single crystal thin film 413 is selectively subjected to the thermal oxidation. This selective thermal oxidation is accomplished throughout the thickness of the silicon single crystal thin film 413 to form an optical transparent field oxide film 414. The portion of the silicon single crystal thin film 413 surrounded by the field oxide film 414 is left as it is to define an element region 415.

At a subsequent step shown in FIG. 54(D), the surface portion of the silicon single crystal thin film 413 existing in the element region is thermally oxidized to form a gate insulating film 416. This gate insulating film 416 has an extremely small thickness. After a silicon polycrystal thin film has been deposited on the gate insulating film 416 by the chemical vapor deposition process or the like, the silicon polycrystal thin film is patterned by the photolithography and the anisotropic etching process to form a gate electrode 417 having a predetermined shape.

At a step shown in FIG. 54(E), the silicon single crystal thin film 413 has its surface portion doped with an impurity to form a source region 418 and a drain region 419, which are made of an impurity-diffused region. This impurity doping process is accomplished, for example, by an ion implantation of an impurity of arsenic using the gate electrode 417 as a mask through the gate insulating film 416. As a result, a transistor channel forming region is formed between the paired source region 418 and drain region 419 and below the gate electrode 417 to form a silicon single crystal thin film insulated gate field effect transistor. Since this transistor is formed into a silicon single crystal thin film by the LSI fabrication technology, it has a miniature size of micron or sub-micron order and is excellent in high-speed responsiveness.

At a subsequent step shown in FIG. 54(F), a pixel electrode 420 is formed over the field oxide film 414. This pixel electrode 420 is obtained by masking the element region 415, for example, by subsequently depositing a silicon polycrystal thin film on the substrate surface by the chemical vapor deposition process, and by patterning the silicon polycrystal thin film into a predetermined shape. The polycrystal silicon is intrinsically optically opaque but can be made substantially transparent to an incident light if it is made extremely thin. Incidentally, when the pixel electrode 420 is to be formed, the gate insulating film 416 is formed in advance with a contact hole, through which an electric conduction between the drain region 419 of the switch element and the pixel electrode is retained.

Subsequently, a dielectric film 421 is formed over the pixel electrode 420. The dielectric film 421 is obtained by thermally oxidizing the surface of the pixel electrode 420 made of a polycrystal silicon thin film, for example. The thermally oxidized silicon film is an excellent dielectric material because it is excellent in insulating properties and remarkably dense and can be made thin.

After the mask covering the element region has been removed, an inter-layer insulating film is deposited to form a metal pattern 422 thereover. At this time, the inter-layer insulating film and the gate insulating film are formed with contact holes, through which the electric connection between the source region 418 of the transistor switch element and the metal pattern 422 is retained.

At a final step shown in FIG. 54(G), there is laminated an electrode 423 of the dielectric film 421. This electrode 423 is made of a transparent electrode material such as an ITO. After the coverage of the ITO film, a patterning treatment can be accomplished by the photolithography and the etching process to form the electrode 423 having a predetermined shape. As a result, a capacitance element composed of the pixel electrode 420, the electrode 423 and the dielectric film 421 sandwiched between the former two is formed. In the present embodiment, all the electrode 423, the dielectric film 421 and the pixel electrode 420 are transparent so that a transparent light valve device can be constructed. After the electrode 423 has been formed, the substrate is covered all over its surface with a passivation film 424. This passivation film 424 has its surface flattened.

As has been described hereinbefore, according to the present invention, the capacitance element is connected with the pixel electrode. As a result, the effective charge fed selectively to the pixel electrode can be held notwithstanding that the switch element formed in the semiconductor single crystal thin film such as the insulated gate field effect transistor has a relatively high dark current, thus raising an effect that stable light valve operating characteristics can be obtained. In addition, the pixel electrode is made of the semiconductor polycrystal thin film, and the dense film obtained by thermally oxidizing the surface of the thin film selectively is used as the dielectric film of the capacitance element. Thus, there arises an effect that it is possible to provide a capacitor which is excellent in breakdown voltage and has a relatively high capacity.

[Forty Third Embodiment]

Figure 55:
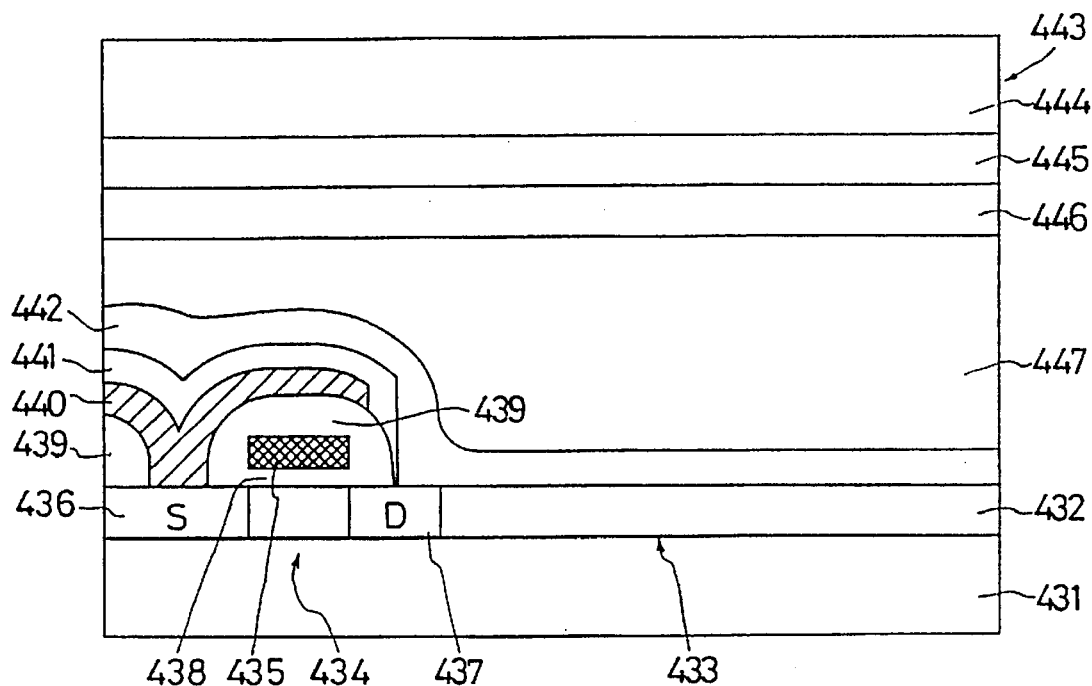
FIG. 55 is a schematic section showing a portion of one embodiment of a light valve device.

FIG. 55 is a schematic section showing a portion of one embodiment of the light valve substrate single crystal thin film semiconductor device and shows an extracted portion corresponding to one pixel. As shown, the present semiconductor device makes use of an electrically insulating substrate 431. This substrate is made of transparent quartz or the like. This substrate 431 is arranged on its surface with a semiconductor single crystal thin film 432. This semiconductor single crystal thin film 432 is made of single crystal silicon, for example, and has its thickness set to about 0.1 μm. The semiconductor single crystal thin film 432 can be made substantially transparent to an incident light by having its thickness reduced. The semiconductor single crystal thin film 432 has its certain portion patterned into a predetermined shape to constitute a pixel electrode 433. The portion of the semiconductor single crystal thin film 432 adjacent to the pixel electrode 433 is formed with a switch element 434. This switch element 434 is composed of integrated single crystal thin film elements, each of which is connected to selectively energize a corresponding pixel electrode 433 directly through the semiconductor single crystal thin film 432. The switch element 434 or the single crystal thin film element is constructed, for example, of an insulated gate field effect transistor which is composed of a gate electrode 435 and a pair of impurity-diffused regions, i.e., a source region 436 and a drain region 437. One impurity-diffused region, i.e., the drain region 437 is connected with the corresponding pixel electrode 433. In other words, the drain region 437 and the pixel electrode 433 is made of an impurity-diffused region which is formed in the common semiconductor single crystal thin film 432. This semiconductor single crystal thin film 432 is made of a polished silicon single crystal thin film of high quality which is adhered to the surface of a substrate 431. The gate electrode 435 is arranged over the channel forming region of the thin film transistor switch element 434 through a gate insulating film 438. This channel forming region is sandwiched between the paired source region 436 and drain region 437. A wiring pattern 440 made of metallic aluminum is formed over the switch element 434 through an insulating film 439. The wiring pattern 440 is electrically connected with the source region 436 of the switch element 434 through a contact hole formed in the insulating film 439. The wiring pattern 440 is further connected with a not-shown signal line to impress an image signal to the switch element 444. This image signal is selectively fed to the pixel electrode 433 through the channel forming region and the drain region 437 in the conductive state. The wiring pattern 440 is formed over its surface with a passivation film 441. This passivation film 441 covers the surface of the substrate 431 except the portion formed with the pixel electrode 433, to passivate the switch element 434 from external stresses. Finally, the substrate surface is covered all over with an alignment film 442. This alignment layer 442 is necessary when the present light valve substrate single crystal thin film semiconductor device is to be assembled as the liquid crystal panel.

FIG. 55 shows an example, in which the liquid crystal panel is constructed by using the light valve substrate single crystal thin film semiconductor device thus far described. As shown, an opposed substrate 443 is arranged at a predetermined gap from the substrate 431. The opposed substrate 443 is given a laminated structure which is composed of a glass carrier 444, a common electrode 445 formed on the inner side of the glass carrier 444, and an alignment film 446 covering the common electrode 445. The predetermined gap between the composite substrate 431 and the opposed substrate 443 is filled with a liquid crystal layer 447. This liquid crystal layer 447 is vertically sandwiched by the paired alignment films 442 and 446 to have a predetermined liquid crystal molecular array structure. The liquid crystal layer 447 has its liquid crystal molecular array state changed when fed with a predetermined voltage in accordance with the amount of charge fed selectively between the common electrode 445 and the pixel electrode 433. In accordance with this change, the transparency of the incident light is adjusted to effect a light valve function for each pixel.

[Forty Fourth Embodiment]

Figure 56:
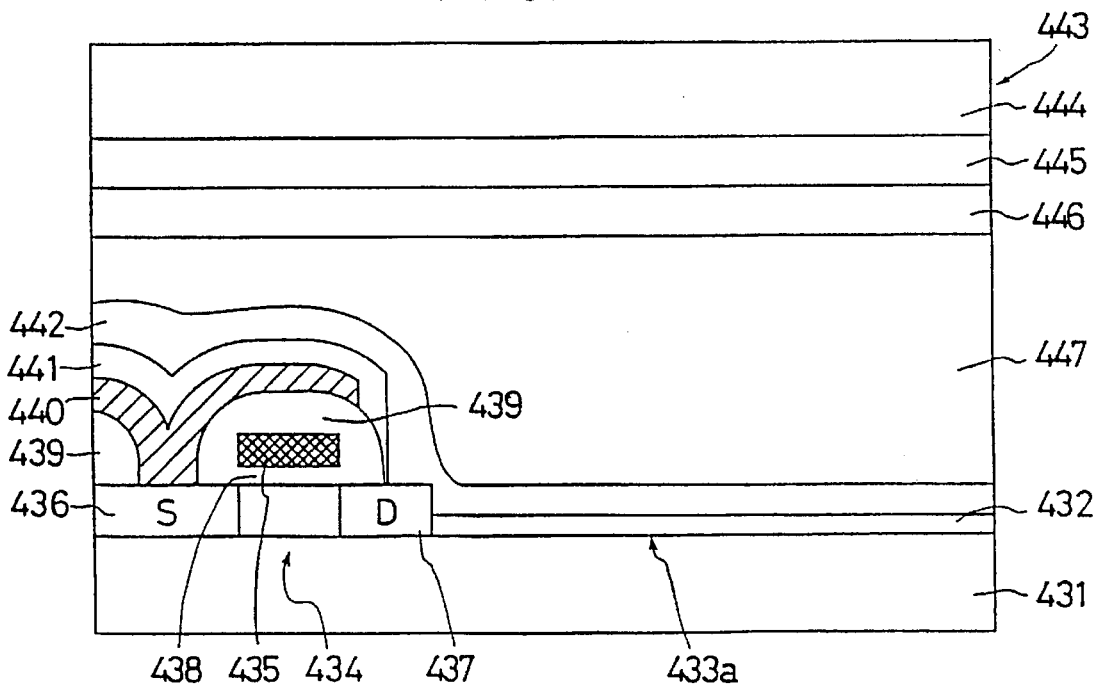
FIG. 56 is a schematic section showing a portion of a modification of the same.

FIG. 56 is a schematic section showing a portion of a modification of the light valve substrate single crystal thin film semiconductor device shown in FIG. 55. The portions identical to the components shown in FIG. 55 are designated by common reference numerals, and their descriptions will be omitted. What is different from the embodiment shown in FIG. 55 resides in that the thickness of the portion of the semiconductor single crystal thin film 432 forming a pixel electrode 433a is set smaller than that of the portion of the semiconductor single crystal thin film 432, in which the corresponding thin film switch element 434 is integrated. Specifically, the semiconductor single crystal thin film 432 is selectively etched in accordance with a predetermined pattern to form the pixel electrode 433a which has its thickness partially reduced. Thus, the transparency of the pixel electrode 433a can be remarkably improved, and the step of forming the switch element 434 can be simplified because the thickness of the semiconductor single crystal thin film 432 to be formed with the switch element 434 need not be made extremely thin in advance.

[Forty Fifth Embodiment]

Figure 57:
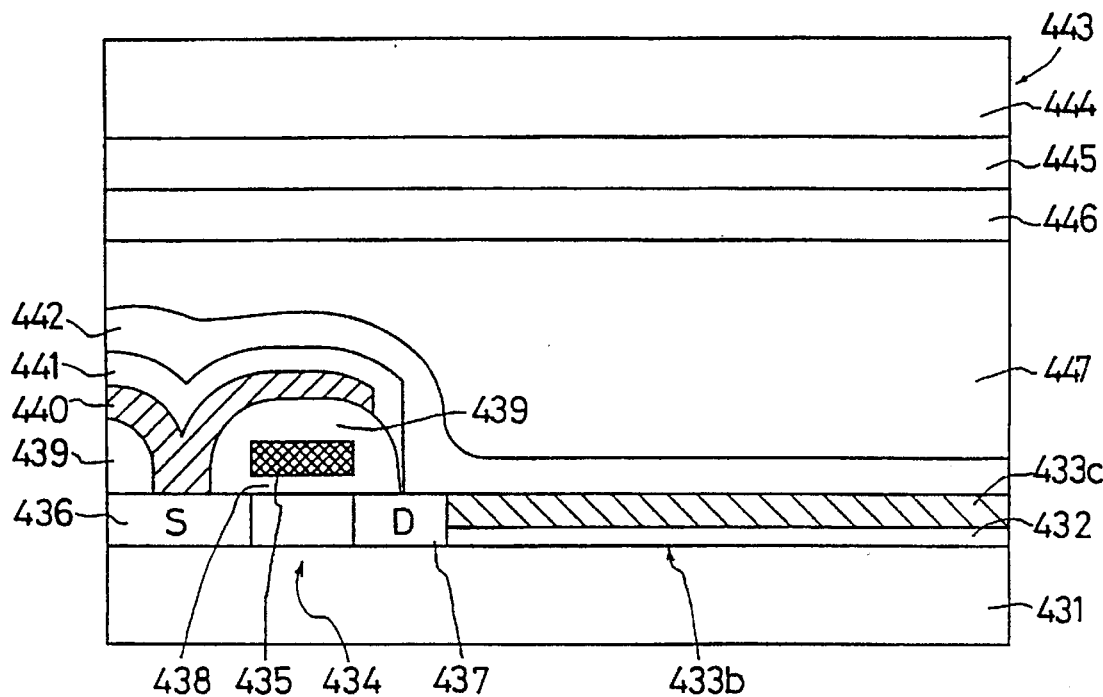
FIG. 57 is a schematic section showing a portion of another modification of the same.

FIG. 57 is a schematic section showing a portion of another modification of the light valve substrate single crystal thin film semiconductor device according to the present invention. The components identical to those of the embodiment shown in FIG. 55 are designated at the common reference numerals, and their descriptions will be omitted. What is different from the embodiment shown in FIG. 55 resides in that the thickness of the portion of the semiconductor single crystal thin film 432 forming a pixel electrode 433b is smaller than that of the portion of the semiconductor single crystal thin film 432, in which the corresponding thin film switch element 434 is integrated. As is different from the modification shown in FIG. 56, however, the semiconductor single crystal thin film 432 has its portion thermally oxidized along a predetermined pattern so that it is converted into an optically transparent oxide film 433c. As a result, in the region of the pixel electrode 433b, the semiconductor single crystal thin film 432 has its thickness so reduced as to substantially have a transparency of 100%. Since the surface of the substrate 431 is flattened, as is different from the embodiment shown in FIG. 56, there can be attained an advantage that the subsequent step such as the layer alignment treatment is facilitated.

[Forty Sixth Embodiment]

Figure 58:
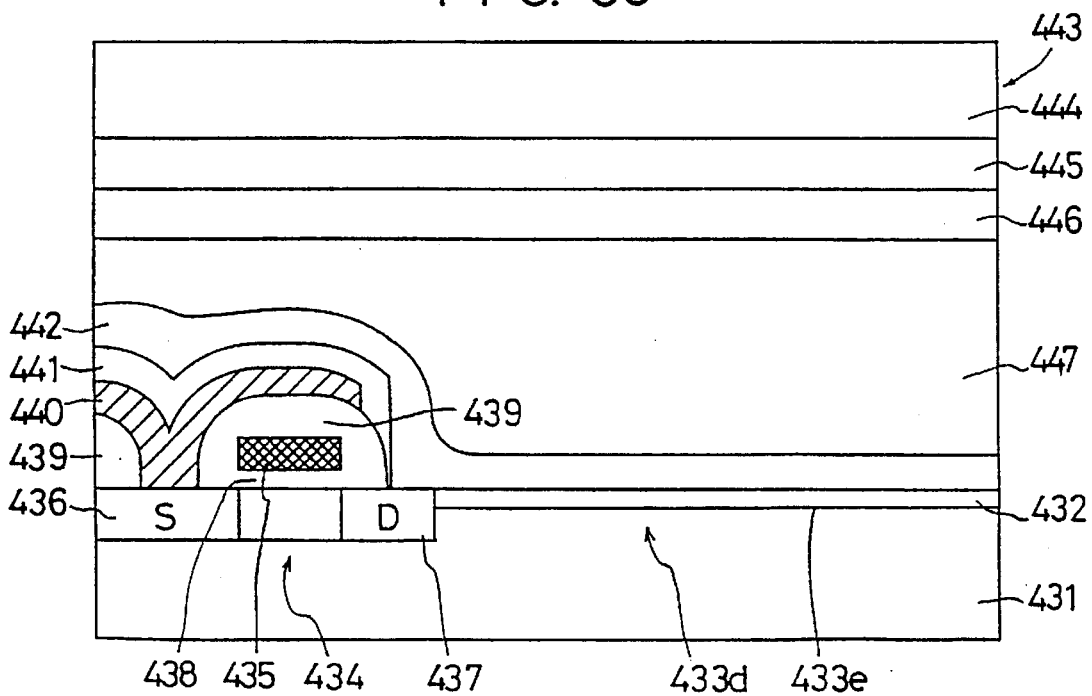
FIG. 58 is a schematic section showing a portion of still another modification of the same.

FIG. 58 is a schematic section showing a portion of still another modification of the light valve substrate single crystal thin film semiconductor device according to the present invention. The components identical to those of the embodiment shown in FIG. 55 are designated by common reference numerals, and their detailed descriptions will be omitted. In this modification, too, the thickness of the portion of the semiconductor single crystal thin film 432 constituting a pixel electrode 433d is set smaller than that of the portion of the semiconductor single crystal thin film 432, in which the corresponding thin film switch element 434 is integrated. As is different from the embodiment shown in FIG. 56, however, the surface portion of the substrate 431 defining the pixel region in the present embodiment is formed in advance with a trapezoidal step 433e. The surface thus stepped is covered with the flat semiconductor single crystal thin film 432. As a result, the thickness of the semiconductor single crystal thin film 432 is reduced to an extent corresponding to the height of the stepped portion 433e. By suitably setting the height of this stepped portion, the transparency of the pixel electrode 433d can be increased substantially to 100%.

[Forty Seventh Embodiment]

Next, with reference to FIGS. 59(A) to 59(F), a process for fabricating the light valve substrate single crystal thin film semiconductor device shown in FIG. 55 will be described in detail in the following. At a first step shown in FIG. 59(A), there are prepared the quartz substrate 361 and the silicon single crystal substrate 362. The silicon single crystal substrate 362 is preferably made of a silicon wafer of high quality used in the LSI fabrication and has a crystal azimuth of uniformity within a range of <100> 0.0±1.0 and a single crystal lattice defect density of 500/cm² or less. The quartz substrate 361 and the silicon single crystal substrate 362 thus prepared have their respective surface and back precisely smoothed and polished at first. Subsequently, the two substrates are thermo-compressively bonded by superposing and heating the two faces smoothed and finished. As a result of this thermo-compressive bonding treatment, the two substrates 361 and 362 are fixedly bonded to each other.

At a subsequent step shown in FIG. 59(B), the silicon single crystal substrate 362 has its surface polished. As a result, the quartz substrate 361 is formed on its surface with the silicon single crystal thin film 363 which is polished to a desired thickness. Incidentally, the silicon wafer 362 may be thinned by the etching treatment in place of the polishing treatment. Since the silicon single crystal thin film 363 thus obtained is so thin as to have optical transparency and retains the quality of the silicon wafer 362 substantially as it is, it is possible to obtain a semiconductor device material which is remarkably excellent in the uniformity of the crystal azimuth and the lattice defect density.

At a subsequent step shown in FIG. FIG. 59(C), the silicon single crystal thin film 363 is patterned in accordance with a predetermined shape to form the pixel electrode 364. Simultaneously with this step, the element region 365 is formed in contact with the pixel electrode 364. These pixel electrode 364 and element region 365 are made of the silicon single crystal thin film 363. Subsequently, the silicon single crystal thin film 363 thus patterned to the predetermined shape has its surface thermally oxidized to from the silicon oxide film 366. In the element region 365, the gate electrode 367 having the predetermined shape is deposited through the silicon oxide film 366.

At a subsequent step shown in FIG. 59(D), the gate electrode 367 is used as a mask to effect an ion implantation of an impurity through the silicon oxide film 366. As a result, the silicon single crystal thin film 363 is selectively doped with the impurity to form the source region 368 and the drain region 369 at the two sides of the gate electrode 367. Simultaneously with this step, the pixel electrode 364 contacting the drain region 369 is also doped with the impurity. As a result, the conductivity of the pixel electrode 364 can be dropped to a practical level. By the steps described above, the element region 365 is formed with the single crystal thin film insulated gate field effect transistor, which has its drain region 369 electrically connected directly with the pixel electrode 364. Thus, the pixel electrode 364 can also be treated by the complete semiconductor process unlike the prior art. Since, moreover, the switch element and the pixel electrode are simultaneously formed, they are not adversely affected unlike the prior art by the roughness of the substrate surface, which is caused when the switch element is formed.

At a subsequent step shown in FIG. 59(E), the switch element is covered with the inter-layer insulating film 370. A contact hole communicating with the source region 368 is formed in that inter-layer insulating film 370, and the aluminum pattern 371 is deposited. As a result, the switch element can be made conductive to the outside.

At a last step shown in FIG. 59(F), the switch element is covered with the passivation film 372. In addition, in case the light valve substrate single crystal thin film semiconductor device thus completed is used for assembly of the liquid crystal panel, the substrate surface is covered with the alignment layer 373.

As has been described hereinbefore, according to the present invention, the pixel electrode group and the switch element group are integrated by the LSI fabrication technology in the semiconductor single crystal thin film of high quality formed over the insulating substrate. As a result, there arises an effect capable of providing a light valve substrate single crystal thin film semiconductor device which has a remarkably high pixel density and switch element integration density. Since not only the switch elements but also the pixel electrodes are formed in the semiconductor single crystal thin film, there arises another effect that the electric conductions between the switch elements and the corresponding pixel electrodes can be automatically attained to simplify the structure. Since, moreover, the semiconductor process can be executed consistently up to the final step unlike the prior art, there arises still another effect capable of providing a light valve substrate single crystal thin film semiconductor device having a high quality and less defects.

[Forty Eighth Embodiment]

Figure 60:
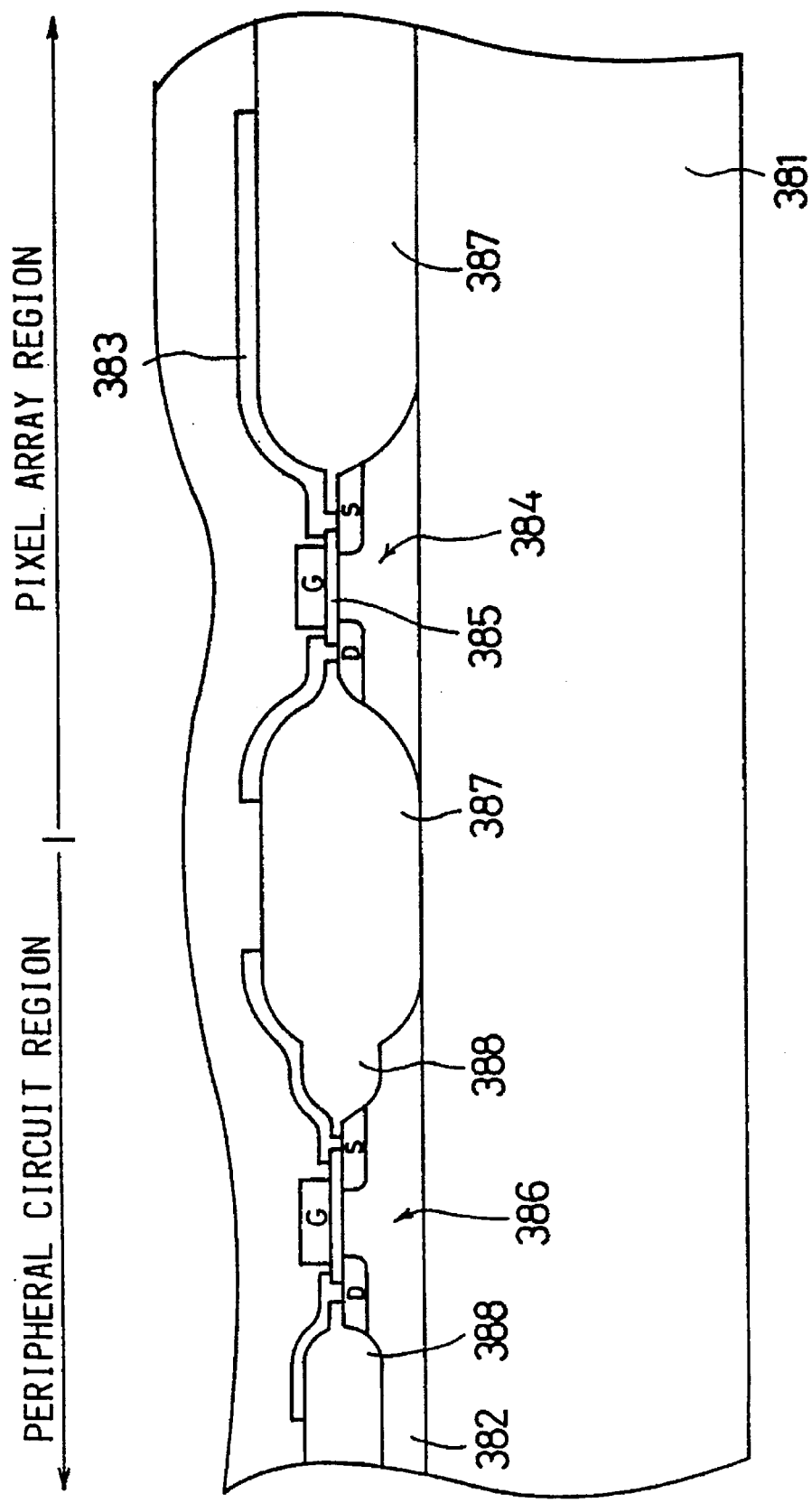
FIG. 60 is a schematic section showing a portion of a typical structure of the light valve semiconductor substrate device according to the present invention.

FIG. 60 is a schematic section showing a portion of the typical mode of the light valve substrate single crystal thin film semiconductor device according to the present invention. As shown, the present device makes use of a composite substrate having a structure of at least two phases, which is composed of the electrically insulating transparent carrier layer 381 and the semiconductor single crystal thin film 382 laminated over the transparent carrier layer 381. Since this two-phase structure is formed by the adhesion, the crystal properties of the single crystal thin film 382 can be made identical to those of the substrate used in the LSI. The transparent carrier layer 381 is made of quartz, for example, and the semiconductor single crystal thin film 382 is made of single crystal silicon, for example. As shown, the composite substrate is divided into an optically transparent region at the righthand half and an optically opaque region at the lefthand half. The optically transparent region is formed with the pixel electrode group and the switch element group in the matrix shape, but only one transparent pixel electrode 383 and one corresponding switch element 384 are shown for simplicity in FIG. 60. Each switch element 384 is generally made of an insulated gate field effect transistor, which is composed of: a pair of source region S and drain region D formed in the surface portion of the semiconductor single crystal thin film 382; and a gate electrode G laminated through the gate insulating film 385. The transparent pixel electrode 383 is electrically connected with the source region S through a contact hole which is formed in the gate insulating film 385. In the optically opaque region, on the other hand, there is formed a peripheral circuit which includes a drive circuit or the like composed of a plurality of circuit elements. In FIG. 60, only one circuit element 386 is shown for simplicity. This circuit element 386 is also usually made of an insulated gate field effect transistor.

The optically transparent region is formed with the transparent isolating region 387 so as to isolate the individual switch elements 374 electrically. In the embodiment shown in FIG. 60, the transparent isolating region 387 is made of an overall thickness field oxide film which is obtained by thermally oxidizing the overall thickness of the semiconductor single crystal thin film 382 selectively. Generally speaking, the thickness of a silicon single crystal layer is substantially doubled if it is wholly thermally oxidized into a silicon dioxide layer. The field oxide film of silicon dioxide is optically transparent. Since the transparent pixel electrode 383 is superposed over that transparent isolating region 387, an incident light can transmit through the transparent pixel electrode 383 in the optically transparent region as a whole so that an excellent light valve function can be achieved. If the semiconductor single crystal thin film 382 is thermally oxidized throughout its thickness, the bird's beak is large-sized to reduce the effective area of the element region for forming the switching element 384. Despite of this fact, however, there arises no problem because more strict integration density or size precision is required of the switch element 384 than the circuit element 386. In the optically transparent region, on the other hand, each circuit element 386 is composed of: the opposed substrate 389; and an electrooptical material layer made of a liquid crystal filling up the gap between the semiconductor substrate device and the opposed substrate 389. As has been described above, the semiconductor substrate device is formed over its surface with a matrix group of the pixel electrodes 383 for defining the pixels and a group of the switch elements 384 for energizing the individual pixel electrodes 383 selectively in accordance with predetermined signals.

[Forty Ninth Embodiment]

Figure 61A:
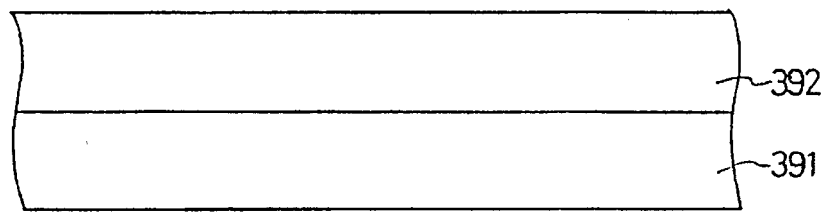
FIGS. 61(A) to 61(G) are process charts showing one embodiment of the present invention.

The embodiments of the present invention will be described in detail in the following in connection with their fabrication processes and structures. First of all, the embodiment of FIG. 60 will be described in detail with reference to FIGS. 61(A) to 61(G). The present embodiment shows an example of the process for fabricating the light valve semiconductor substrate device shown in FIG. 60. At a first step shown in FIG. 61(A), there are prepared the quartz substrate 391 and the silicon single crystal substrate 392. The quartz substrate 391 and the silicon single crystal substrate 392 thus prepared have their respective surface and back smoothed and finished precisely. Subsequently, the two substrates are thermo-compressively bonded by superposing and heating the two faces smoothly finished. By this thermo-compressive bonding, the two substrates 391 and 392 are fixedly bonded to each other.

Figure 61B:
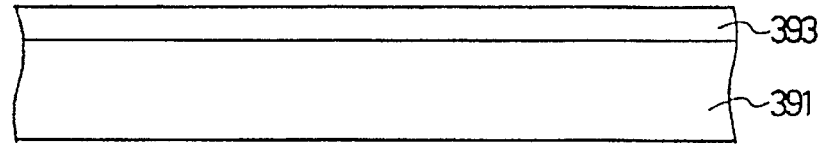

At a step shown in FIG. 61(B), the surface of the silicon single crystal semiconductor substrate 392 is polished. As a result, the quartz substrate 391 is formed over its surface with the silicon single crystal thin film 393 which is polished to the desired thickness. Thus, there is obtained a composite substrate having a two-phase structure which is composed of the carrier layer 391 made of the quartz substrate and the silicon single crystal thin film 393.

Figure 61C:
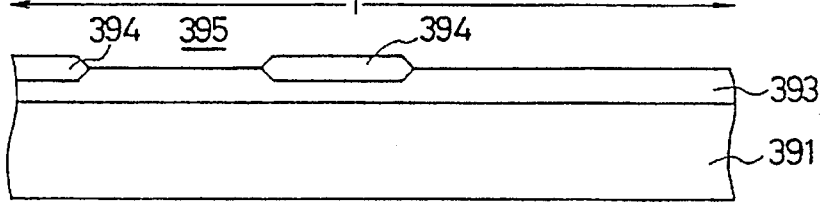

At a subsequent step shown in FIG. 61(C), only the surface portion of the silicon single crystal thin film 393 is selectively thermally oxidized to form the thin field oxide film 394. In FIG. 61(C), the righthand half indicates an optically transparent region, and the lefthand half indicates the optically opaque region. The thin field oxide film 394 is formed exclusively in the optically opaque region to define the circuit element region 395. Below the thin field oxide film 394, there is left a portion of the silicon single crystal thin film 393 to form the totally opaque isolating region.

Figure 61D:
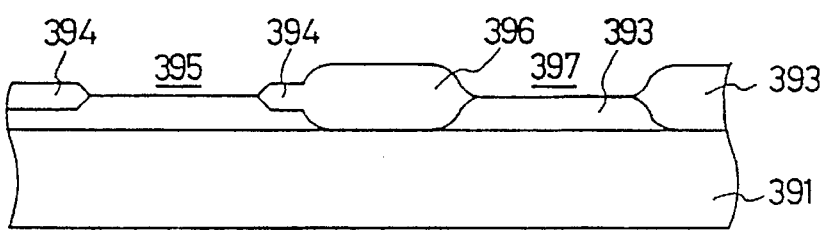

At a step shown in FIG. 61(D), in the transparent region, the silicon single crystal thin film 393 is selectively subjected all over the surface to the thermal oxidation to from the thick field oxide film 396. This thick field oxide film is formed by converting the overall thickness of the silicon single crystal thin film 393 into silicon dioxide. As a result, the thick field oxide film 396 is substantially transparent to form the transparent isolating region. The portion surrounded by the thick field oxide film 396 is formed with the switch element region 397. In the embodiment described above, the thin field oxide film 394 is formed earlier, and the thick field oxide film 396 is formed later. Despite of this fact, however, the fabrication process of the present invention should not be limited thereto, but the order of forming the two kinds of field oxide films may be reversed.

Figure 61E:
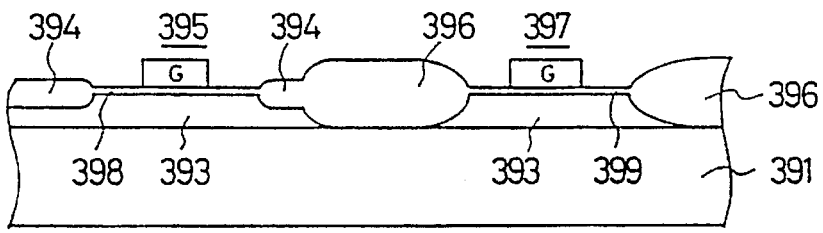

At a step shown in FIG. 61(E), the element regions 395 and 397 have their surfaces formed simultaneously with the gate oxide films 398 and 399, respectively. Moreover, these gate oxide films are individually formed thereover with the patterned gate electrodes G. Incidentally, these gate oxide films 398 and 199 are formed by thermal oxidations. On the other hand, the gate electrodes are formed by depositing the polycrystal silicon film by the chemical vapor deposition process. Specifically, the deposited polycrystal silicon film is selectively etched by using the resist, which has been patterned to the predetermined shape, to form the gate electrodes G of the polycrystal silicon film over the gate oxide films 398 and 399.

Figure 61F:
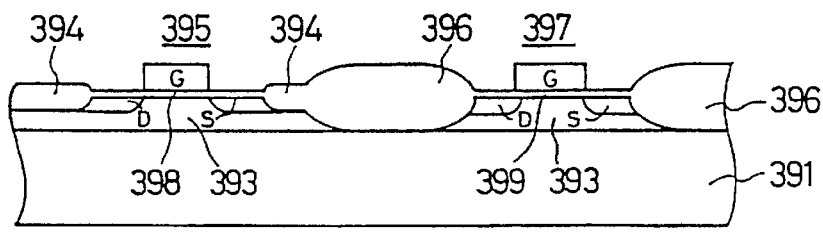

At a subsequent step shown in FIG. 61(F), the gate electrodes G are used as masks to implant ions of an impurity such as arsenic through the gate oxide films 398 and 399 so that the silicon single crystal thin film 393 is formed with the drain region D and the source region S. As a result, in the individual element regions 395 and 397, the transistor channel region left undoped with the impurity is formed below the gate electrodes G and between the drain regions D and the source regions S. As a result, in the optically opaque region, the circuit element region 395 is formed with the insulated gate field effect transistor constituting the circuit element. In the optically transparent region, the switch element region 397 is formed with the insulated gate field effect transistor forming the switch element.

Figure 61G:
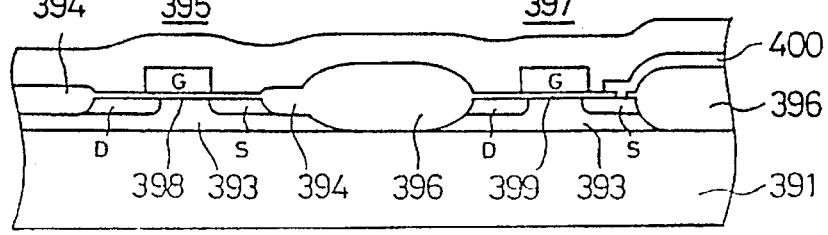

At a subsequent step shown in FIG. 61(G), the gate oxide film 399 over the source region S of the transistor constituting the switch element is partially removed to form a contact hole, which is covered with the transparent pixel electrode 400. This pixel electrode 400 is made of the ITO or the like and is superposed on the transparent field oxide film 396. As a result, the three-phase structure, which is composed of the pixel electrode 400, the thick field oxide film 396 and the quartz substrate 391, can provide an optically transparent light valve device. Below the thin field oxide film 394 formed in the optically opaque region, on the contrary, there is partially left the opaque silicon single crystal thin film 393. Since the bird's beak of the thin field oxide film 394 is smaller than that of the thick field oxide film 396, as shown, the circuit element region 395 can be formed precisely with little dispersion and in high density. Finally, the composite substrate is covered all over its surface with the passivation film of the PSG or the like. Although not shown, the switch element group and the circuit element group are electrically connected to each other in accordance with the predetermined pattern.

In the fabrication process shown in FIGS. 61(A) to 61(G), as has been described above, the silicon single crystal thin film of high quality can be subjected to the filming treatment at a high temperature, the photolithoetching of high resolution, the ion implantation and so on to integrate the insulated gate field effect transistor which has a size of micron or sub-micron order. Since the single crystal silicon used is of remarkably high quality, the insulated gate field effect transistor obtained has excellent electric characteristics. Since, at the same time, the pixel electrode can be formed to have an order of micron order by the miniature like technology, it is possible to fabricate an active matrix liquid crystal semiconductor integrated circuit chip substrate having a high density and a miniature structure.

[Fiftieth Embodiment]

Figure 62A:
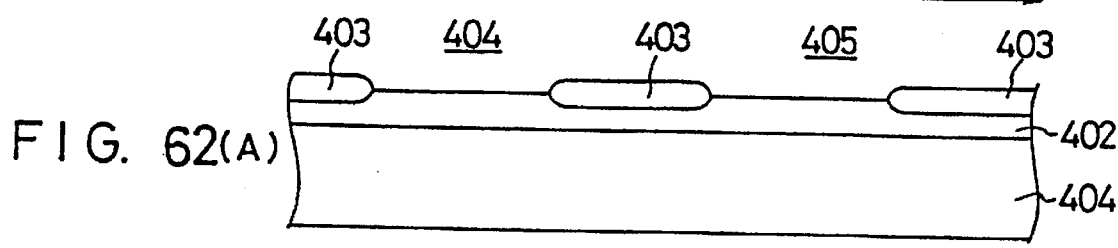
FIGS. 62(A) to 62(C) are process charts showing one embodiment of the present invention.

Next, an embodiment will be described in detail with reference to FIGS. 62(A) to 62(C). This embodiment is an improvement over the forty sixth embodiment such that a thin field oxide film is extended around the thick field oxide film constituting the transparent isolating region to reduce the dispersion of the size of the switch element region. At a first step shown in FIG. 62(A), there is prepared the composite substrate which is composed of the quartz carrier layer 401 and the silicon single crystal thin film 402. The process for fabricating this composite substrate is similar to that of the forty sixth embodiment. Subsequently, the silicon single crystal thin film 402 has only its surface portion thermally oxidized selectively to form the thin field oxide film 403. In FIG. 62(A), the lefthand side indicates the optically opaque region, and the righthand side indicates the optically transparent region. A peripheral circuit element region 404 is formed in the optically opaque region, and a switch element region 405 is formed in the optically transparent region. Either of the element regions has a remarkably high sizing precision because it is surrounded by the thin field oxide film 403. This is because the dispersion of the bird's beak existing at the edge portion of the thin field oxide film 403 is small. Incidentally, the field oxide film is obtained by thermally oxidizing the silicon single crystal thin film 402 partially by using as masks the two layers of the silicon oxide film and the silicon nitride film, which are formed into predetermined patterns.

Figure 62B:
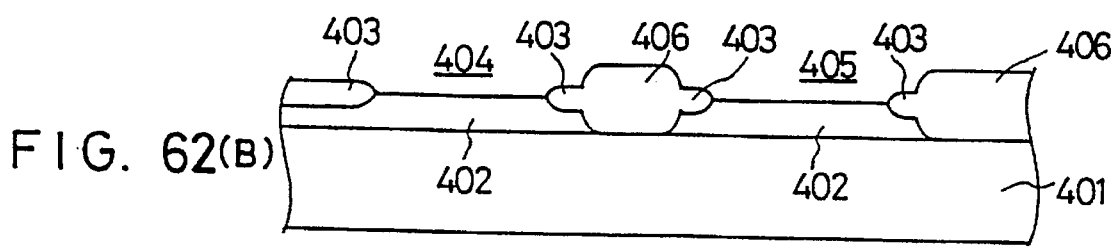

At a subsequent step shown in FIG. 62(B), a second selective thermal oxidation treatment is accomplished to form a thick field oxide film 406. This thick field oxide film 406 is formed only in the optical transparent region and over the thin field oxide film 403. As a result, the thin field oxide film 403 is left in the peripheral portion of the thick field oxide film 406, as shown. As a result, the switch element region 405 has no size change. Since the thick field oxide film 406 is formed to reach the surface of the quartz carrier layer 401, it is completely optically transparent and can completely isolate the peripheral circuit element group and the switch element group electrically.

Figure 62C:
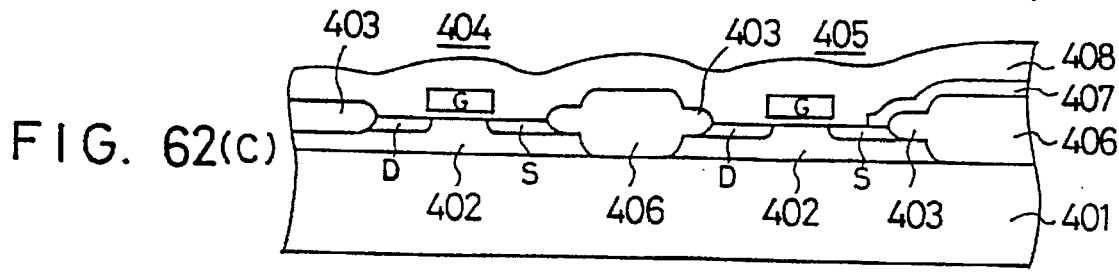

At a final step shown in FIG. 62(C), the circuit element region 404 is formed with the transistor composed of the gate electrode G, the drain region D and the source region S, and the switch element region is also formed with the transistor composed of the gate electrode G, the drain region D and the source region S. These steps are similar to those shown in FIGS. 61(E) to 61(G). A pixel electrode 407 is electrically connected with the source region S of the switch element transistor. Moreover, the composite substrate is covered all over its surface with a transparent passivation film 408.

[Fifty First Embodiment]

Figure 63A:
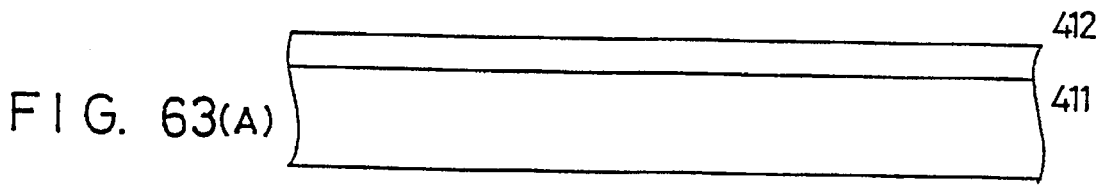
FIGS. 63(A) to 63(C) are process charts showing one embodiment of the present invention.

Next, an embodiment of the present invention will be described in detail with reference to FIGS. 63(A) to 63(C). In the present embodiment, the opaque isolating region is formed of the thin field oxide film, which is obtained by thermally oxidizing the semiconductor single crystal surface portion restrictively and selectively, and the transparent isolating region is formed of the isolating groove which is formed by selectively etching the overall thickness of the semiconductor single crystal thin film. At a first step shown in FIG. 63(A), there is prepared a composite substrate having a structure, in which the carrier layer 411 of a quartz plate and the silicon single crystal thin film 412 are laminated. The process for fabricating that composite substrate is similar to that shown in FIG. 61(A). This silicon single crystal thin film 412 has a thickness of about several microns. A high-temperature treatment has to be accomplished for a long time so as to form a thick transparent field oxide film by thermally oxidizing the overall thickness of the silicon single crystal thin film 412 selectively. In order to convert a silicon single crystal thin film of 2 μm wholly into a thermally oxidized film, for example, a hot-temperature heat treatment at 1,100° C. has to be accomplished continuously for 24 hours. As a result, the forty six and forty seventh embodiments have relatively low fabrication efficiencies. In the present embodiment, therefore, the transparent isolating region is formed of the etching groove in place of the thick field oxide film.

Figure 63B:
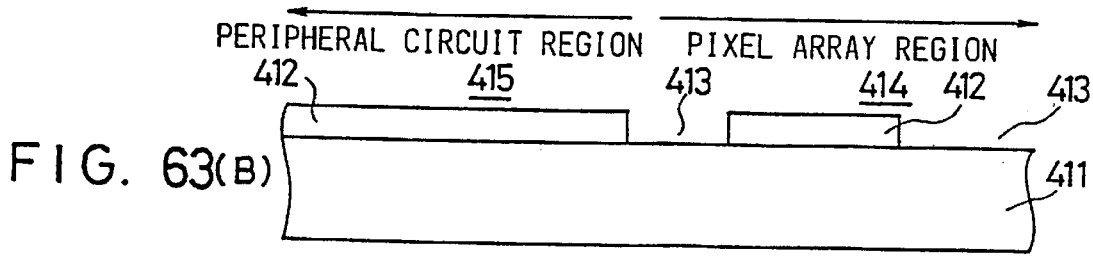

At a step shown in FIG. 63(B), more specifically, the silicon single crystal thin film 412 is selectively etched to form the isolating groove 413. This selective etching can be exemplified by the anisotropic etching process using plasma ions or the like though a mask having a predetermined pattern. The isolating groove 413 is formed only in the optically transparent region at the righthand half of FIG. 63(B) to form the island switch element region 414. On the other hand, the circuit element region 415 is left in the optically opaque region at the lefthand half of FIG. 63(B).

Figure 63C:
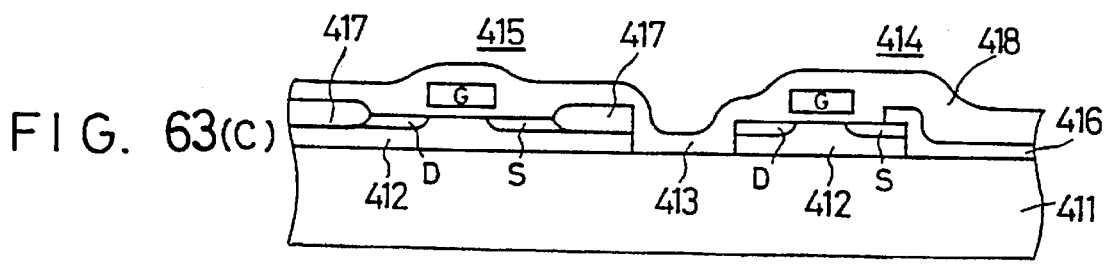

At a final step shown in FIG. 63(C), the island element region 414 is formed with the switch transistor which is composed of the gate electrode G, the drain region D and the source region S. The process for forming the switch transistor is similar to that of the aforementioned examples. Moreover, the pixel electrode 416 is connected with the source region S of the switch transistor. As is apparent from FIG. 63(C), the switch element region 414 is enclosed by the transparent isolating groove and is different from the structure of the foregoing embodiment, in which the switch element region 414 is enclosed by the bird's beak of the thick field oxide film. In the optically opaque region, on the other hand, the thin field oxide film 417 is formed on the silicon single crystal thin film 412 to define the circuit element region 415. This circuit element region 415 is formed of the peripheral circuit element transistor which is composed of the gate electrode G, the drain region D and the source region S. This forming process is similar to that of the foregoing embodiment. Finally, the transistor is covered with the passivation film 418 which is made of a transparent material such as the PSG. The isolating groove 413 is buried by the passivation film.

[Fifty Second Embodiment]

Next, an embodiment of the present invention will be described in detail with reference to FIGS. 64(A) to 64(C). The present embodiment is such an improvement over the embodiment shown in FIGS. 63(A) to 63(C) that the substrate surface is flattened by burying the isolating groove with the oxide film layer. At a first step shown in FIG. 64(A), there is prepared a composite substrate having a laminated structure, in which the quartz crystal film 421 and the silicon single crystal thin film 422 are laminated. This silicon single crystal thin film 422 is subjected to an anisotropic selective etching treatment to form the isolating groove 423. This isolating groove 423 is formed only in the optically transparent region, as located at the righthand side of FIG. 64(A), to define the island switch element region 424.

At a subsequent step shown in FIG. 64(B), the element isolating groove 423 is filled up with a silicon oxide film 425 to flatten the substrate surface. This burial of the silicon oxide film 425 can make use of the deposition of silicon dioxide by the chemical vapor deposition process. Unlike the forty seventh embodiment, the substrate surface is flattened in the present embodiment so that the stepwise cut of the wiring pattern to be formed later can be effectively prevented. If the surface is flat, moreover, the size of the gap from the opposed substrate can be made constant, if the light valve device is incorporated, to stabilize the operating characteristics of the light valve device.

At a final step shown in FIG. 64(C), the island switch element region 424 is formed with the insulated gate field effect transistor. This switch transistor has its source region S connected with a transparent pixel electrode 426. This transparent pixel electrode 426 is formed over the transparent buried oxide film 425. In the optically opaque region at the lefthand half, as shown, a thin field oxide film 427 is formed to define a circuit element region 428, which in turn is formed with a peripheral circuit element composed of the insulated gate field effect transistor by a process similar to the aforementioned embodiment.

[Fifty Third Embodiment]

Next, an embodiment of the present invention will be described in detail with reference to FIGS. 65(A) to 65(C). This embodiment is an improvement over the fifty first embodiment. The improvement resides in that only one portion of the surface of the island element region to be formed with the switch transistor is formed with the field oxide film to stabilize the operating characteristics of the transistor element. FIG. 65(A) is a section taken in the longitudinal direction L of the switch transistor. As shown, the quartz substrate 431 is formed on its surface with an island switch element region 432. This switch element region 432 is obtained by etching the silicon single crystal thin film selectively. The island element region 432 has its surface and sides covered with a gate oxide film 433. The island element region 432 is formed with a drain region D and a source region S, which are spaced at a predetermined gap in the longitudinal direction L. Between these paired impurity-diffused regions, there is formed a channel region. In other words, the longitudinal direction L indicates the channel direction. Over this channel region, a gate electrode G is formed through the gate insulating film 433.

FIG. 65(B) is a section showing the same switch transistor and taken along in the widthwise direction W. As shown, the channel region is formed at its two widthwise sides with thin field oxide films 434. These field oxide films 434 are obtained by thermally oxidizing only the surface portions of the silicon single crystal thin film forming the element region 432.

FIG. 65(C) is a top plan view showing the same switch transistor. As shown, the island element region is formed on its surface with the drain region D, the gate electrode G and the source region S in the recited order in the longitudinal direction L. Moreover, the paired thin field oxide films 434 are formed to define the widthwise size of the channel region just below the gate electrode G. Generally speaking, the etching precision is of the order of 1,000 Å, and the selective thermal oxidation precision is of the order of 100 Å. In the present embodiment, the widthwise size of the channel is defined by the field oxide film of excellent treatment precision. As a result, the operating characteristics of the individual switch transistors can be less dispersed to provide a light valve semiconductor substrate device having a stable operating performance. In case such thin field oxide film is not used, on the other hand, the widthwise size of the channel region is defined by the paired etched end faces of the island element region. Since, however, the etching precision is inferior to the treating precision of the thermal oxidation, a dispersion in the widthwise size of the channel region will result.

[Fifty Fourth Embodiment]

Figure 66:
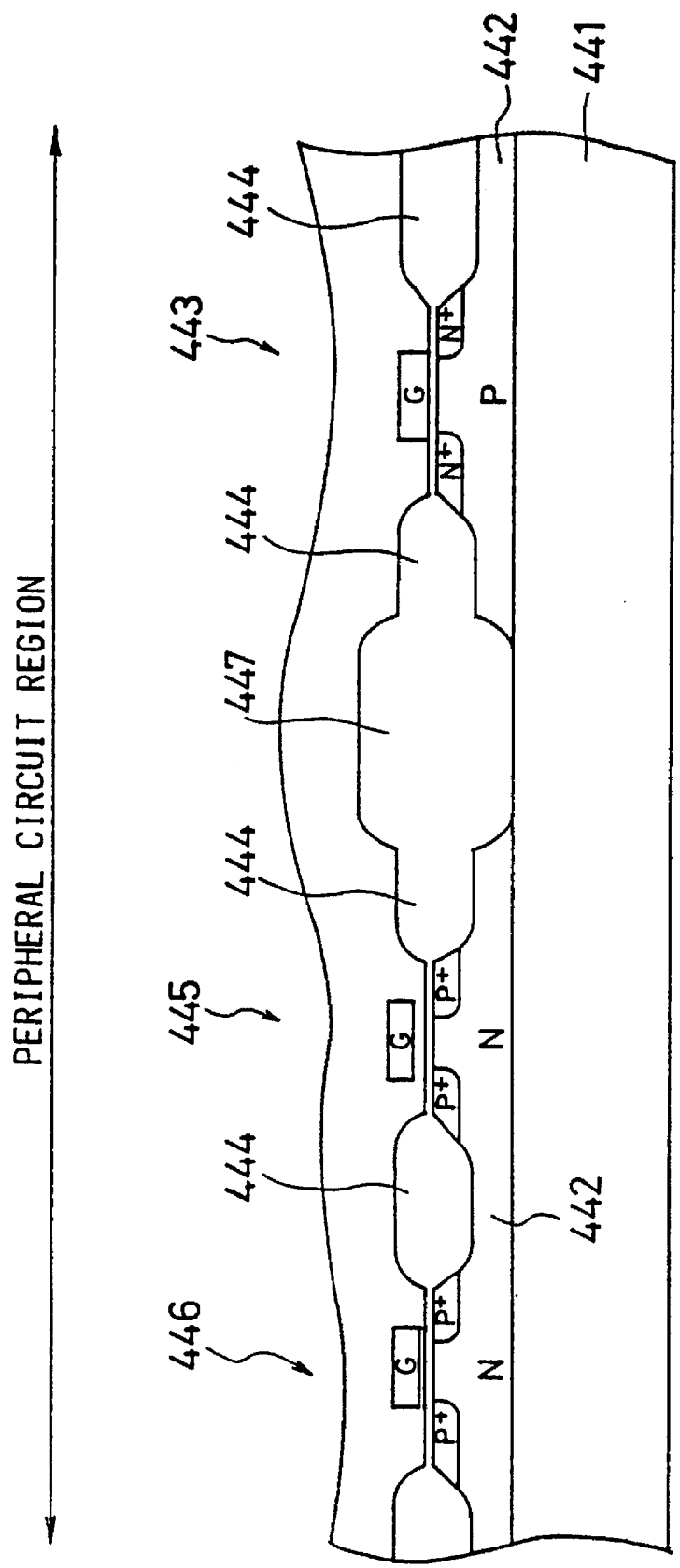
FIG. 66 is a schematic section showing a portion of one embodiment of the light valve substrate semiconductor device.

FIG. 66 shows an embodiment of the present invention. Generally speaking, a circuit element group to be formed in the optically opaque region includes P- and N-type transistor elements. In the present embodiment, the transistor elements of the identical type are isolated by the field oxide film which is thickened to an extent corresponding to the relatively small thickness of the transistor elements, and the transistor elements of the different types are isolated by the overall thick field oxide film which is obtained by thermally oxidizing the semiconductor single crystal film selectively to its overall thickness. Thanks to this structure, the so-called "latch-up" is prevented. As shown in FIG. 66, the silicon single crystal thin film 442 covering the surface the insulating transparent carrier layer 441 is formed with an N-type insulated gate field effect transistor and a P-type insulated gate field effect transistor, which are adjacent to each other. These transistors are arranged in the optically opaque region to constitute the peripheral circuit element group. The N-type transistor 443 is formed in the portion of the silicon single crystal thin film 442 which is doped with a P-type impurity, and is composed of $N^+$-type drain and source regions and a gate electrode. The N-type transistor 443 is formed in the element region which is surrounded by the field oxide film 444 having a relatively small thickness. On the other hand, the P-type insulated gate field effect transistor 445 is formed in the portion of the silicon single crystal thin film 442 which is doped with an N-type impurity. The P-type transistor 445 is composed of $P^+$-type drain and source regions and a gate electrode. The P-type transistor 445 is also formed in the element region which is surrounded by the thin field oxide film 444. Another P-type transistor 446 is formed adjacent to that P-type transistor 445. As shown, the paired P-type transistors 445 and 446 are isolated from each other by the thin field oxide film 444. As a result, the portion of the silicon single crystal thin film 442 doped with the N-type impurity is continuous between the two transistors but raises no problem in electric isolation.

On the other hand, the N-type transistor 443 and the P-type transistor 445 adjacent to each other are completely isolated by the thick field oxide film 447. As a result, the portion of the single crystal thin film 442 doped with the P-type impurity and the portion of the single crystal thin film 442 doped with the P-type impurity are isolated from each other. If the thick field oxide film 447 were not formed to make the N- and P-type regions of the silicon single crystal thin film 442 contiguous to each other, a parasitic thyristor having the NPNP junction structure would be formed between the drain region of the N-type transistor 443 and the P-type transistor 445. Then, the latch-up would occur between the transistors 443 and 445 of the different types to cause the malfunctions of the transistors. In the present embodiment, the thick field oxide film 447 is formed to realize the latch-up free structure by thermally oxidizing the silicon single crystal thin film 442 selectively to the overall thickness.

[Fifty Fifth Embodiment]

Finally, an embodiment of the present invention will be described in detail with reference to FIGS. 67(A) to 67(D). The present embodiment is directed to a process for fabricating a composite substrate which is formed in advance with an island element region. At a first step shown in FIG. 67(A), there is prepared a silicon single crystal plate 451 of high quality made of a silicon wafer or the like for fabricating the LSI. This silicon single crystal plate 451 is formed in its back with a recess 452 by using the anisotropic etching process.

Figure 67A:
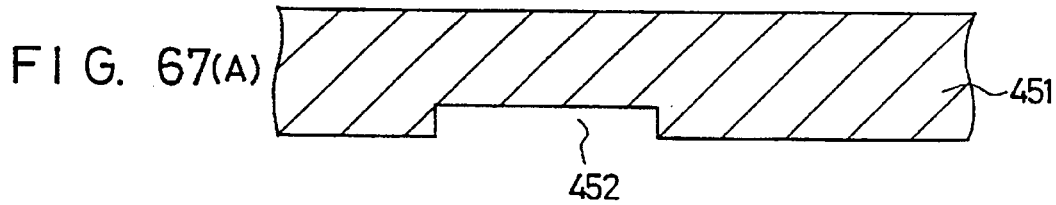
FIGS. 67(A) to 67(D) are process charts showing one embodiment of the present invention.
Figure 67B:
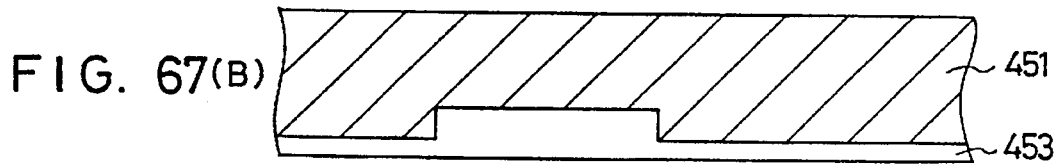

At a subsequent step shown in FIG. 67(B), a silicon dioxide film 453 is deposited all over the back of the silicon single crystal plate 451 by the chemical vapor deposition process. As a result, the recess 452 is filled with the silicon oxide film. Moreover, the silicon oxide film 453 is chemically polished to have its surface flattened.

Figure 67C:
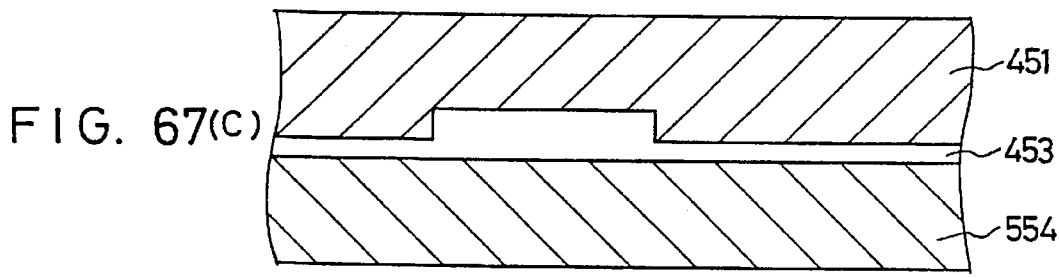

At a step shown in FIG. 67(C), there is prepared an insulating transparent carrier substrate 454 made of quartz. This carrier substrate 454 has its surface smoothly finished and is then thermo-compressively bonded to the silicon oxide film 453.

Figure 67D:
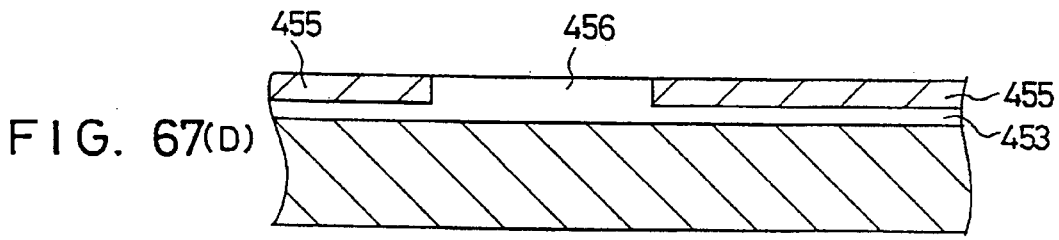

At a last step shown in FIG. 67(D), the silicon single crystal plate 451 is removed by the mechanical or chemical polishing treatment. This polishing treatment is performed until the trapezoidal surface portion of the silicon oxide film 453 is exposed to the outside. As a result, the silicon single crystal thin film 455 thus polished thin is isolated by the exposed silicon oxide film. The composite substrate thus formed by the fabrication process has its surface formed in advance with the element region 455 and a transparent isolating region 456. Moreover, the composite substrate has a remarkably flat surface so that it can contribute to improvement in the yield of the later steps.

As has been described hereinbefore, according to the present invention, the light valve semiconductor integrated circuit substrate device is constructed of the composite substrate which has the semiconductor single crystal thin film formed over the carrier layer. As a result, it is possible to form not only the pixel electrode group and the switch element group for energizing the pixel electrode group selectively in a high density in the optically transparent region of the composite substrate but also the peripheral circuit element group for driving the switch element group in the peripheral, optically opaque region by using the LSI fabrication technology. Especially, the performance of the light valve semiconductor substrate device can be improved by changing the optical or physical characteristics of the element isolating region in the optically transparent region and the element isolating region in the optically opaque region. In the optically transparent region, more specifically, the optical modulation efficiency of the light valve is improved by using the transparent element isolating region. In the optically opaque region, on the other hand, the transparent element isolating region need not be formed so that the integration density of the peripheral circuit element group is improved by making use of the element isolating region which is opaque but has a high precision in size and shape.

[Fifty Sixth Embodiment]

Another embodiment of the semiconductor device of the present invention will be described in detail. FIG. 68 is a section showing the semiconductor device according to the present invention. An integrated circuit is formed over a substrate 461 through an insulating film 462. FIG. 68 is a section showing a portion of a protection circuit for input/ output terminals. An N-type silicon film 464 and an aluminum film 465 forms together a Schottky diode. Another Schottky diode is also formed between an N-type silicon film 467 and an aluminum film 468. One Schottky diode has its aluminum film 468 connected with the ground $V_{SS}$. The individual Schottky diodes have their N-type regions 463 connected with the supply voltage $V_{DD}$. The other Schottky diode has its aluminum film 468 connected with the ground $V_{SS}$. The individual Schottky diodes have their aluminum films 465 and N-type silicon films 466 fed with input/output signals. The substrate 461 may be made of a silicon substrate or can be made of a glass substrate, a quartz substrate or an alumina substrate. The insulating film 462 can be formed of a silicon oxide film, a silicon nitride film, a composite film of the silicon oxide film and the silicon nitride film, and a silicon oxynitride film. The forming process may be exemplified by the thermal oxidation or the CVD process.

FIG. 70 is an electric circuit diagram showing the protection circuit of FIG. 68. This protection circuit is connected between an input/output terminal $V_{IN}$ and the internal circuit of an integrated circuit. If the input/output terminal is fed with a positive excessive voltage such as +200 V, for example, the diode $D_2$ is biased forward to cause a discharge therethrough. If fed with a negative excessive voltage such as −200 V, a diode $D_1$ is biased forward to cause a discharge therethrough. What is important in the present invention is to make it possible to increase capacitances $C_1$ and $C_2$ which are to be connected in parallel with the diode. These capacitances $C_1$ and $C_2$ are the junction capacitances of the Schottky diodes of the present invention. These capacitances can be increased in proportion to the areas of the aluminum electrodes 465 and 468. The junction capacitances can be increased because they can be formed planarly in the surfaces of the silicon semiconductors 464 and 467. Since a resistor R and the Schottky diode capacitances $C_1$ and $C_2$ are inserted into internal circuit, the internal circuit $V_G$ is strong against any breakage because of reduction in the noise level even if noises having a short rising time are fed to the input/output terminal $V_{IN}$. In the present invention, the metal film used in the embodiment of the Schottky diode is the aluminum film but can naturally be exemplified by another metal film.

As has been described above, according to the present invention, the SOI type semiconductor circuit using the thin film semiconductor formed over the insulating film is equipped with the Schottky diodes in its input/output protection circuit so that it can enjoy an effect that the junction capacitances of the diodes can be increased to raise the electrostatic breakdown voltage of the semiconductor device.

[Fifty Seventh Embodiment]

In the present embodiment, the semiconductor single crystal film formed over the carrier layer is formed with not only the driver circuit but also a photo voltaic element capable of detecting a light signal or generating an electric power from an incident light.

Figure 71A:
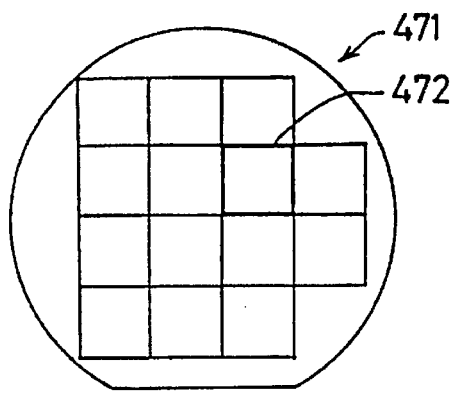
FIG. 71(A) is a top plan view of the substrate.
Figure 71B:
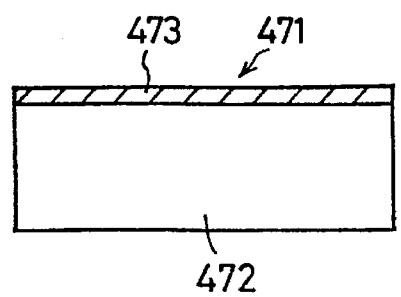
FIG. 71(B) is a schematic section showing the same substrate.

The means for achieving the above-specified object will be described with reference to FIG. 71. FIG. 71(A) is a top plan view showing a substrate 471 to be used in the present invention, and FIG. 71(B) is a section showing the structure of the same. As shown, the substrate 471 has a wafer shape of a diameter of 6 inches, for example. This substrate 471 has a two-layered structure which is composed of: a carrier layer 472 made of quartz or the like; and a single crystal semiconductor layer 473 of silicon or the like formed over the carrier layer 472. The miniaturization semiconductor fabrication technology is applied to the single crystal semiconductor layer 473 to form the drive circuit, the photo voltaic element and the pixel electrode of the active matrix display device for each chip section.

Figure 71C:
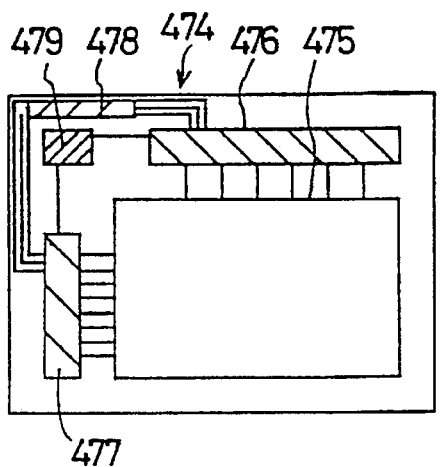
FIG. 71(C) is an enlarged top plan view showing an integrated circuit chip formed over the substrate.

FIG. 71(C) is an enlarged top plan view showing the integrated circuit chip thus obtained. As shown, this integrated circuit chip 474 has a length of 1.5 cm for one side so that it is far small-sized than that of the active matrix display device of the prior art. The integrated circuit chip 474 is composed of: a pixel region 475 formed with miniature pixel electrodes arranged in a matrix shape and insulated gate field effect transistors corresponding to the individual pixel electrodes; an X-driver region 476 formed with a drive circuit, i.e., an X-driver for feeding image signals to the individual transistors; a scanning circuit, i.e., a Y-driver region 477 for scanning the individual transistors sequentially for the lines; a solar cell region 478 formed with a solar cell for generating photo voltaic energy from an incident light; and a light signal detection region 479 for generating clock or synchronous control signals or image signals from the incident light signal. According to the present invention, the single crystal thin film used has a far higher charge mobility and less crystal defects than those of the amorphous thin film or the polycrystal thin film. As a result, there can be formed in the same face as that of the pixel region: the X- nd Y-drivers required to have a high-speed responsiveness; the solar cell having a high photoelectric conversion efficiency; and the light signal detecting element having a high speed and a high photo detect sensitivity. The output of the solar cell is connected with the supply source of the X- and Y-drivers; the image signal from the photo signal detector is connected with the X-driver; and the clock or synchronous control signal is connected with the X- and Y-drivers.

Figure 71D:
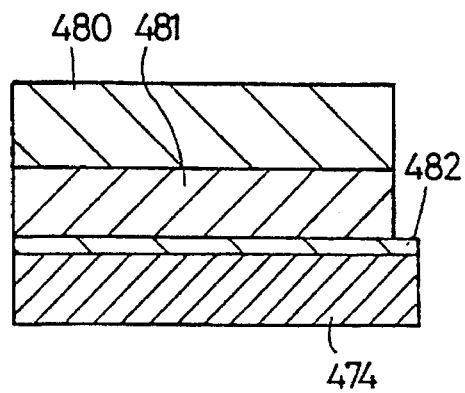
FIG. 71(D) is a schematic section showing a light valve device using the integrated circuit chip over the substrate.

FIG. 71(D) is a section showing the active matrix type light valve device which is assembled in a highly small size with the aforementioned integrated circuit chip 474 and which can optically input the signal and the power supply in a super-high density. As shown, the light valve device is composed of: an opposed substrate 480 opposed at a predetermined gap to the integrated circuit chip 474; and a liquid crystal layer 481 made of an electrooptical material filled in said gap. Incidentally, the integrated circuit chip 474 has its surface covered with an alignment film 482 for aligning the liquid crystal molecules contained in the liquid crystal layer 481. The individual pixel electrodes formed in the pixel region 475 of the integrated circuit chip 474 are selectively excited, when the corresponding transistor elements are turned on, to control the liquid crystal layer 481 thereby to function as the light valve. Since the individual pixel electrodes have a size of about 10 μm, it is possible to provide a remarkably precise active matrix liquid crystal light valve device.

Figure 71E:
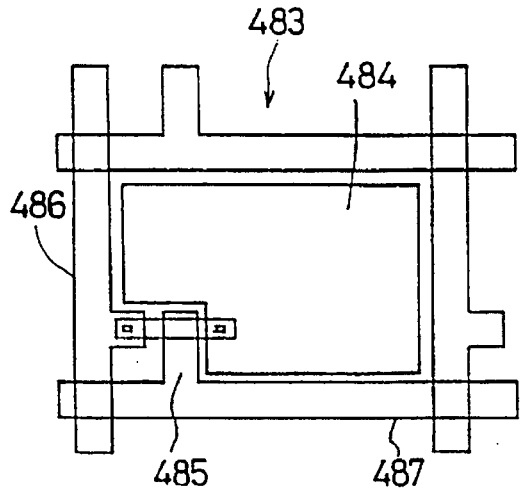
FIG. 71(E) is an enlarged top plan view showing a portion of the pixel region of the semiconductor circuit chip.
Figure 71F:
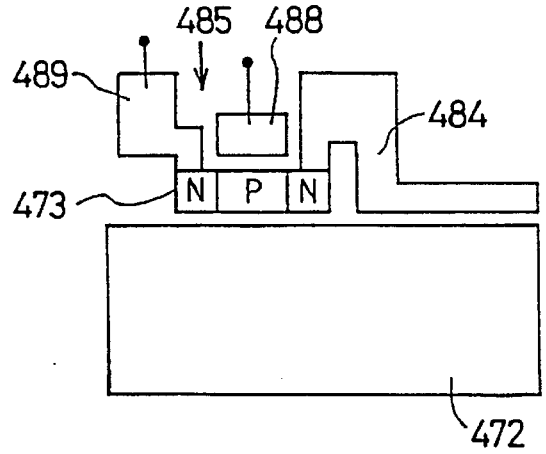
FIG. 71(F) is a schematic section showing the pixel.

FIG. 71(E) is an enlarged top plan view showing a portion of the pixel region 475 shown in FIG. 71(C) and shows one pixel. FIG. 71(F) is a schematic section showing one pixel of the same. As shown, a pixel 483 is composed of: a pixel electrode 484; a transistor 485 for exciting the pixel electrode 484 in response to a signal; a signal line 486 for feeding the signal to said transistor 485; and a scanning line 487 for scanning said transistor. The signal line 486 is connected with the X-driver, and the scanning line 487 is connected with the Y-driver. The transistor 485 is composed of drain and source regions formed in the single crystal thin film 473, and a gate electrode 488 formed over a channel region through a gate insulating film. In short, the transistor 485 is of the insulated gate field effect type. The gate electrode 488 is formed of a portion of the scanning line 487; the source region is connected with the pixel electrode 484; and the drain region is connected with a drain electrode 489. This drain electrode 489 forms part of the signal line 486.

As has been described above, according to the present invention, the miniaturization technology can be applied to the semiconductor single crystal thin film to integrate the pixel electrode, the switching element for driving the pixel, the solar cell, the photo signal detect element and so on. As a result, the integrated circuit chip thus obtained has a remarkably high pixel density and a remarkably small pixel size so that it can construct a miniature light valve device such as an active matrix liquid crystal display which has eliminated or reduced its electric connection terminals from the outside.

[Fifty Eighth Embodiment]

Figure 72:
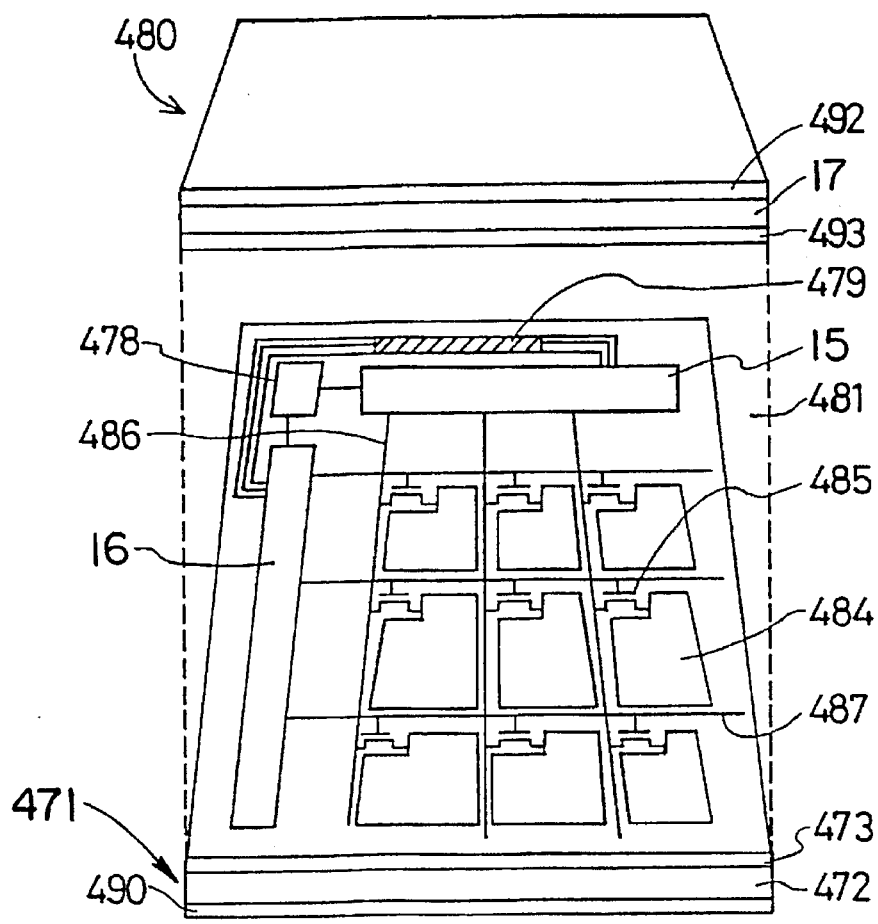
FIG. 72 is an exploded schematic perspective view showing one embodiment of the light valve device.

A preferred embodiment of the present invention will be described in detail with reference to the accompanying drawings. FIG. 72 is a schematic exploded perspective view showing one embodiment of the light valve device according to the present invention. As shown, this light valve device is composed of: a drive substrate 471; an opposed substrate 480 opposed to said drive substrate; a liquid crystal layer 481 such as an electrooptical material layer arranged between said drive substrate 471 and said opposed substrate 480. The drive substrate 471 is formed with: a pixel electrode or drive element 484 for defining a pixel; a drive circuit for exciting the drive electrode 484 in response to a predetermined signal; a solar cell 478 for supplying the drive circuit with an electric power; and a light signal detect element 479 for converting an incident light signal into an electric signal to feed the drive circuit with the electric signal.

The drive substrate 471 has a two-layered structure which is composed of a carrier layer 472 of quartz and a single crystal silicon semiconductor film 473. In addition, a polarizing plate 490 is adhered to the back of the quartz carrier 472. Moreover, the drive circuit and the photo voltaic element such as the solar cell or the light signal detect element are integrated in the single crystal silicon semiconductor film 473. This integrated circuit includes a plurality of field effect insulated gate transistors 485 arranged in a matrix shape. Each transistor 485 has its source electrode connected with the corresponding pixel electrode 484, its gate electrode connected with a scanning line 487, and its drain electrode connected with a signal line 486. The integrated circuit further includes an X-driver 15 which is connected with the column signal line 486. Further included is a Y-driver 16 which is connected with the row scanning line 487. On the other hand, the opposed substrate 480 is composed of: a glass carrier 17; a polarizing plate 492 formed on the outer face of the glass carrier 17; and an opposed or common electrode 493 formed on the inner face of the glass carrier 17.

Figure 73:
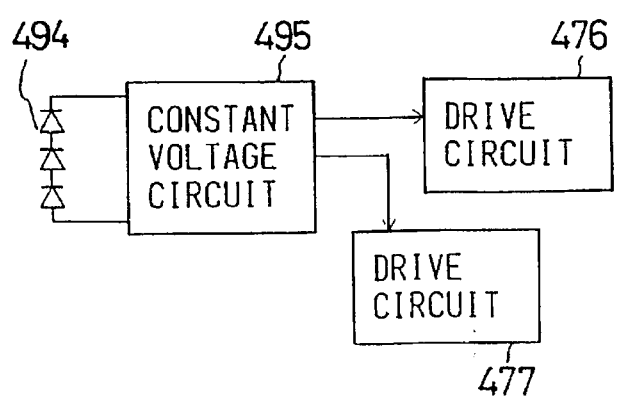
FIG. 73 shows one embodiment of a solar cell circuit.
Figure 74:
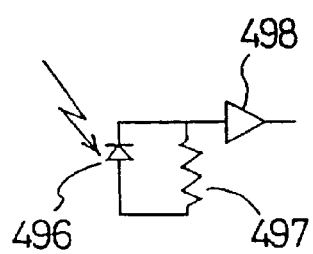
FIG. 74 shows one embodiment of a light signal detect circuit.

Next, the operations of the aforementioned embodiment will be described in detail with reference to FIG. 72. Each transistor element 485 has its gate electrode connected with the scanning line 487 so that the individual transistor elements 485 are turned on or off in the order of the lines which are fed with the scanning signal by the Y-driver 16. A display signal to be outputted from the X-driver 15 is fed through the signal line 486 to the selected transistor 485 in the conductive state. The display signal thus fed is transmitted to the corresponding pixel electrode 484 to excite the pixel electrode so that the liquid crystal layer 481 is operated to have a transparency of substantially 100%. On the other hand, the transistor element 485 is rendered inconductive, when unselected, to hold the display signal written in the pixel electrode as charges. Incidentally, the liquid crystal layer 481 has a high specific resistance and usually operates to have a capacitance. These drive transistor elements 485 use ON/OFF current ratios for expressing the switching performance. The current ratios necessary for the liquid crystal operations can be easily determined from the write time and the hold time. In case the display signal is a TV signal, for example, its 90% or more for one scanning period of about 60 μsecs has to be written. On the other hand, 90% or more of charges have to be held for one field period of about 16 msecs. As a result, the current ratio must have five figures or more. At this time, the drive transistor elements can retain six figures or more of ON/OFF ratio because they are formed over the single crystal silicon semiconductor film 473 having a remarkably high charge mobility. Thus, it is possible to provide an active matrix type light valve device having a remarkably high signal responsiveness. Simultaneously with this, the peripheral circuits 15 and 16 can be formed over the common single crystal silicon semiconductor film by making use of the high mobility of the single crystal film. Since, moreover, the single crystal silicon semiconductor film has few crystal defects, the solar cell 478 of high efficiency and the light signal detect element 479 excellent in the response speed and the detect sensitivity can be formed over the common single crystal silicon semiconductor film. As shown in FIG. 73, the solar cell 478 is prepared by connecting a plurality of PN junction diodes 494 in series for a necessary voltage or in parallel to increase the area for a necessary current. The electric power extracted from the PN junction diodes 494 are stabilized through a constant voltage circuit 495 and are then supplied to the drive circuits 15 and 16. The light signal detect element 479 also uses a PN junction diode 496 to feed the detected photo current to a resistance element 497, nd the generated voltage is amplified by an amplifier 498. After this, the amplified voltage is fed to the drive circuits 15 and 16. The minimum signals usually required by the drive circuits are exemplified by the signal signals, the synchronous signals for the X-driver and the Y-driver, and the clock signals. The photo detect elements are provided in a number corresponding to those signals. Since the light valve device is usually used in the state of presence of the incident light, a portion of the incident light upon the light valve device can be used as the incident light source of the solar cell, if this solar cell is disposed in the region excepting the pixel or the drive circuit. The input light signal to the light signal detect element is introduced into the individual light detect elements after it has been modulated by a laser diode or a photo diode and then either converged by an optical system using a lens or guided through an optical fiber. If an optical filter fitted for the incident light is disposed over the light detect element, excess light due to disturbances such as stray light can be eliminated to improve the light detecting ability. In order to minimize the number of light inputs, the inputs are restricted to the image signals, and these image signals can be introduced into an image signal processing circuit to generate the synchronous signals for the X-driver and the Y-driver or the clocks. In this modification, the optical input may be only one image signal.

As has been described hereinbefore, according to the present embodiments (in plurality), the light valve device is fabricated by using the integrated circuit chip substrate, in which the pixel electrode, the drive circuit, the power supply circuit using the solar cell, and the incident light signal detect signal are integrated by the semiconductor miniature like technology in the semiconductor single crystal thin film formed over the carrier layer. As a result, there arises an effect capable of providing a light valve device having a remarkably high pixel density. Another effect is to make it possible to provide a remarkably small-sized light valve device which is as small as the integrated circuit chip. Since the integrated circuit technology can be used for the single crystal thin film, there arises an effect capable of easily adding a circuit having a variety of functions matching the LSI. Still another effect is to make it possible to package not only the switching transistors but also the drive circuit, the power supply solar cell and the signal inputting light detect element at the same time by using the single crystal thin film. A further effect is to make it possible to drive the light valve device with no or few electric connections with the light valve device.

[Fifty Ninth Embodiment]

Figure 75:
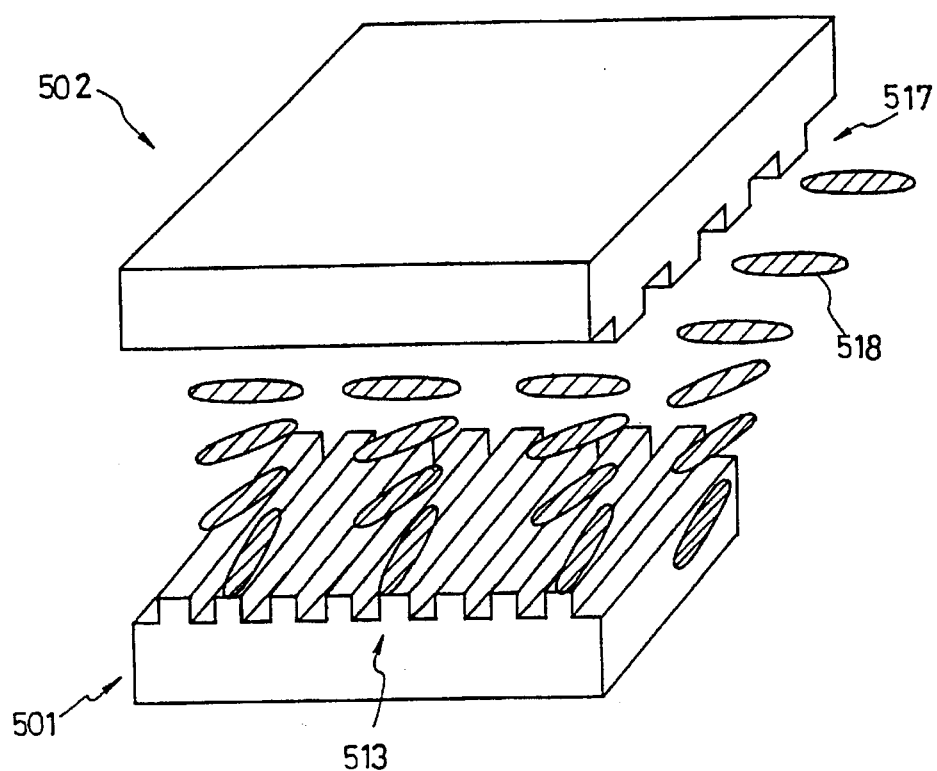
FIG. 75 is a schematic enlarged view showing a portion of one pixel portion cut away from a liquid crystal light valve device.

FIG. 75 is an enlarged schematic view showing a portion of the liquid crystal light valve device, i.e., one pixel region portion. In this embodiment, the liquid crystal layer used is exemplified by a nematic liquid crystal material. Nematic liquid crystal molecules 518 are characterized by having their major axes aligned easily. A composite substrate 501 is formed in its pixel region with alignment means 513. This alignment means 513 is composed of grooves which are arrayed in the longitudinal direction and at a constant spacing to establish the longitudinally aligned state of the liquid crystal molecules 518. In other words, the liquid crystal molecules 518 existing in the vicinity of the surface of the composite substrate 501 are arrayed along the grooves. As has been described hereinbefore, according to the present invention, the pixel size can be miniaturized by using the LSI fabrication technology such that the pixel region has its size set to a square of 10 μm. In this case, the gap or pitch of the arrayed grooves is preferably about 1 μm. This miniature pitch pattern can be formed by the photolithography or etching process. Specifically, the pixel region is covered with a photo resist and is then exposed and developed by using a predetermined mask pattern. After an unset portion of the photo resist has been removed, the grooves can be formed in the surface of the pixel region by the anisotropic etching process. For a high-precision patterning, the exposure source may be preferably exemplified by an ultraviolet ray or X ray.

An opposed substrate 502 also has its inner surface formed with an alignment layer 517. In the present embodiment, this alignment layer 517 is also formed of grooves arrayed at a constant pitch. However, these grooves are arrayed in the transverse direction. As a result, the liquid crystal molecules 518 existing in the vicinity of the surface of the opposed substrate 502 are arrayed in the transverse direction. Since the upper and lower substrates have different alignment directions of 90 degrees, as shown, the liquid crystal molecules 518 are accordingly turned by 90 degrees. The so-called "twist alignment" of the nematic liquid crystal is established. As a result, the axis of polarization of the light to pass through the twist nematic liquid crystal layer is turned by 90 degrees.

If an electric field is applied between the pixel electrode and the common electrode, on the other hand, the liquid crystal molecules 518 are aligned in the direction of electric field, i.e., at a normal direction to the substrate so that the light shielding properties for the incident light are lost. This transition is optically detected by a pair of polarizing plates which are arranged above and below the liquid crystal layer. In other words, the incident light to transmit through the pixel region is passed or shielded depending upon whether or not the voltage is applied. Thus, the twist nematic liquid crystal layer accomplishes the electrooptical modulation for each pixel region.

[Sixtieth Embodiment]

Figure 76:
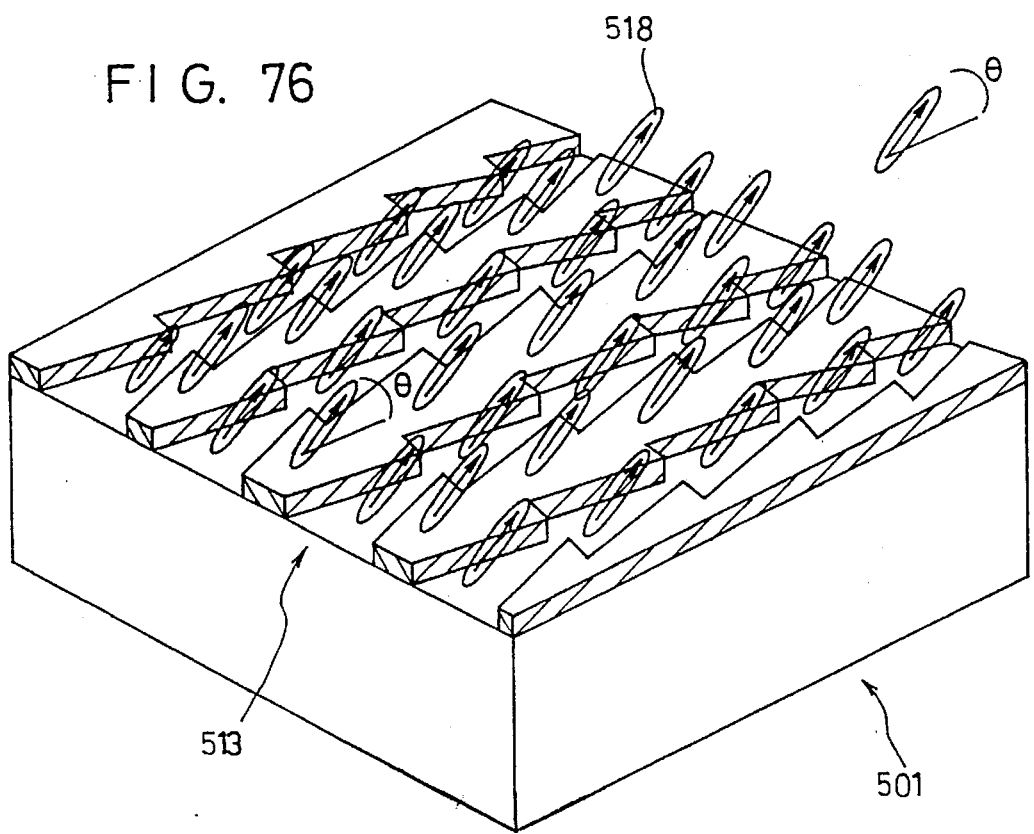
FIG. 76 is a schematic view showing an example of the surface structure of alignment means.

FIG. 76 is a schematic view showing an improved modification of the alignment means. One pixel portion of the composite substrate 501 is extracted and is shown in an enlarged scale. In the present embodiment, too, the alignment means 513 is composed of grooves which are formed in the surface of the pixel region. These grooves are arrayed in one direction and at a constant spacing. As a result, the liquid crystal molecules 518 are uniaxially arrayed in the extending direction of the grooves. The groove gap is set at 1 μm, for example. As is apparent from FIG. 76, the width size of each groove is periodically changed in the extending direction of the grooves, i.e., in the arrayed direction of the liquid crystal molecules 518. By thus changing the groove widths periodically, the liquid crystal molecules 518 are aligned at a predetermined angle of inclination, i.e., a tilt angle θ with respect to the surface of the substrate 501. In other words, it is possible to realize the uniaxial tilt alignment state of the liquid crystal molecules. The pattern shape of the alignment means 513, as shown in FIG. 76, can be made by using the miniature photolithography and etching process. Alternatively, the pattern shape can also be formed by irradiating an energy beam along the grooves and by changing the intensity of the energy beam periodically. As a matter of fact, the alignment means 513 is formed in the film existing on the surface of the pixel region. This film is formed by applying a polyimide film, for example. Alternatively, the alignment means 513 may be formed over a passivation film made of a silicon nitride film or a silicon oxide film. Moreover, the alignment means 513 may be formed over the surface of the ITO film which forms the pixel electrode defining the pixel region.

The aforementioned tilt alignment of the liquid crystal molecules is accomplished for setting the conditions, under which the liquid crystal molecules are erected to some extent for making constant the direction in which the liquid crystal molecules are raised in response to an electric field. In the ordinary twist nematic liquid crystal, the tilt angle θ may be set at several degrees. If, however, the twist angle is increased as in the so-called "super-twist nematic liquid crystal", the tilt angle has to be set at 5 degrees or more. The tilt angle θ of the liquid crystal molecules can be set to a desired value by suitably setting the pitch of the grooves forming the alignment means 513 and the changing period of the groove width. Thus, the embodiment shown in FIG. 76 is effective especially for the light valve device which uses the super-twist nematic liquid crystal.

[Sixty First Embodiment]

Figure 77:
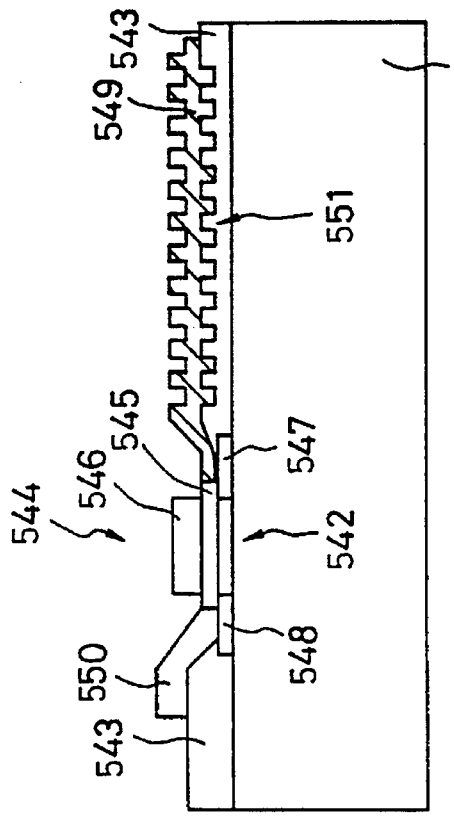
FIG. 77 is a schematic section showing a portion of a specific example of the alignment means.

Next, the specific structure of the alignment means according to the present invention will be described with reference to FIGS. 77 to 80. FIG. 77 is a schematic section showing an embodiment, in which the pixel electrode has a regularly corrugated surface, and shows one pixel region taken from the composite substrate. As shown, the quartz substrate has its surface covered with a silicon single crystal thin film 542. This silicon single crystal thin film 542 is selectively thermally oxidized to have its portion converted into a field oxide film 543. The left portion of the silicon single crystal thin film 542 defines the element region to form a switch element 544. This switch element 544 has a gate electrode 546 which is arranged through a gate insulating film 545 over the silicon single crystal thin film 542 left in an island shape. This silicon single crystal thin film 542 has its righthand portion formed with a source region 547 by diffusing an impurity thereinto. On the other hand, the lefthand side is also formed with a drain region 548 by diffusing an impurity thereinto. These gate electrode 546, source region 547 and drain region 548 constitute altogether the switch element 544 composed of an insulated gate field effect transistor. The field insulating film 543 has its surface formed with a transparent pixel electrode 549 made of the ITO or the like. The pixel electrode 549 has its one end connected electrically with the source region 547 of the transistor and further with the drain region 548 to form a drain electrode 550.

In the embodiment shown in FIG. 77, alignment means 551 are formed of regular corrugations on the surface of the pixel electrode 549. These regular corrugations are grooves which are arrayed in one direction and at a constant gap. The groove gap is set at 1 to 2 μm, and the groove depth is set at 200 to 2,000 Å. This groove pattern can be easily formed by using the photolithography and the anisotropic etching process.

Figure 78:
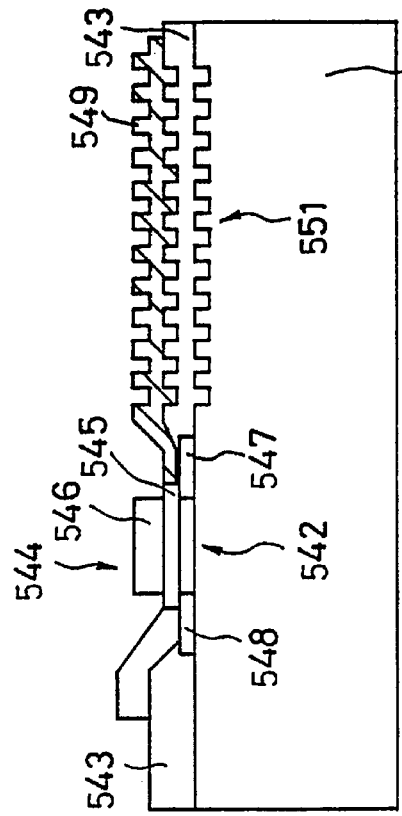
FIG. 78 is a schematic section showing a modification of the alignment means.

Next, a modification is shown in FIG. 78. The components identical to those shown in FIG. 77 are designated at the common reference numerals, and their descriptions will be omitted. What is different from the embodiment shown in FIG. 77 resides in that the alignment means 551 is formed not in the surface of the pixel electrode 549 but in the surface of a passivation film 552. This passivation film 552 is made of a silicon nitride film or a silicon oxide film to passivate a switch element 544 intrinsically. In this embodiment, the passivation film 552 is extended to the pixel region defined by a pixel electrode 549. This passivation film 552 is subjected to the photolithography and the anisotropic etching process to form the alignment means 551 composed of a plurality of grooves.

Figure 79:
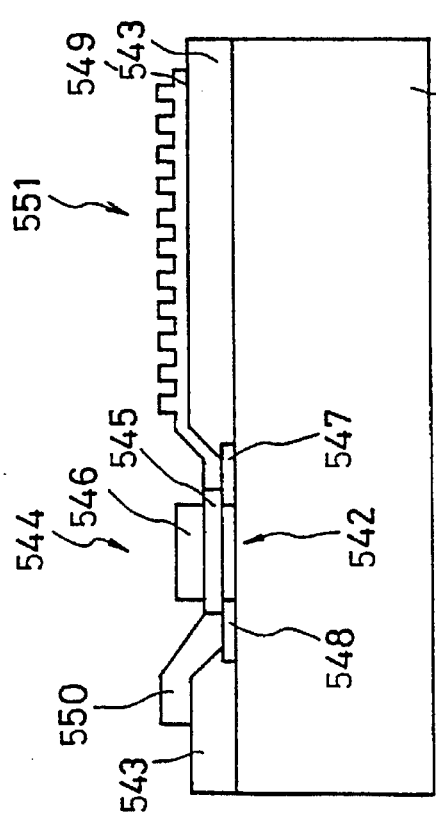
FIG. 79 is a schematic section showing another modification of the alignment means.

FIG. 79 shows another modification. The components identical to those of the embodiment shown in FIG. 77 are designated at the common reference numerals, and their descriptions will be omitted. What is different from the embodiment shown in FIG. 77 resides in that the alignment means 551 are formed of regular corrugations formed in the surface of the field oxide film 543. Specifically, before the pixel electrode 549 is formed, the field oxide film 543 has its surface dug in advance with grooves which are arrayed in a predetermined gap. If the field oxide film 543 formed with the grooves is superposed over the pixel electrode 549, the corresponding grooves are also formed in the surface of the pixel electrode 549.

Figure 80:
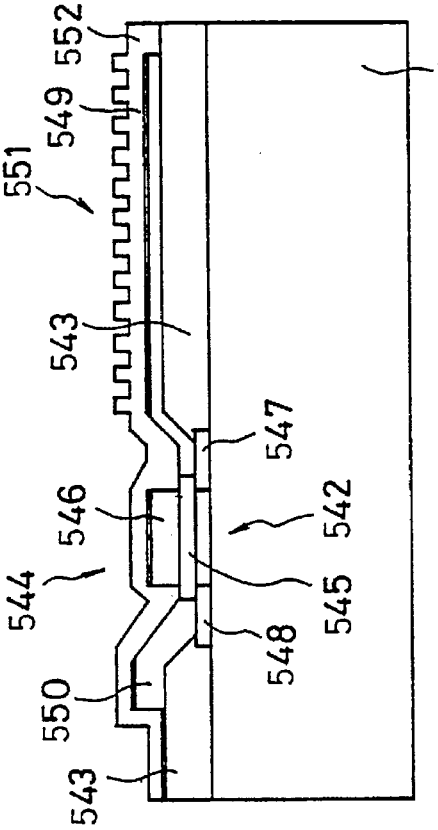
FIG. 80 is a schematic section showing still another modification of the alignment means.

FIG. 80 shows still another modification. The components identical to those of the embodiment shown in FIG. 77 are designated at the common reference numerals, and their descriptions will be omitted. What is different from the embodiment shown in FIG. 77 resides in that the alignment means 551 is formed in advance in the surface of the quartz substrate 541. If, the field oxide film 543 is superposed on the surface of the quartz carrier layer 541 having the grooves, as shown, the field oxide film 543 is also formed with the corresponding corrugations. If the pixel electrode 549 is superposed along the corrugations, the corresponding corrugations appear in the surface of the pixel electrode 549. As a matter of fact, the liquid crystal molecules are arranged by the corrugations. If the quartz substrate 541 thus has its surface dug with the grooves, the alignment means 551 can be automatically formed without any special treatment for forming the alignment step at an intermediate step.

[Sixty Second Embodiment]

Finally, a process for fabricating the liquid crystal light valve device according to the present invention will be described with reference to FIGS. 81(A) to 81(G). At a step shown in FIG. 81(A), there are prepared a quartz substrate 561 and a single crystal silicon substrate 562. This single crystal silicon substrate 562 is preferably made of a silicon wafer of high quality used for fabricating the LSI and has a crystal azimuth of uniformity within a range of <100> 0.1±1.0 and a single crystal lattice defect density of 500/cm² or less. The quarts substrate 561 and silicon wafer 562 thus prepared have their surfaces smoothed and finished precisely. Subsequently, the quartz substrate and the silicon wafer are thermo-compressively bonded to each other by superposing and heating the smoothly finished two sides. By this thermo-compressive bonding process, the quartz substrate 561 and the silicon wafer 562 are fixedly bonded to each other.

Figure 81A:
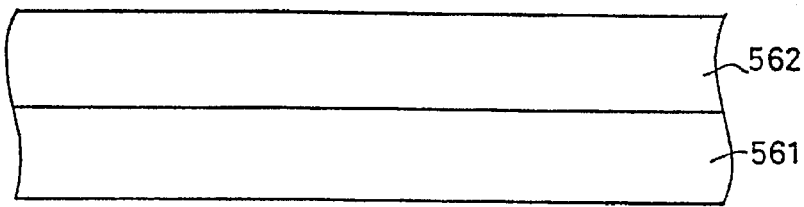
FIGS. 81(A) to 81(G) are flow charts showing a process for fabricating the semiconductor single crystal thin film substrate liquid crystal light valve device.
Figure 81B:
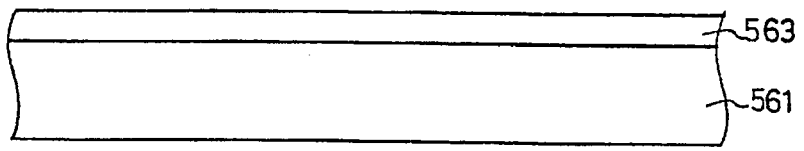

At a subsequent step shown in FIG. 81(B), the surface of the silicon wafer is polished. As a result, the quartz substrate 561 is formed on its surface with a silicon single crystal thin film 563 which is polished to a desired thickness (e.g., several microns). Incidentally, the silicon wafer may be thinned by an etching treatment in place of the polishing treatment. Since the silicon single crystal thin film 563 thus obtained retains the quality of the silicon wafer substantially as it is, it is possible to obtain a semiconductor substrate material which is remarkably excellent in the uniformity of the crystal azimuth and in the lattice defect density.

Figure 81C:
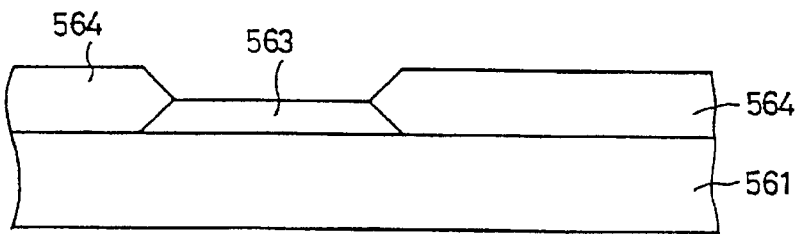

At a subsequent step shown in FIG. 81(C), the silicon single crystal thin film 563 is selectively subjected to the thermal oxidation. This thermal oxidation is accomplished through a mask covering only the element region to be formed with the switch element transistor, to form a field oxide film 564 around the element region. This field oxide film 564 is obtained by thermally oxidizing the silicon single crystal thin film 563 completely to its overall thickness so that it is optically transparent to form an ideal element isolating region.

Figure 81D:
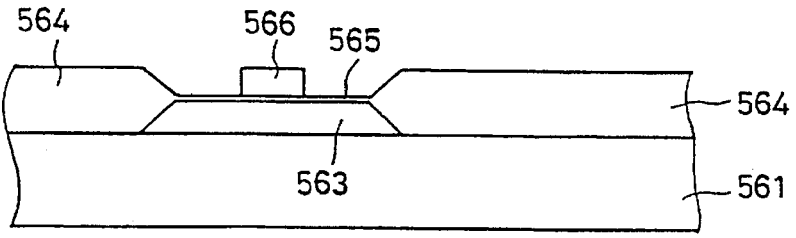

At a subsequent step shown in FIG. 81(D), the silicon single crystal thin film 563 left in the element region has its surface subjected again to a thermal oxidation treatment. As a result, the silicon single crystal thin film has its surface formed with a gate insulating film 565 having a remarkably thin thickness. Moreover, a silicon polycrystal thin film is deposited on the substrate surface by the chemical vapor deposition process, for example. This polycrystal thin film is etched through a mask treated to a desired pattern, to form a gate electrode 566.

Figure 81E:
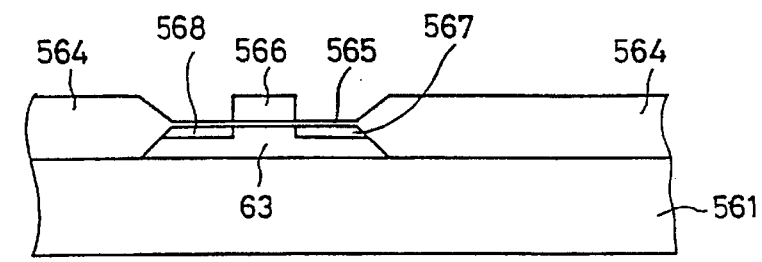

At a step shown in FIG. 81(E), moreover, an impurity introduction is carried out. For example, an ion implantation is carried out to dope the silicon single crystal thin film 563 with an ionized impurity through the gate insulating film 565 by using the gate electrode 566 as a mask. As a result, a source region 567 and a drain region 568 are formed, as shown.

Figure 81F:
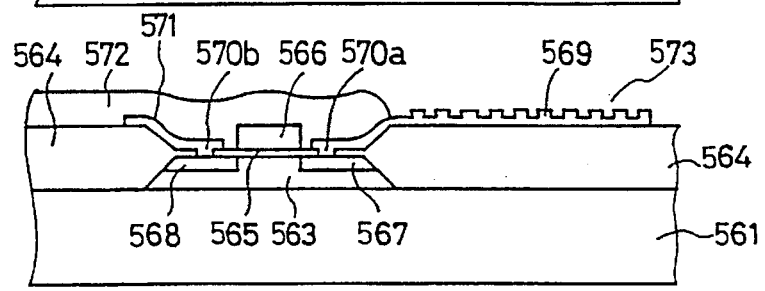

At a step shown in FIG. 81(F), a pixel electrode 569 is laminated on the surface of the field oxide film 564. The pixel electrode 569 has its one end connected electrically with the source region 567 through a contact hole 570a formed in a portion of the gate insulating film 565. A signal line 571 is also formed and electrically connected with the drain region 568 through a contact hole 570b. Subsequently, the substrate surface is covered with a transparent passivation film 572 made of the PSG or the like. Thus, the switch element transistor is completed. However, the pixel electrode 569 has its surface not covered with the transparent passivation film 572 but exposed to the outside. This exposed surface is formed with regular corrugations, i.e, linear grooves having a constant pitch to provide alignment means 573.

[Sixty Third Embodiment]

Figure 82:
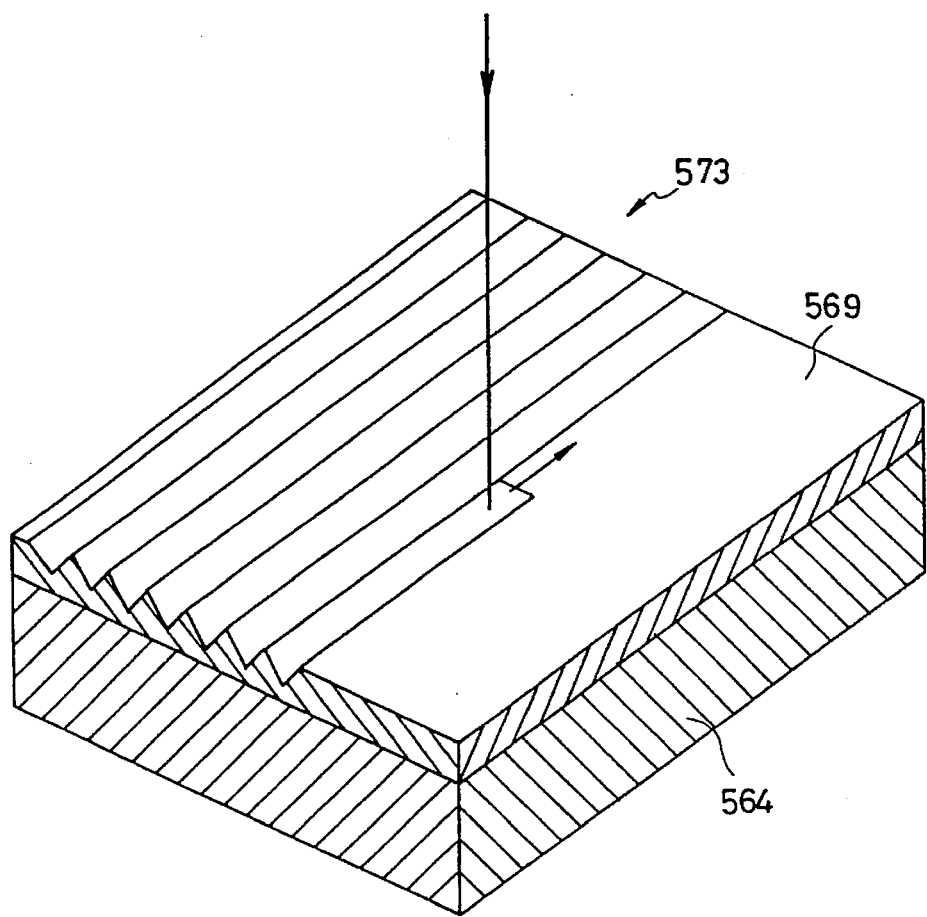
FIG. 82 is a schematic view for explaining a process for forming line grooves constituting the alignment means.

The process for forming those linear grooves will be described with reference to FIG. 82. In this embodiment, a surface treatment is utilized by using the sweep irradiation of an energy beam. The energy beam used is exemplified by the laser beam, the ion beam or the electron beam. This energy beam is raster-scanned to irradiate the surface of the pixel electrode. As a result, the pixel electrode surface is treated to form the linear grooves along the sweeping loci of the energy beam. In case the laser beam is sued, for example, the irradiated portion is heated and melted so that it can be thermally deformed to form the grooves. Alternatively, the laser beam of high energy may be emitted to irradiate and evaporate the atoms existing in the pixel electrode surface so that chemical reactions with the ambient gases may be promoted to form the grooves. In case the ion beam is used, on the other hand, the pixel electrode 569 has its surface selectively sputtered and etched to form the grooves along the irradiation loci. Alternatively, the thermal deformation may be caused like the laser beam to form the grooves. In another embodiment, the pixel electrode 569 may have its surface covered with a polyimide film and then swept and irradiated with the electron beam to form the grooves. This polyimide is excellent especially as a liquid crystal alignment material. If the grooves are thus formed by the irradiation with the energy beam, the pixel region can be selectively subjected to a surface treatment so that the switch element in the neighborhood is not damaged. Since, moreover, the energy beam irradiation is conducted to the substrate set in the vacuum chamber, the substrate surface can be kept clean without no attack of dust or fluff. It is quite natural that the energy beam irradiation can be replaced by the aforementioned combination of the photolithography and the anisotropic etching process to form the linear grooves.

Figure 81G:
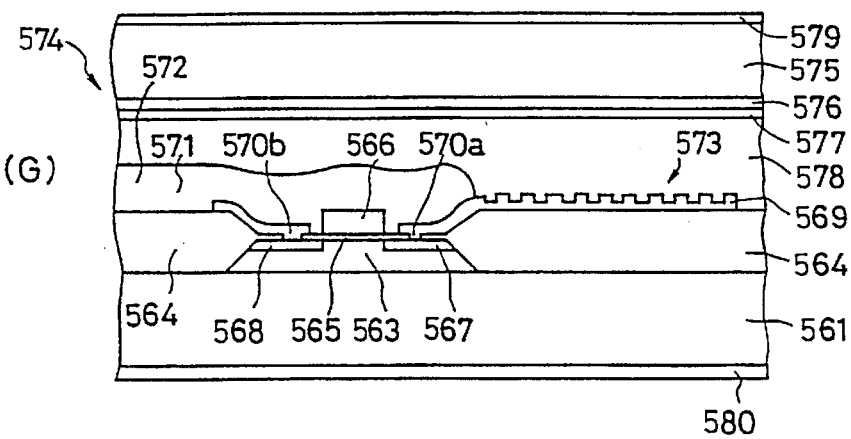

Reverting to FIG. 81(G), the step of assembling the liquid crystal panel will be finally described. An opposed substrate 574 is prepared separately of the completed composite substrate. This opposed substrate 574 is composed of: a glass carrier 575; a common electrode 576 formed on the surface of the carrier 575; and an alignment film 577 covering the surface of the common electrode 576. This alignment film 577 is obtained by applying a polyimide film of about 50 nm, for example, and subsequently by rubbing it. Alternatively, like the alignment means 573, the miniature surface treatment may be used to form the surface of the common electrode 576 directly with linear grooves having a regular pitch. If the regular linear grooves are used, a uniform alignment can be achieved to prevent the defects effectively. Next, the composite substrate 561 and the opposed substrate 574 are fixedly adhered to each other through a predetermined gap. In order that the substrates may be adhered to each other at their peripheries, one substrate has its periphery printed with a seal member (although not shown) of an epoxy resin. However, an opening is formed in advance for confining a liquid crystal later. Into the seal member, there are mixed spacer particles for controlling the gap between the paired substrates. In order to uniform that gap, moreover, the substrate surface is scattered with the spacer particles. These spacer particles may preferably be scattered avoiding the pixel region. After the paired substrates have been thermo-compressively bonded by the seal member, the gap between the substrates is filled up with a liquid crystal 578. This filling operation of the liquid crystal is accomplished by dipping the filling holes of the liquid crystal panel in the liquid crystal in the vacuum chamber. If this vacuum chamber is then evacuated to the atmosphere, the liquid crystal is forced to steal into the panel by the external pressure. After this, the panel is heated to a temperature higher than the clearing point of the liquid crystal and is then cooled down. Then, the liquid crystal molecules are given a predetermined alignment by the alignment means 573 and the alignment film 577. Finally, a pair of polarizing plates 579 and 580 are adhered to the outer surface of the liquid crystal panel to complete the light valve device.

According to the present invention, the alignment of the liquid crystal layer is controlled by using the regular corrugations which are formed selectively in the pixel region defined by the miniaturized pixel electrode. As a result, unlike the rubbing treatment of the prior art, there is no fear that the switch element arranged in the vicinity of the pixel region is damaged. Another effect is to make it possible to accomplish the alignment control without being adversely affected by the corrugations of the semiconductor substrate formed with the element. Since the regularly corrugated surface is formed by the photolithoetching or the energy beam irradiation, according to the present invention, there arises an effect that neither dust nor fluff is generated to eliminate the alignment defect substantially unlike the rubbing method of the prior art. Since the alignment film is formed by the excellently precise surface treatment, there arises another effect capable of controlling a liquid crystal alignment which is excellent in uniformity and reproductivity.

[Sixty Fourth Embodiment]

Figure 83:
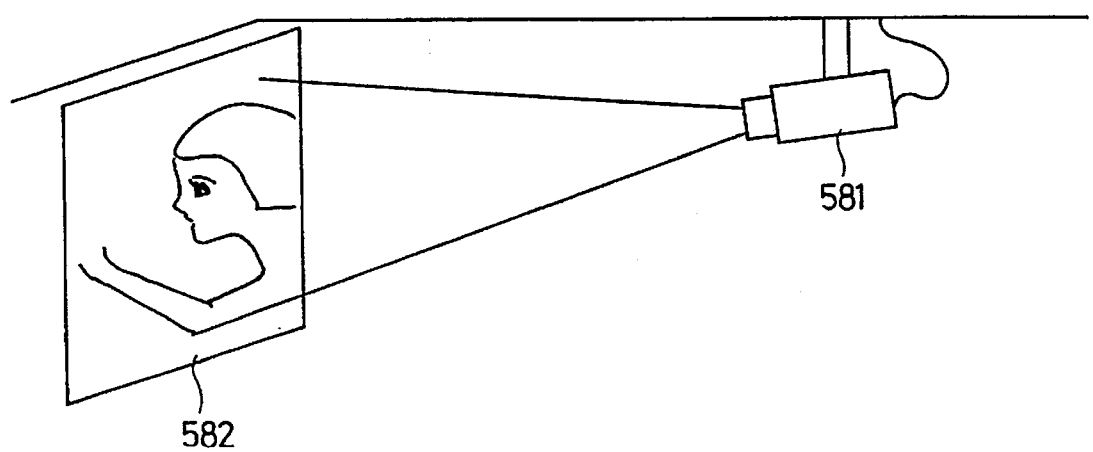
FIG. 83 is a conceptional diagram showing a video projector.
Figure 84:
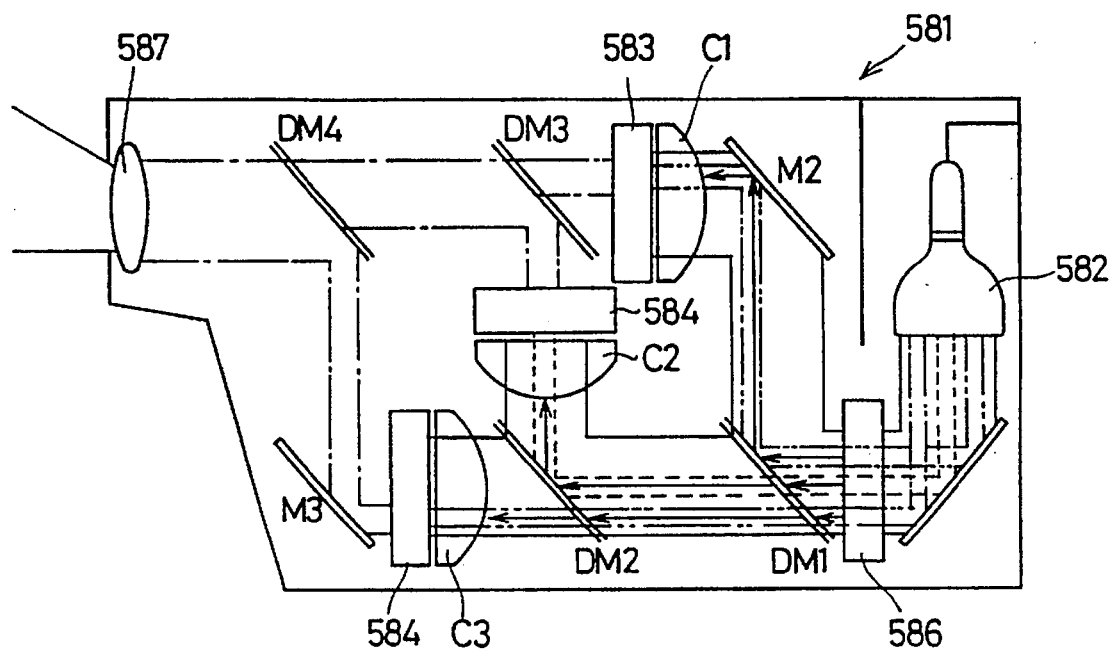
FIG. 84 is a schematic enlarged section showing a video projector using a light valve device according to the present invention.

FIG. 84 is a schematic enlarged section showing a video projector shown in FIG. 83. This video projector 581 has three active matrix transparent type light valve devices 583 to 585 packaged therein. A white light emitted from a white light source lamp 582 is reflected by a reflecting mirror M1 and is resolved into red, blue and green colors by a trichromatic resolving filter 586. The red light, which is selectively reflected by a dichroic mirror DM1, is reflected by a reflecting mirror M2 and is condensed into the first light valve device 583 by a condenser lens C1. The red light, which has been modulated by the light valve device 583 in accordance with the video signals, is allowed to pass through the dichroic mirrors DM3 and DM4, is enlarged and projected on the front through a magnifying lens 587. Likewise, the blue light having passed through the dichroic mirror DM1 is selectively reflected by a dichroic mirror DM2 and is condensed by a condenser lens C2 until it goes into the second light valve device 584. The blue light is modulated by the second light valve device 584 in accordance with the video signal and is then guided into the common magnifying lens 587 through dichroic mirrors DM3 and DM4. Moreover, the green light is passed through the dichroic mirrors DM1 and DM2 and is then condensed by the condenser lens C2 until it is guided into the third light valve device 585. The green light is modulated by the third light valve device 585 in accordance with the video signal and is reflected by the reflecting mirror M3 and the dichroic mirror DM4 so that it is guided into the magnifying lens 587. The three primary colors thus individually modulated by the three light valve devices are finally composed and projected in an enlarged secondary image on the front by the magnifying lens 587. The light valve devices sued have sizes of the order of centimeters so that the various optical parts and the white lamps can be accordingly small-sized. As a result, the video projector 581 can have its shape and size made far smaller in its entirety than that of the prior art.

[Sixty Fifth Embodiment]

Figure 85:
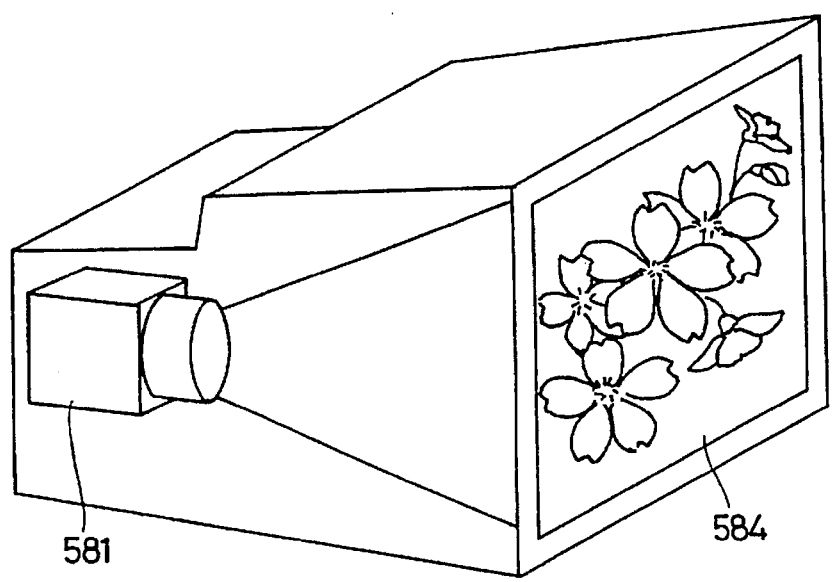
FIG. 85 is a schematic perspective view showing a projection CRT using a light valve device according to the present invention.

FIG. 85 is a schematic perspective view showing an embodiment, in which the video projector 581 shown in FIG. 84 is applied to e projection CRT. In this projection CRT, a screen forming the TV frame is irradiated from the back by the video projector 581 to project an enlarged secondary image 582 on the TV screen. This projection CRT has a super-high resolution and a high luminance. Moreover, the projection CRT can form a completely flat frame and has a remarkably light weight.

[Sixty Sixth Embodiment]

Figure 86:
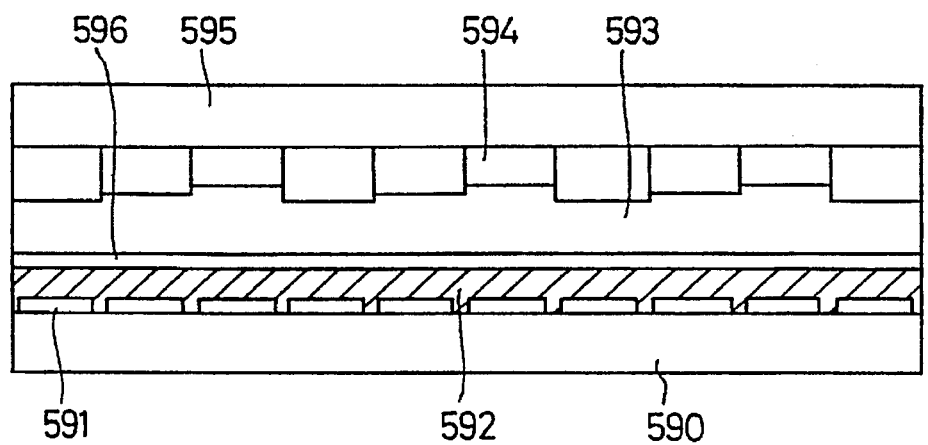
FIG. 86 is a schematic section showing a color display light valve device according to the present invention.

Finally, FIG. 86 is a schematic section showing an application, in which the integrated circuit substrate according to the present invention is sued to constitute a color display device. A plurality of pixel electrodes 591 are formed over an integrated circuit chip substrate 590. Over this integrated circuit chip 590, there is superposed an opposed glass substrate 595 through a predetermined gap. This gap between the two substrates is filled up with a liquid crystal layer 592. The opposed glass substrate 595 is formed in its inner surface with a three-primary color filter 594. This color filter 594 is divided into elements corresponding to the pixel electrodes 591. The color filter 594 is coated with an over coating 593. This over coating 593 is formed thereover with a common electrode 596. Thanks to this structure, the liquid crystal layer 592 is sandwiched between the common electrode 596 and the pixel electrodes 591 and is selectively driven by the electric field. The process for forming the color filter 594 used is exemplified by a dying process which has a high color purity and an excellent pattern precision. This dying process is accomplished by dying an organic substrate selectively with red, green and blue dye stuffs by the photolithographies of three times.

Moreover, the color display device can also be achieved by forming the three-primary color filters on the pixel electrodes 591 over the integrated circuit substrate 590 by the electrolytic deposition.

[Sixty Seventh Embodiment]

Figure 87:
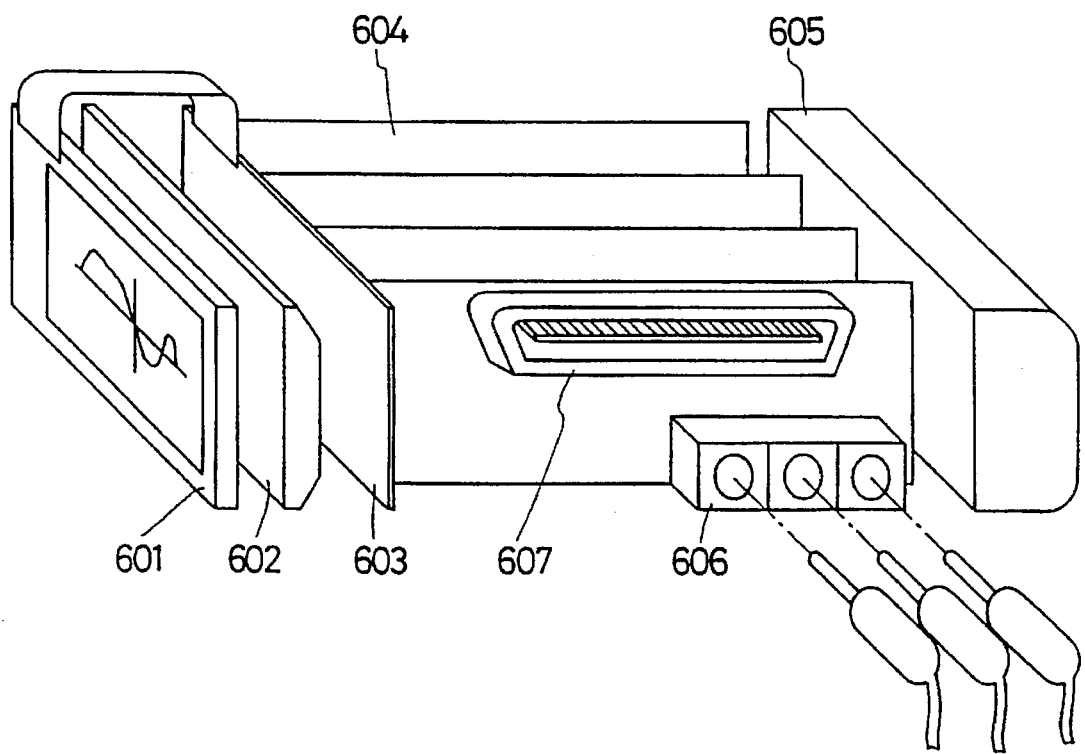
FIG. 87 is a schematic view showing an application of a light valve device according to the present invention to a display unit of a measuring device.

FIG. 87 is a schematic diagram showing an embodiment, in which the light valve device according to the present invention is applied to the display unit of a measuring device.

What is claimed is:

1. A process for fabricating a light valve substrate semiconductor device comprised of a composite substrate having an electric insulating substrate and a semiconductor single crystal thin film, and a pixel array portion formed over the composite substrate and including a group of switch elements for selectively energizing a group of pixel electrodes, the process comprising:

a first step of forming a semiconductor single crystal thin film by adhering a semiconductor single crystal plate to the surface of an electric insulating substrate and polishing the single crystal plate;

a second step of forming a group of pixel electrodes and a group of switch elements for selectively energizing the pixel electrodes; and a third step of electrically connecting the individual elements of the pixel array portion.

2. A process for fabricating a light valve substrate semiconductor device according to claim 1; wherein said first step includes forming a stress buffer layer on the surface of the semiconductor single crystal thin film or the electric insulating substrate, and adhering the two substrates by thermo-compressive bonding.

3. A process for fabricating a light valve substrate semiconductor device according to claim 1; wherein the second step includes shaping the surface of the pixel electrodes to form regular concavities and convexities.

4. A process for fabricating a light valve substrate semiconductor device according to claim 1; wherein the second step includes forming an island region by patterning the semiconductor single crystal thin film, forming a PN junction diode by doping a portion of the island region with an impurity, and forming the pixel electrodes by depositing and patterning a conductive material to effect the electric connection with the PN junction diode.

5. A process for fabricating a light valve substrate semiconductor device according to claim 1; wherein the second step includes forming the pixel electrodes of a semiconductor polycrystal thin film by depositing and patterning the semiconductor polycrystal thin film.

6. A process for fabricating a light valve substrate semiconductor device according to claim 1; wherein the second step includes forming an overall thickness field oxide film by thermally oxidizing the overall thickness of a selected area of the semiconductor single crystal thin film, forming a gate oxide film by thermally oxidizing the surface portion of the semiconductor single crystal thin film which is enclosed by the field oxide film, forming a gate electrode over the oxide film, and forming a source region and a drain region by doping the semiconductor film with an impurity through the gate electrode acting as a mask to form insulated gate field effect thin film transistors made of the semiconductor single crystal thin film as the switch elements.

7. A process for fabricating a light valve substrate semiconductor device according to claim 1; wherein the second step includes forming the pixel electrodes and electrodes of the switch elements continuously of the semiconductor single crystal thin film by patterning the semiconductor single crystal thin film, forming a gate insulating film by thermally oxidizing the surface of the semiconductor single crystal thin film and then forming a gate electrode over the gate insulating film, and forming the switch elements composed of semiconductor single crystal thin film insulated gate field effect thin film transistors and the pixel electrodes in a common step by doping the semiconductor single crystal thin film with an impurity through the gate electrode acting as a mask to form a source region, a drain region, and the pixel electrode contiguous to the drain region.

8. A process for fabricating a light valve substrate semiconductor device according to claim 1; wherein the second step includes depositing a silicon polycrystal thin film, doping the silicon polycrystal thin film with an impurity, and forming the pixel electrodes by patterning the silicon polycrystal thin film to electrically connect the pixel electrodes with the switch elements.

9. A process for fabricating a light valve substrate semiconductor device according to claim 1; wherein the first step includes forming a recess by selectively etching the back of a semiconductor single crystal plate, flattening the back by depositing an oxide film thereon, adhering a transparent electrically insulating substrate to the flattened face, and polishing the semiconductor single crystal plate; and wherein the second step includes polishing the semiconductor single crystal plate precisely till the deposited oxide film has its surface exposed to the outside.

10. A process for fabricating a light valve substrate semiconductor device comprised of a composite substrate having an electric insulating substrate and a semiconductor single crystal thin film, a pixel array portion formed over the composite substrate and including a group of switch elements for selectively energizing a group of pixel electrodes, and a peripheral circuit portion for driving the pixel array portion, the process comprising:

a first step of forming a semiconductor single crystal thin film by adhering a semiconductor single crystal plate to the surface of an electric insulating substrate and by polishing the single crystal plate;

a second step of forming a peripheral circuit portion made of the semiconductor single crystal thin film by treating the semiconductor single crystal thin film;

a third step of forming a group of pixel electrodes and a group of switch elements for selectively energizing the pixel electrodes, the third step being carried out simultaneously with or before or after the second step; and a fourth step of electrically connecting the individual elements of the peripheral circuit portion and the pixel array portion.

11. A process for fabricating a light valve substrate semiconductor device according to claim 10; wherein the second step includes forming a gate insulating film over the surface of the semiconductor single crystal thin film by removing the semiconductor single crystal thin film partially and subjecting the same to a heat treatment, and forming a pattern by covering the gate insulating film with a thin film made of a polycrystal semiconductor or an amorphous semiconductor; and wherein the third step includes forming a gate insulating film over a gate electrode by using the semiconductor polycrystal thin film or the semiconductor amorphous thin film as the gate electrode, forming a semiconductor region by depositing a semiconductor polycrystal thin film and patterning it, and forming a source region and a drain region by doping a selected region of the semiconductor thin film with an impurity to form insulated gate field effect thin film transistors acting as the switch elements.

12. A process for fabricating a light valve substrate semiconductor device according to claim 10; wherein the second step includes forming a gate insulating film over the surface of the semiconductor single crystal thin film by removing the semiconductor single crystal thin film partially and subjecting the same to a heat treatment, forming a pattern to form a gate electrode of the peripheral circuit portion by covering the gate insulating film with a thin film of a polycrystal semiconductor or an amorphous semiconductor, and forming a source region and a drain region by doping the semiconductor single crystal thin film with an impurity through the gate electrode acting as a mask to form insulated gate field effect thin film transistors in the peripheral circuit portion.

13. A process for fabricating a light valve substrate semiconductor device according to claim 10; wherein the second step includes forming an overall thickness field oxide film by thermally oxidizing the overall thickness of a selected area of the semiconductor single crystal thin film; and wherein the third step includes forming a restricted overall thickness field oxide film by thermally oxidizing the surface portion of the selected area of the semiconductor single crystal thin film.

14. A process for fabricating a light valve substrate semiconductor device according to claim 10; wherein the second step includes forming an island element region by selectively etching the overall thickness of the semiconductor single crystal thin film.

15. A process for fabricating a light valve device, comprising:

a first step of forming a semiconductor single crystal thin film to form a composite substrate by polishing a semiconductor single crystal substrate after an electric insulating substrate and the semiconductor single crystal substrate have been bonded;

a second step of forming a group of pixel electrodes for defining a pixel region and a group of switch elements for selectively energizing individual ones of the pixel electrodes by integrating a pixel array portion over the composite substrate;

a third step of forming liquid crystal aligning means for the pixel region;

a fourth step of superposing an opposed substrate over the composite substrate with a gap therebetween; and a fifth step of filling a liquid crystal in the gap.

16. A process for fabricating a light valve device according to claim 15; wherein the third step includes forming concavities and convexities in the surface of the pixel region.

* * * * *